(12) United States Patent
Kandanarachchi

(10) Patent No.: US 11,061,328 B2
(45) Date of Patent: Jul. 13, 2021

(54) POSITIVE TONE PHOTOSENSITIVE COMPOSITIONS CONTAINING AMIC ACID AS LATENT BASE CATALYST

(71) Applicant: PROMERUS, LLC, Brecksville, OH (US)

(72) Inventor: Pramod Kandanarachchi, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 0 days.

(21) Appl. No.: 16/874,982

(22) Filed: May 15, 2020

(65) Prior Publication Data

US 2020/0363722 A1  Nov. 19, 2020

Related U.S. Application Data

(60) Provisional application No. 62/848,297, filed on May 15, 2019.

(51) Int. Cl.
| | | |
|---|---|---|
| *G03F 7/039* | (2006.01) | |
| *C08K 5/1515* | (2006.01) | |
| *C08G 69/28* | (2006.01) | |
| *C08G 69/40* | (2006.01) | |

(52) U.S. Cl.
CPC ........... *G03F 7/0395* (2013.01); *C08G 69/28* (2013.01); *C08G 69/40* (2013.01); *C08K 5/1515* (2013.01)

(58) Field of Classification Search
None
See application file for complete search history.

(56) References Cited

U.S. PATENT DOCUMENTS 9,547,239 B2   1/2017   Noda et al.
9,690,196 B2   6/2017   Ng et al.

FOREIGN PATENT DOCUMENTS

WO   WO 2011/004938 A1   1/2011

OTHER PUBLICATIONS

Ken-ichi Fukukawa, et al., "Thermo-base Generator for Low Temperature Solid-phase Imidation of Poly (amic acid)," Chem. Lett., 2005, vol. 34, No. 10, pp. 1372-1373.
Masao Tomikawa, et al., "Novel Partial Esterification Reaction in Poly(amic acid) and Its Application for Positive-Tone Photosensitive Polyimide Precursor," Polymer Journal, vol. 41, No. 8, pp. 604-608, 2009.
Written Opinion of PCT/US2020/033069, dated Oct. 29, 2020; Also see WO2020/232338A1, dated Nov. 19, 2020.

*Primary Examiner* — Robert T Butcher
(74) *Attorney, Agent, or Firm* — Balaram Gupta

(57) ABSTRACT

Embodiments in accordance with the present invention encompass photosensitive compositions containing a base soluble polymer, a latent base catalyst, a photoactive compound and an epoxy crosslinking agent. The compositions are useful for forming films that can be patterned to create structures for microelectronic devices, microelectronic packaging, microelectromechanical systems, optoelectronic devices and displays. In some embodiments the compositions of this invention are shown to feature excellent hitherto unachievable mechanical properties. More specifically, the compositions exhibit increased photo speed, higher elongation to break, higher tensile strength and higher glass transitions temperatures than the conventional compositions, among other enhanced properties. Accordingly, the positive images formed therefrom exhibit improved thermo-mechanical properties, among other property enhancements.

20 Claims, 4 Drawing Sheets

POSITIVE TONE PHOTOSENSITIVE COMPOSITIONS CONTAINING AMIC ACID AS LATENT BASE CATALYST

CROSS REFERENCE TO RELATED APPLICATIONS

This application claims the benefit of U.S. Provisional Application No. 62/848,297, filed May 15, 2019, which is incorporated herein by reference in its entirety.

BACKGROUND OF THE INVENTION

Field of the Invention

The present invention relates to photosensitive compositions encompassing a base soluble polymer, a latent base catalyst, a photoactive compound and an epoxy crosslinking agent. More specifically, the present invention relates to a photosensitive composition containing a polymer having an acidic group, such as polyamic acid or a polymer having a pendent carboxylic acid, phenol or other acidic functional group and a latent base catalyst which upon heat releases the base. The compositions of this invention are useful for forming microelectronic and/or optoelectronic devices and assemblies thereof, and more specifically, such compositions exhibit improved thermal, mechanical and opto-electronic properties.

Description of the Art

Organic polymer materials are increasingly being used in the microelectronics and optoelectronics industries for a variety of applications. For example, the uses for such organic polymer materials include permanent interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

There has been innumerable polymeric materials used in the art in order to achieve the above noted desired requirements. One such class of polymers include polyimides and its precursor, polyamic acid. However, most of the polyimides disclosed in the art are generally for positive tone image forming films, and many not suitable for many applications. Some of the drawbacks include use of highly toxic and corrosive phenolic monomers which provide alkali solubility that is required for forming positive tone compositions. Other property disadvantages include insolubility of the polyimides and/or the precursor polyamic acids in commonly used solvents in the electronic industry, poor photo imaging capabilities, among others. Even more importantly, such compositions suffer from poor thermo-mechanical properties and may require high cure temperatures, often times higher than 300° C., which are undesirable. See for example, U.S. Pat. No. 8,946,852 B2 and U.S. Pat. No. 7,485,405 B2.

Accordingly, it is an object of this invention to provide a series of compositions encompassing base soluble polymer, a latent base catalyst, a photoactive compound and an epoxy crosslinking agent that provide improved thermo-mechanical properties.

It is also an object of this invention to provide compositions which can be cured at lower temperatures than the conventional polyimides that exhibit improved thermo-mechanical properties.

Other objects and further scope of the applicability of the present invention will become apparent from the detailed description that follows.

SUMMARY OF THE INVENTION

Surprisingly, it has now been found that incorporating latent base generators, such as mono- or oligomeric amic acids, a product derived from a cyclic anhydride and an amine, with aqueous base soluble polymers, provide compositions that provide improved thermo-mechanical properties, among other property advantages. More specifically, the latent base generators as described herein can be made very readily by reacting a suitable dicarboxylic acid or a cyclic anhydride with a variety of amines, including primary, secondary or tertiary amines. The latent base generators are then combined with a variety of aqueous base soluble polymers, which include among others, polyamic acid and polyimide polymers as disclosed herein as well as polymers containing a pendent acid functional group as described herein. The polymers of this invention can then be combined with a number of additives to form photosensitive compositions which feature excellent thermo-mechanical properties, photo-imaging properties, low cure temperatures, generally below 250° C. or lower, among other property enhancements.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

DETAILED DESCRIPTION OF THE INVENTION

Figure 1A:
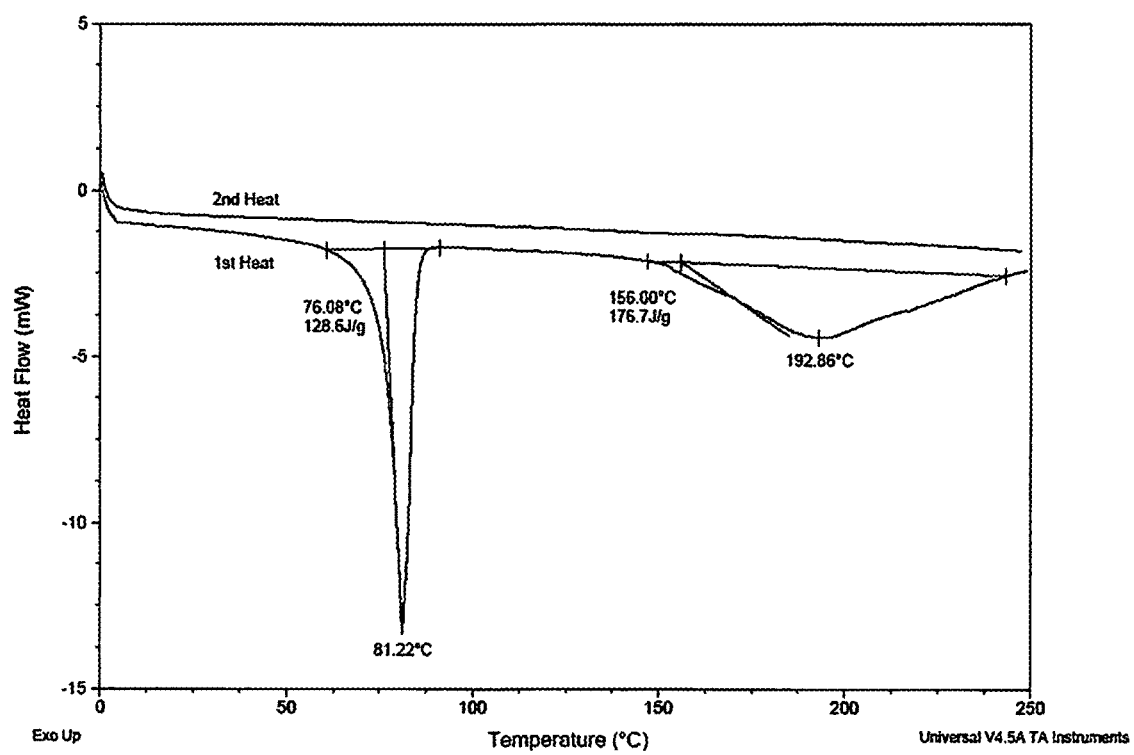
FIG. 1A and FIG. 1B show differential scanning calorimetry (DSC) thermograms of two of the latent base generators of this invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the expression "alkyl" means a saturated, straight-chain or branched-chain hydrocarbon substituent having the specified number of carbon atoms. Particular alkyl groups are methyl, ethyl, n-propyl, isopropyl, tert-butyl, and so on. Derived expressions such as "alkoxy", "thioalkyl", "alkoxyalkyl", "hydroxyalkyl", "alkylcarbonyl", "alkoxycarbonylalkyl", "alkoxycarbonyl", "diphenylalkyl", "phenylalkyl", "phenylcarboxyalkyl" and "phenoxyalkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "perhaloalkyl" represents the alkyl, as defined above, wherein all of the hydrogen atoms in said alkyl group are replaced with halogen atoms selected from fluorine, chlorine, bromine or iodine. Illustrative examples include trifluoromethyl, trichloromethyl, tribromomethyl, triiodomethyl, pentafluoroethyl, pentachloroethyl, pentabromoethyl, pentaiodoethyl, and straight-chained or branched heptafluoropropyl, heptachloropropyl, heptabromopropyl, nonafluorobutyl, nonachlorobutyl, undecafluoropentyl, undecachloropentyl, tridecafluorohexyl, tridecachlorohexyl, and the like. Derived expression, "perhaloalkoxy", is to be construed accordingly. It should further be noted that certain of the alkyl groups as described herein, such as for example, "alkyl" may partially be fluorinated, that is, only portions of the hydrogen atoms in said alkyl group are replaced with fluorine atoms and shall be construed accordingly.

As used herein the expression "acyl" shall have the same meaning as "alkanoyl", which can also be represented structurally as "R—CO—," where R is an "alkyl" as defined herein having the specified number of carbon atoms. Additionally, "alkylcarbonyl" shall mean same as "acyl" as defined herein. Specifically, "$(C_1-C_4)$acyl" shall mean formyl, acetyl or ethanoyl, propanoyl, n-butanoyl, etc. Derived expressions such as "acyloxy" and "acyloxyalkyl" are to be construed accordingly.

As used herein, the expression "aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "arylalkyl" means that the aryl as defined herein is further attached to alkyl as defined herein. Representative examples include benzyl, phenylethyl, 2-phenylpropyl, 1-naphthylmethyl, 2-naphthylmethyl and the like.

As used herein, the expression "alkenyl" means a non-cyclic, straight or branched hydrocarbon chain having the specified number of carbon atoms and containing at least one carbon-carbon double bond, and includes ethenyl and straight-chained or branched propenyl, butenyl, pentenyl, hexenyl, and the like. Derived expression, "arylalkenyl" and five membered or six membered "heteroarylalkenyl" is to be construed accordingly. Illustrative examples of such derived expressions include furan-2-ethenyl, phenylethenyl, 4-methoxyphenylethenyl, and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$ alkoxy, $(C_1-C_6)$thioalkyl and $(C_1-C_6)$perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that the terms "dielectric" and "insulating" are used interchangeably herein. Thus reference to an insulating material or layer is inclusive of a dielectric material or layer and vice versa.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof.

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

By the term "derived" is meant that the polymeric repeating units are formed from, for example, condensation of a dianhydride with a diamine. That is, polyimide repeat units are derived from the corresponding dianhydride and diamine. Generally, such condensation reaction first results in a polyamic acid which is further condensed to form a polyimide as described further in detail below. Accordingly, a polyamic acid or a polyimide is generally derived from the condensation of equimolar amounts of at least one dianhydride with one diamine. When a mono-anhydride or a mono-amine is used off-setting the stoichiometry, the resulting polyimide will be end-capped with such excess amount of either the mono-anhydride or the mono-amine employed. Similarly, the other polymers disclosed herein containing acid functional group, such as for example, ring opened maleic anhydride (ROMA) repeat units containing polymers are derived from the corresponding cyclic olefinic monomers and maleic anhydride (COMA), which are then subjected to hydrolysis using a suitable alcohol thereby maleic anhydride ring is opened to generate a base soluble polymer, ROMA polymers.

Thus, in accordance with the practice of this invention there is provided a composition comprising:
a) a base soluble polymer;
b) a compound selected from the group consisting of a compound of formula (IA):

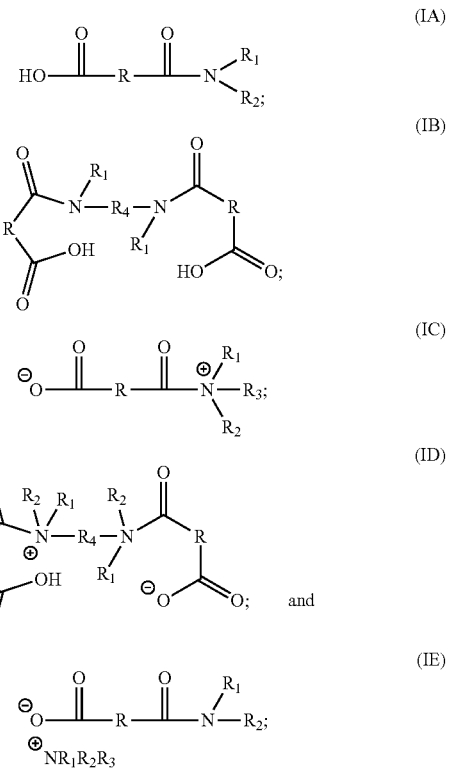

wherein
R and $R_4$ are the same or different and each independently a divalent organic group selected from the group consisting of $(C_1-C_{12})$alkylene, $(C_1-C_{12})$alkenylene, polyalkyleneoxy, $(C_6-C_{10})$arylene, $(C_6-C_{10})$aryleneoxy$(C_6-C_{10})$arylene, $(C_6-C_{10})$aryleneoxy$(C_6-C_{10})$aryleneoxy-$(C_6-C_{10})$arylene, $(C_6-C_{10})$aryleneoxy$(C_6-C_{10})$arylenesulfonyl$(C_6-C_{10})$aryleneoxy $(C_6-C_{10})$arylene, $(C_6-C_{10})$arylenesulfonyl$(C_6-C_{10})$arylene, heteroarylene and $(C_6-C_{10})$aryleneheteroarylene;
$R_1$, $R_2$ and $R_3$ are the same or different and each independently of one another selected from the group consisting of hydrogen, linear or branched $(C_1-C_{16})$alkyl, hydroxy$(C_1-$ $C_{12}$)alkyl, perfluoro($C_1$-$C_{12}$)alkyl, ($C_6$-$C_{10}$)aryl, ($C_6$-$C_{10}$)aryl($C_1$-$C_3$)alkyl and heteroaryl; or $R_1$, $R_2$ and $R_3$ taken together with the nitrogen atom to which they are attached to form a ($C_7$-$C_{15}$)bicycloalkyl ring optionally containing one or more heteroatoms selected from the group consisting of nitrogen, oxygen, sulfur and phosphorus and optionally containing one or more double bonds;

c) a photoactive compound; and
d) an epoxy crosslinking agent.

Any of the base soluble polymers that will bring about the intended benefit can be used in the compositions of this invention. In some embodiments such base soluble polymers are soluble in variety of organic solvents as well as in water or mixtures thereof. In some embodiments the base soluble polymer is soluble in water especially under basic conditions, such as for example aqueous basic solutions, including alkaline bases as well as organic bases. Example of alkaline base include sodium hydroxide, lithium hydroxide, sodium carbonate, and the like. Organic bases include any of the alkylammonium salts, including without any limitation tetramethylammonium hydroxide (TMAH), tetraethylammonium hydroxide, and the like.

Non-limiting examples of the base soluble polymers that can be employed in the composition of this invention may be selected from the group consisting of:

a) a polyamic acid of formula (II):

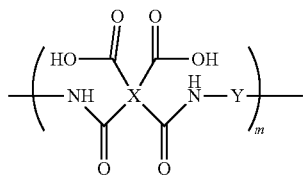

(II)

wherein:
m is an integer of at least 50;
X is one or more distinct tetravalent organic group; and
Y is one or more distinct divalent organic group;

b) a polymer A comprising one or more distinct first repeating unit represented by formula (IIIA), each of said first repeating unit is derived from a monomer of formula (III):

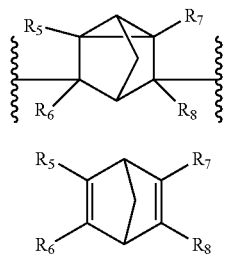

(IIIA)

(III)

wherein:
⌇ represents a position at which the bonding takes place with another repeat unit;
each of $R_5$, $R_6$, $R_7$ and $R_8$ is independently selected from the group consisting of hydrogen, linear or branched ($C_1$-$C_6$)alkyl, hydroxy($C_1$-$C_{12}$)alkyl, perfluoro($C_1$-$C_{12}$)alkyl, ($C_6$-$C_{10}$)aryl, ($C_6$-$C_{10}$)aryl($C_1$-$C_3$)alkyl, —$CO_2R_b$, where $R_b$ is ($C_1$-$C_6$)alkyl or tri($C_1$-$C_6$)alkylsilyl, halogen and a group of formula (A):

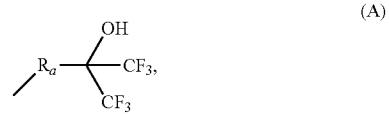

(A)

where $R_a$ is selected from the group consisting of —($CH_2$)$_p$—, —($CH_2$)$_q$—$OCH_2$— or —($CH_2$)$_q$—($OCH_2CH_2$)$_r$—$OCH_2$—, where p is an integer from 0 to 6, q is an integer from 0 to 4 and r is an integer from 0 to 3;

one or more distinct second repeating unit represented by formula (IVA), said second repeating unit is derived from a monomer of formula (IV):

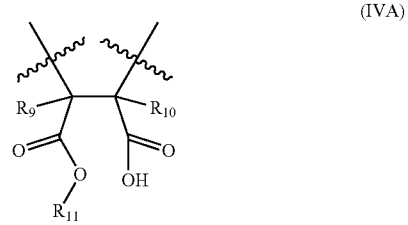

(IVA)

(IV)

wherein:
each of $R_9$ and $R_{10}$ is independently selected from the group consisting of hydrogen, linear or branched ($C_1$-$C_9$)alkyl and fluorinated or perfluorinated ($C_1$-$C_9$)alkyl;
$R_{11}$ is selected from the group consisting of hydrogen, linear or branched ($C_1$-$C_9$)alkyl, fluorinated or perfluorinated ($C_1$-$C_9$)alkyl, and —($CH_2$)$_a$—(O—($CH_2$)$_b$)$_c$—O—($C_1$-$C_6$)alkyl, where a, b and c are integers from 1 to 4; and one or more distinct third repeating unit represented by formula (VA), said third repeating unit is derived from a monomer of formula (V):

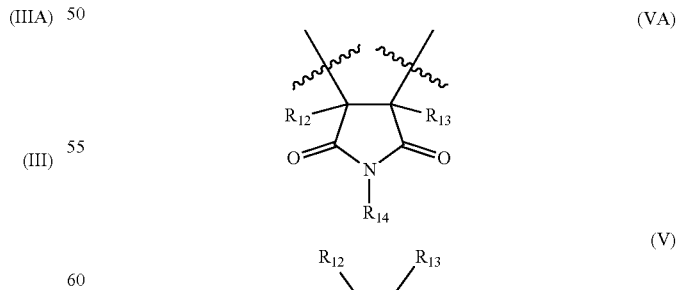

(VA)

(V)

wherein:

each of $R_{12}$ and $R_{13}$ is independently selected from the group consisting of hydrogen, linear or branched ($C_1$-$C_9$) alkyl and fluorinated or perfluorinated ($C_1$-$C_9$)alkyl;

$R_{14}$ is selected from the group consisting of hydrogen, linear or branched ($C_1$-$C_{16}$)alkyl, ($C_3$-$C_9$)cycloalkyl, ($C_3$-$C_9$)cycloalkyl($C_1$-$C_{10}$)alkyl, ($C_6$-$C_{10}$)aryl, ($C_6$-$C_{10}$)aryl($C_1$-$C_4$)alkyl, ($C_1$-$C_{16}$)alkylCO$_2$R$_c$, ($C_1$-$C_{16}$)alkylCH$_2$OR$_c$, ($C_6$-$C_{10}$)arylCO$_2$R$_c$, ($C_6$-$C_{10}$)arylCH$_2$OR$_c$, where each $R_c$ is independently selected from the group consisting of hydrogen, ($C_1$-$C_6$)alkyl and tri($C_1$-$C_6$)alkylsilyl;

c) a polymer B comprising one or more distinct first repeating unit represented by formula (VIA), each of said first repeating unit is derived from a monomer of formula (VI):

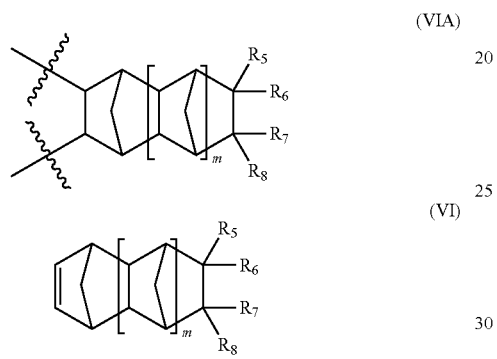

wherein:

m is an integer from 0 to 2; and

∿, $R_5$, $R_6$, $R_7$ and $R_8$ are as defined above; and one or more distinct second repeating unit represented by formula (IVA) as defined above.

The polyamic acid of formula (II) that can be used in the composition of this invention can be synthesized by any of the procedures known to one skilled in the art. For example, such methods include condensation of one or more dianhydrides with one or more diamines essentially in equimolar ratios. Any of the dianhydrides or diamines in combination with substituted cyclic anhydride or their equivalent precursor compounds can be employed.

More specifically, the dianhydrides and the diamines that are suitable for forming the polyamic acid used in the composition of this invention can be represented by the following general formulae (IIA) and (IIB) respectively.

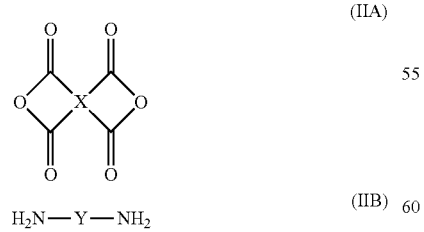

Wherein X and Y are as defined herein. Thus, any of the dianhydrides of tetracarboxylic acids in combination with any of the diamines can be employed to form the polyamic acid. Again, as noted, any of the techniques known in the art to make polyamic acid can be employed herein.

Now turning specifically to X, any of the suitable tetravalent organic group can be employed herein. Non-limiting examples of such X may be selected from the group consisting of:

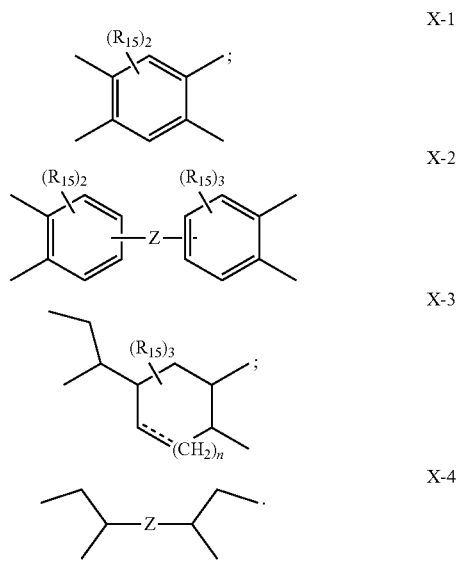

wherein a is an integer from 0 to 4, inclusive;

▭▭▭ is a single bond or a double bond;

each of $R_{15}$ is independently selected from the group consisting of hydrogen, methyl, ethyl, linear or branched ($C_3$-$C_6$)alkyl, trifluoromethyl, pentafluoroethyl, linear or branched perfluoro($C_3$-$C_6$)alkyl, methoxy, ethoxy, linear or branched ($C_3$-$C_6$)alkyloxy, ($C_2$-$C_6$)acyl, ($C_2$-$C_6$)acyloxy, phenyl and phenoxy;

Z is a divalent group selected from the group consisting of:

(CR$_{16}$R$_{17}$)$_b$, O(CR$_{16}$R$_{17}$)$_b$, (CR$_{16}$R$_{17}$)$_b$O, (OCR$_{16}$R$_{17}$)$_d$, (CR$_{61}$R$_{17}$O)$_d$, (CR$_{16}$R$_{17}$)$_b$—O—(CR$_{16}$R$_{17}$), (CR$_{16}$R$_{17}$)$_b$—O—(SiR$_{16}$R$_{17}$)$_c$, (CR$_{16}$R$_{17}$)$_b$—(CO)O—(CR$_{16}$R$_{17}$)$_c$, (CR$_{16}$R$_{17}$)$_b$—O(CO)—(CR$_{16}$R$_{17}$)$_c$, (CR$_{16}$R$_{17}$)$_b$—(CO)—(CR$_{16}$R$_{17}$)$_c$, (CR$_{16}$R$_{17}$)$_b$—(CO)NH—(CR$_{16}$R$_{17}$), (CR$_{16}$R$_{17}$)$_b$—NH(CO)—(CR$_{16}$R$_{17}$)$_c$, (CR$_{16}$R$_{17}$)$_b$—NH—(CR$_{16}$R$_{17}$)$_c$, where b and c are integers which may be the same or different and each independently is 0 to 12, and d is an integer from 1 to 12, inclusive;

$R_{16}$ and $R_{17}$ are the same or different and each independently selected from the group consisting of hydrogen, methyl, ethyl, linear or branched ($C_3$-$C_6$)alkyl, trifluoromethyl, pentafluoroethyl, linear or branched perfluoro($C_3$-$C_6$) alkyl, methoxy, ethoxy, linear or branched ($C_3$-$C_6$)alkyloxy, ($C_2$-$C_6$)acyl, ($C_2$-$C_6$)acyloxy, phenyl and phenoxy.

Even more specifically, suitable dianhydrides may include the following:

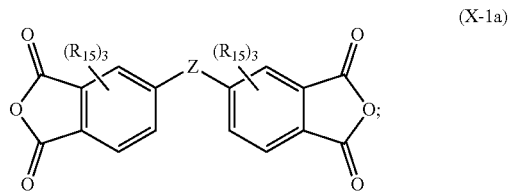

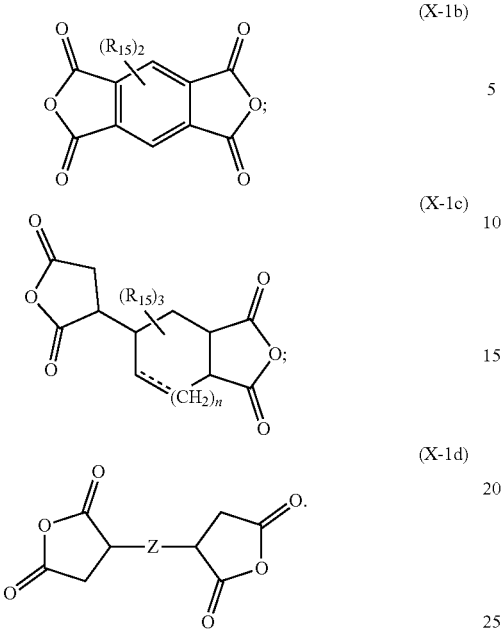

Even more specifically, one or more of the dianhydrides of the following formulae can also be employed herein.

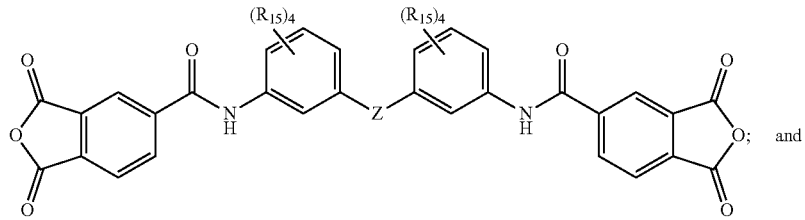

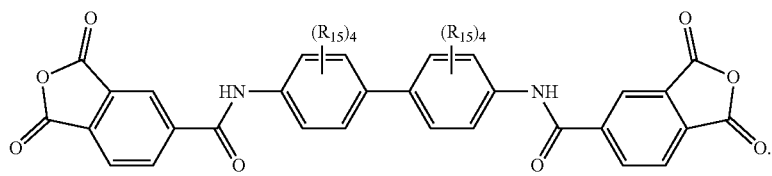

Where a, Z and $R_{15}$ are as defined herein.

In some embodiments, the polyamic acid of formula (II) used in the composition of this invention are formed using the dianhydrides where X is derived from one or more dianhydrides selected from the group consisting of:

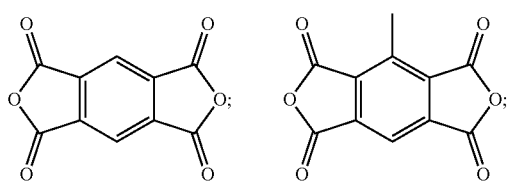

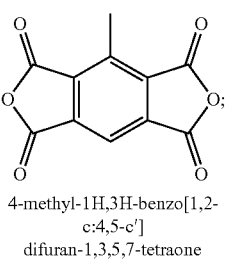

1H,3H-benzo[1,2-c:4,5-c']difuran-1,3,5,7-tetraone (PMDA)

4-methyl-1H,3H-benzo[1,2-c:4,5-c']difuran-1,3,5,7-tetraone

-continued

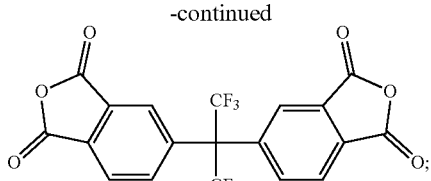

5-5'-(perfluoropropane-2,2-diyl)bis(isobenzofuran-1,3-dione) (6FDA)

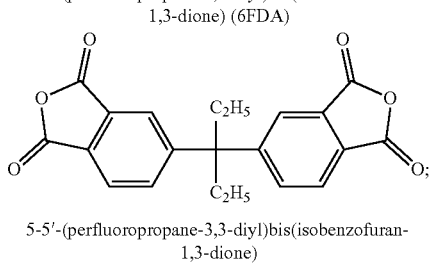

5-5'-(perfluoropropane-3,3-diyl)bis(isobenzofuran-1,3-dione)

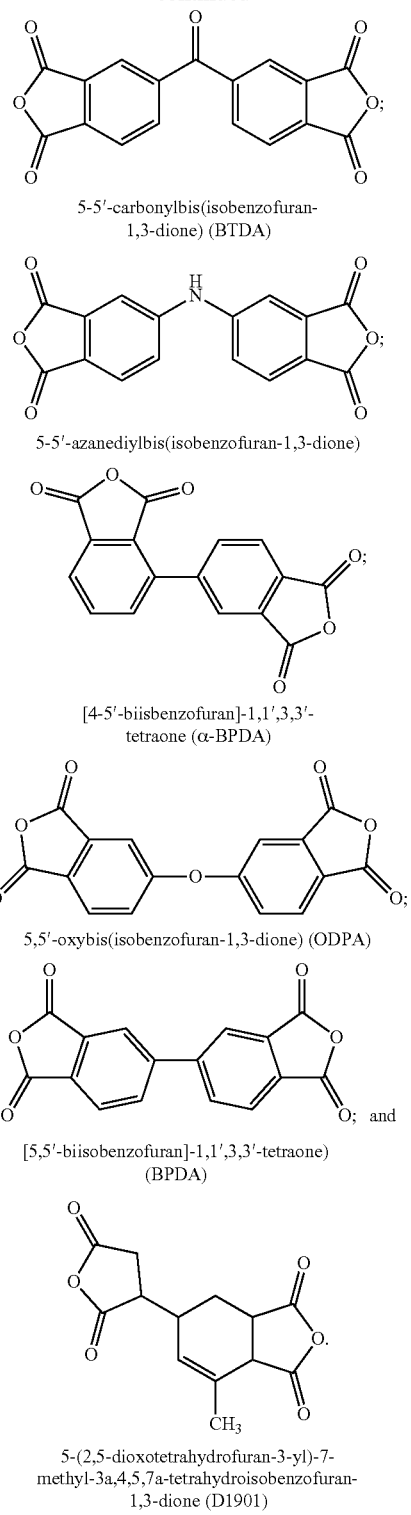

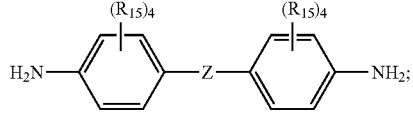 (Y-1a)

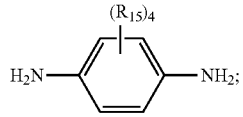 (Y-1b)

Where Z and $R_{15}$ are as defined herein.

In some embodiments, the polyimide or polyamic acid of this invention are formed using the diamines where Y is derived from one or more diamines selected from the group consisting of:

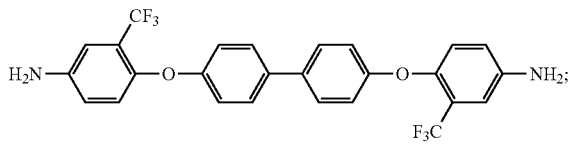

4,4'-([1,1'-biphenyl]-4,4'-diylbis(oxy))bis(3-(trifluoromethyl)aniline) (6BF)

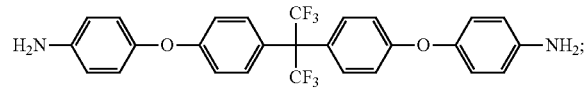

4,4'-(((perfluoropropane-2,2-diyl)bis(4,1-phenylene))bis(oxy))dianiline (HFBAPP)

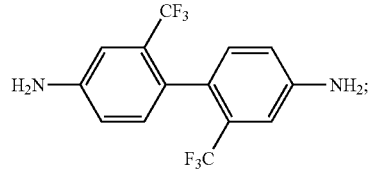

2,2'-bis(trifluoromethyl)-[1,1'-biphenyl]-4,4'-diamine (PFMB)

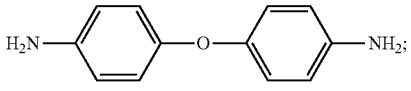

4,4'-oxydianiline(4,4'-ODA)

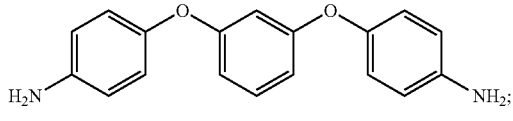

4,4'-(1,3-phenylenebis(oxy))dianiline (APB)

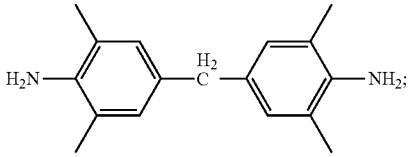

4,4'-methylenebis(2,6-dimethylaniline) (DO3)

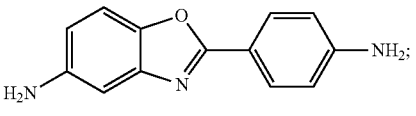

2-(4-aminophenyl)benzo[d]oxazol-5-amine (BZXPh5)

As noted, again, any of the diamines known in the art can be used to form the polyamic acid used in the composition of this invention. The diamines can again be broadly classified as aromatic diamines, aliphatic diamines or mixed aliphatic-aromatic diamines which contain a wide variety of bridging groups. A non-limiting generic types of diamines include the following:

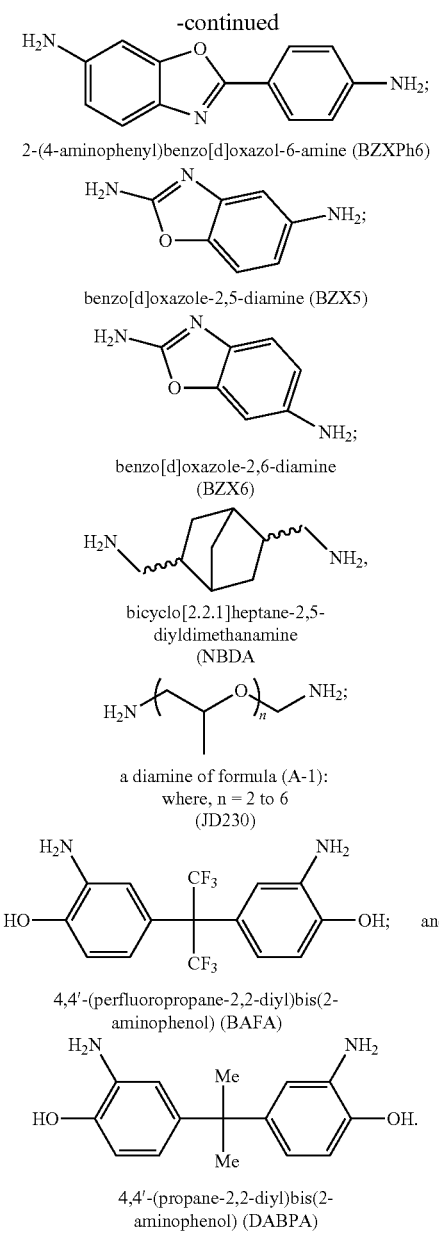

2-(4-aminophenyl)benzo[d]oxazol-6-amine (BZXPh6)

benzo[d]oxazole-2,5-diamine (BZX5)

benzo[d]oxazole-2,6-diamine (BZX6)

bicyclo[2.2.1]heptane-2,5-diyldimethanamine (NBDA a diamine of formula (A-1): where, n = 2 to 6 (JD230)

4,4'-(perfluoropropane-2,2-diyl)bis(2-aminophenol) (BAFA)

4,4'-(propane-2,2-diyl)bis(2-aminophenol) (DABPA)

The polyamic acid used in the composition of this invention having suitable molecular weight can be tailored based on the intended application by employing appropriate polycondensation methods. Accordingly, in some embodiments the number of repeat units, m, in the resulting polyamic acid is at least 50; in some other embodiments m is at least 100, 500, 1000, 2000 or higher. In some embodiments m is from 50 to 2000, inclusive.

The degree of polycondensation can be measured by determining the molecular weight of the resulting polyamic acid using any of the known methods in the art, such as for example, by gel permeation chromatography (GPC) equipped with suitable detector and calibration standards, such as differential refractive index detector calibrated with narrow-distribution polystyrene standards.

Accordingly, the polyamic acid used in the composition of this invention generally exhibit a weight average molecular weight ($M_w$) of at least about 5,000. In some other embodiments, the polyamic acid or polyimide as described herein exhibit a weight average molecular weight ($M_w$) of at least about 20,000. In some other embodiments, the polyamic acid or polyimide made in accordance of this invention has a $M_w$ of at least about 50,000. In yet another embodiment, the polyamic acid or polyimide of this invention has a $M_w$ of at least about 100,000. In some other embodiments, the polyamic acid or polyimide of this invention has a $M_w$ of at least about 200,000. In some other embodiments, the polyamic acid or polyimide of this invention has a $M_w$ ranging from about 50,000 to 500,000, or higher.

The polyamic acid used in the composition of this invention generally contains an amic acid repeat unit derived from at least one dianhydride and at least one diamine. In some other embodiments, the polyamic acid or the polyimide of this invention contains an amic acid repeat units derived from two or more anhydrides and two or more diamines as described herein. All of such permutation and combinations are part of this invention. Generally, equimolar ratios of dianhydrides and diamines are employed to form the polyamic acid. That is, one mole of dianhydride is condensed with one mole of diamine. When two or more dianhydrides or diamines are employed, any of the molar ratios of the respective two or more dianhydrides and diamines can be employed so as to tailor the properties of the resulting polyamic acid and depending upon the intended applications. In any event, the polyamic acid used in the composition of this invention contains generally equal molar amounts of the total dianhydride and the total diamines when more than one dianhydride or more than one diamine is employed. That is, a polyamic acid used in the composition of this invention is made by employing equimolar amounts of dianhydride and diamine.

Non-limiting examples of a polyamic acid used in the composition in accordance of this invention may be enumerated as follows:

A polyamic acid formed from 4,4'-(1,3-phenylenebis(oxy))dianiline (APB), 5,5'-oxybis(isobenzofuran-1,3-dione) (ODPA) and 4,4'-(perfluoropropane-2,2-diyl)bis(2-aminophenol) (BAFA).

A polyamic acid formed from 4,4'-([1,1'-biphenyl]-4,4'-diylbis(oxy))bis(3-(trifluoromethyl)aniline) (6BF), 1H,3H-benzo[1,2-c:4,5-c']difuran-1,3,5,7-tetraone (PMDA) and 4,4'-(perfluoropropane-2,2-diyl)bis(2-aminophenol) (BAFA).

A polyamic acid formed from 5,5'-(perfluoropropane-2,2-diyl)bis(isobenzofuran-1,3-dione) (6FDA), 4,4'-([1,1'-biphenyl]-4,4'-diylbis(oxy))bis(3-(trifluoromethyl)aniline) (6BF), and 2-(4-aminophenyl)benzo[d]oxazol-5-amine (BZXPh5).

A polyamic acid formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), and 2,2'-bis(trifluoromethyl)-[1,1'-biphenyl]-4,4'-diamine (PFMB).

A polyamic acid formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-(((perfluoropropane-2,2-diyl)bis(4,1-phenylene))bis(oxy))dianiline (HFBAPP), and 2,2'-bis(trifluoromethyl)-[1,1'-biphenyl]-4,4'-diamine (PFMB).

A polyamic acid formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), and 2-(4-aminophenyl)benzo[d]oxazol-5-amine (BZXPh5).

Advantageously, the polyamic acid used in the composition of this invention are soluble in an organic solvent as well as in several aqueous base solutions. Exemplary organic solvents, without any limitation, that can be employed to dissolve the composition of this invention are selected from the group consisting of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone and 2-heptanone and mixtures in any combination thereof. It should further be noted that any of the aforementioned solvents can be used alone or in combination with one or more solvents, and in combination with aqueous base.

Various other polymers, which are soluble in a base can be employed in the composition of this invention. Such, non-limiting examples include polymer A and polymer B as described hereinabove. Polymer A is disclosed in U.S. Pat. No. 9,834,627 B2, pertinent portions of which are incorporated herein by reference. Polymer B is disclosed in U.S. Pat. No. 8,715,900 B2, pertinent portions of which are incorporated herein by reference. Various other polymers which are base soluble are also disclosed in literature, all such polymers are suitable in the composition of this invention. See for example, U.S. Pat. No. 9,291,901 B2 and U.S. Pat. No. 9,422,376 B2. Accordingly, all such polymers can be employed in the composition of this invention.

In some embodiments, the polymer A or polymer B employed in the composition of this invention further comprises respectively one or more distinct fourth or third repeat unit of formula (VIIA) derived from a monomer of formula (VII):

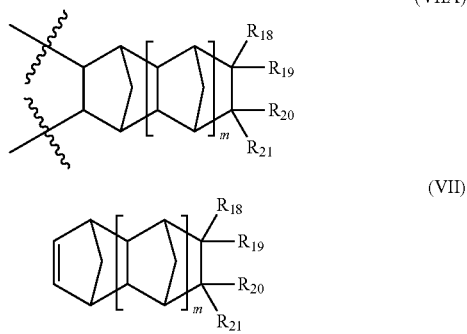

wherein:
~~~ represents a position at which the bonding takes place with another repeat unit;
m is an integer from 0 to 2;
each of $R_{18}$, $R_{19}$, $R_{20}$ and $R_{21}$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_4-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $-(CH_2)_e-(O-(CH_2)_f)_g-O-(C_1-C_4)$alkyl, where e, f and g are integers from 1 to 4, inclusive, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen.

In some embodiments the composition of this invention encompasses polymer A, which is having one or more distinct first repeating unit derived from a respective monomer selected from the group consisting of:
bicyclo[2.2.1]hepta-2,5-diene (norbornadiene);
2-methylbicyclo[2.2.1]hepta-2,5-diene;
2-butylbicyclo[2.2.1]hepta-2,5-diene;
2-hexylbicyclo[2.2.1]hepta-2,5-diene;
2-octylbicyclo[2.2.1]hepta-2,5-diene;
2-phenethylbicyclo[2.2.1]hepta-2,5-diene;
tert-butyl bicyclo[2.2.1]hepta-2,5-diene-2-carboxylate;
trimethylsilyl bicyclo[2.2.1]hepta-2,5-diene-2-carboxylate; and
bicyclo[2.2.1]hepta-2,5-dien-2-ylmethanol.

In some embodiments the composition of this invention encompasses polymer A, which is having one or more distinct second repeating unit derived from a respective monomer selected from the group consisting of:
maleic anhydride;
2-methyl-maleicanhydride(3-methylfuran-2,5-dione);
2,3-dimethyl-maleicanhydride(3,4-dimethylfuran-2,5-dione);
2-ethyl-maleicanhydride(3-ethylfuran-2,5-dione);
2,3-diethyl-maleicanhydride(3,4-diethylfuran-2,5-dione);
2-trifluoromethyl-maleicanhydride(3-trifluoromethylfuran-2,5-dione);
2,3-bis(trifluoromethyl)-maleicanhydride(3,4-bis(trifluoromethyl)furan-2,5-dione); and
2-methyl-3-trifluoromethyl-maleicanhydride(3-methyl-4-(trifluoromethyl)furan-2,5-dione).

In some embodiments the composition of this invention encompasses polymer A, which is having one or more distinct third repeating unit derived from a respective monomer selected from the group consisting of:
maleimide;
N-methylmaleimide;
N-butylmaleimide;
3-methylmaleimide (3-methylpyrrolidine-2,5-dione);
N-cyclohexylmaleimide;
N-phenylmaleimide;
N-benzylmaleimide; and
N-phenethylmaleimide.

In some embodiments the composition of this invention encompasses polymer A, which is having one or more distinct fourth repeating unit derived from a respective monomer selected from the group consisting of:
norbornene;
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene (NBTON);
1-(bicyclo[2.2.1]hept-5-en-2-yl)-2,5,8,11-tetraoxadodecane;
5-benzylbicyclo[2.2.1]hept-2-ene;
4-(bicyclo[2.2.1]hept-5-en-2-yl)phenol (NBPhOH);
2-(bicyclo[2.2.1]hept-5-en-2-yl)acetic acid (NBCH$_2$CO$_2$H);
3-(bicyclo[2.2.1]hept-5-en-2-yl)propanoic acid (NBCH$_2$CH$_2$CO$_2$H); and
5-phenethylbicyclo[2.2.1]hept-2-ene.

In some other embodiments the composition of this invention encompasses polymer A which contains five monomers or more. All such permissible combinations for either polymer A or polymer B are part of this invention.

Non-limiting examples of polymer A that can be employed to form the composition of this invention may be selected from the group consisting of:

a terpolymer of norbornadiene (NBD), N-phenylmaleimide and maleic anhydride in which maleic anhydride repeating unit is ring opened with methanol;

a terpolymer of norbornadiene (NBD), maleimide and maleic anhydride in which maleic anhydride repeating unit is ring opened with methanol;

a terpolymer of norbornadiene (NBD), N-cyclohexyl-maleimide and maleic anhydride in which maleic anhydride repeating unit is ring opened with methanol;

a tetrapolymer of norbornadiene (NBD), 5-((2-(2-methoxyethoxy)ethoxy)methyl)-bicyclo[2.2.1]hept-2-ene (NBTON), N-phenylmaleimide and maleic anhydride in which maleic anhydride repeating unit is ring opened with methanol;

a tetrapolymer of norbornadiene (NBD), N-cyclohexyl-maleimide, maleimide and maleic anhydride in which maleic anhydride repeating unit is ring opened with methanol;

a tetrapolymer of norbornadiene (NBD), N-phenylmaleimide, maleimide and maleic anhydride in which maleic anhydride repeating unit is ring opened with methanol;

a tetrapolymer of norbornadiene (NBD), N-cyclohexyl-maleimide, maleimide and maleic anhydride in which maleic anhydride repeating unit is ring opened with methanol; and a pentapolymer of norbornadiene (NBD), 5-((2-(2-methoxyethoxy)ethoxy)methyl)-bicyclo[2.2.1]hept-2-ene (NBTON), N-cyclohexyl-maleimide, maleimide and maleic anhydride in which maleic anhydride repeating unit is ring opened with methanol.

As noted, the composition of this invention contains one or more latent base generators as described herein. Non-limiting specific compounds which are within the scope of the compounds of formulae (IA), (IB), (IC) and (ID) are selected from the group consisting of:

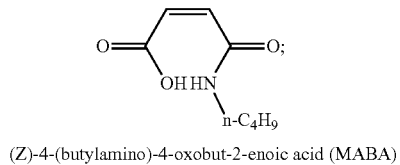

(Z)-4-(butylamino)-4-oxobut-2-enoic acid (MABA)

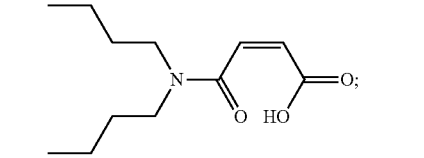

(Z)-4-(dibutylamino)-4-oxobut-2-enoic acid (MADBA)

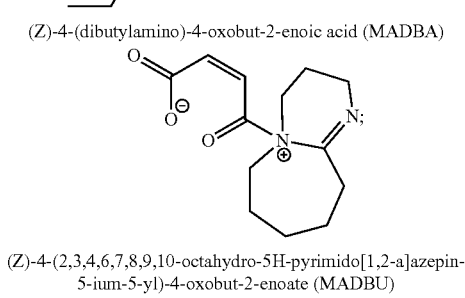

(Z)-4-(2,3,4,6,7,8,9,10-octahydro-5H-pyrimido[1,2-a]azepin-5-ium-5-yl)-4-oxobut-2-enoate (MADBU)

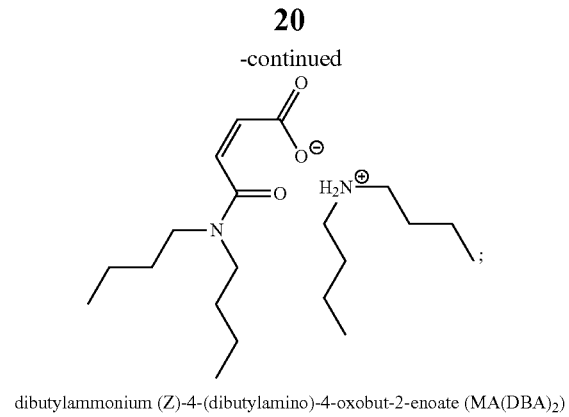

dibutylammonium (Z)-4-(dibutylamino)-4-oxobut-2-enoate (MA(DBA)$_2$)

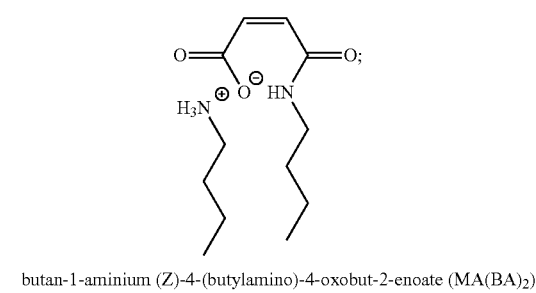

butan-1-aminium (Z)-4-(butylamino)-4-oxobut-2-enoate (MA(BA)$_2$)

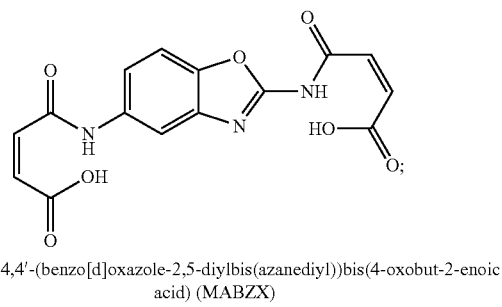

(2Z,2′Z)-4,4′-(benzo[d]oxazole-2,5-diylbis(azanediyl))bis(4-oxobut-2-enoic acid) (MABZX)

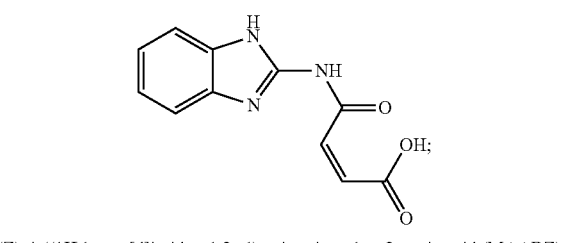

(Z)-4-((1H-benzo[d]imidazol-2-yl)amino-4-oxobut-2-enoic acid (MAABZ)

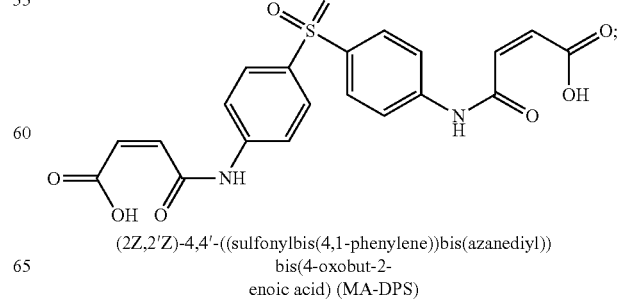

(2Z,2′Z)-4,4′-((sulfonylbis(4,1-phenylene))bis(azanediyl))bis(4-oxobut-2-enoic acid) (MA-DPS)

-continued

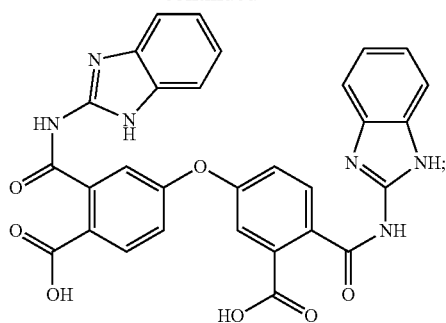

2-((1H-benzo[d]imidazol-2-yl)carbamoyl)-4-(4-((1H-benzo[d]imidazol-2-yl)carbamoyl)-3-carboxyphenoxy)benzoic acid (ODPA-ABZ)

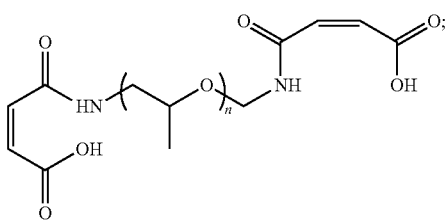

(Z)-4-((2-(((Z)-3-carboxyacrylamido)poly((methoxy)propyl))amino)-4-oxobut-2-enoic acid, where n is an integer from 2 to 6 (MAJD230)

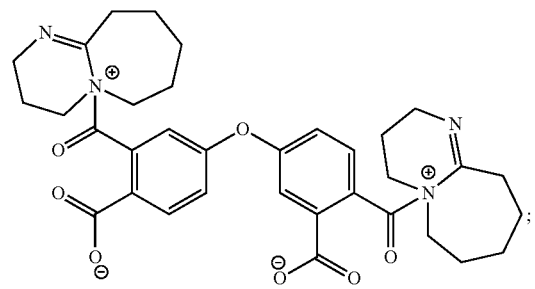

4-(3-carboxylato-4-(3,4,5,6,7,8,9,10-octahydro-2H-pyrimido[1,2-a]azepin-5-ium-5-carbonyl)phenoxy)-2-(3,4,5,6,7,8,9,10-octahydro-2H-pyrimido[1,2-a]azepin-5-ium-5-carbonyl)benzoate (ODPA-DBU)

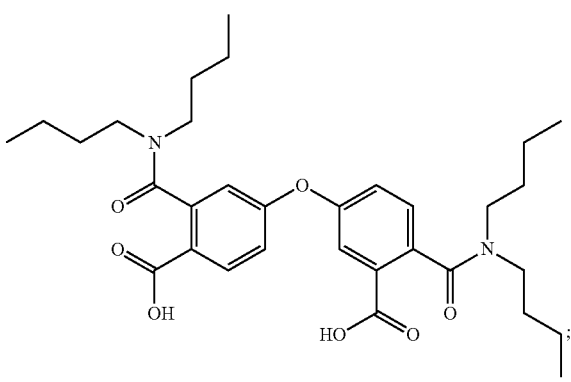

4-(3-carboxy-4-(dibutylcarbamoyl)phenoxy)-2-(dibutylcarbamoyl)benzoic acid (ODPA-DBA)

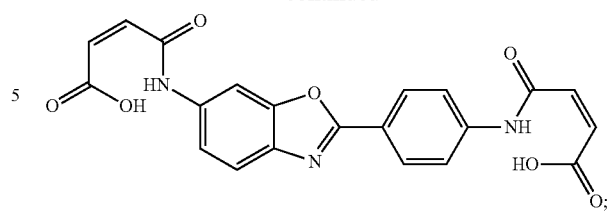

(Z)-4-((4-(6-((Z)-3-carboxyacrylamido)benzo[d]oxazol-2-yl)phenyl)amino)-4-oxobut-2-enoic acid (MABZXPh6)

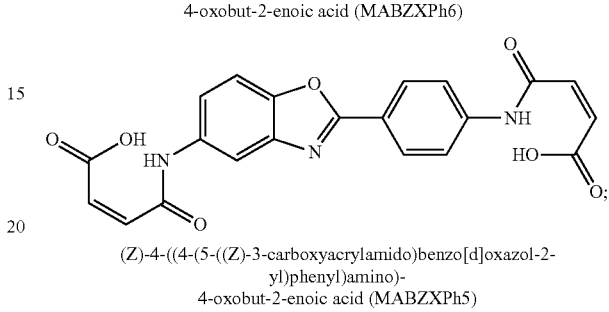

(Z)-4-((4-(5-((Z)-3-carboxyacrylamido)benzo[d]oxazol-2-yl)phenyl)amino)-4-oxobut-2-enoic acid (MABZXPh5)

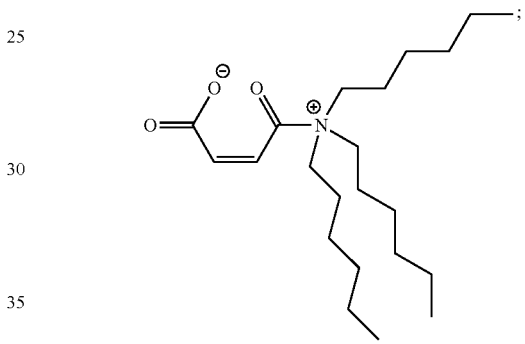

product of maleic anhydride and tri(n-hexyl)amine (MATHA)

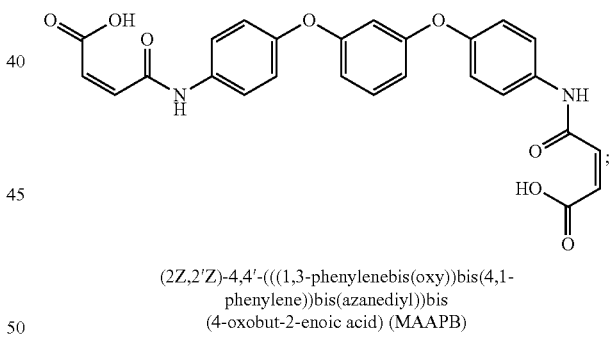

(2Z,2'Z)-4,4'-(((1,3-phenylenebis(oxy))bis(4,1-phenylene))bis(azanediyl))bis(4-oxobut-2-enoic acid) (MAAPB)

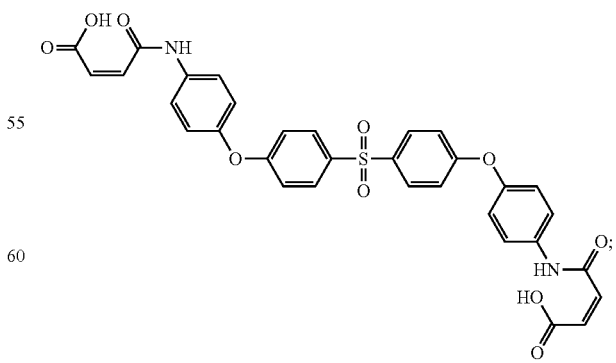

(2Z,2'Z)-4,4'(((((sulfonylbis(4,1-phenylene))bis(oxy))bis(4,1-phenylene))bis(azanediyl))bis(4-oxobut-2-enoic acid) (MA(NH$_2$PhOPh)$_2$SO$_2$)

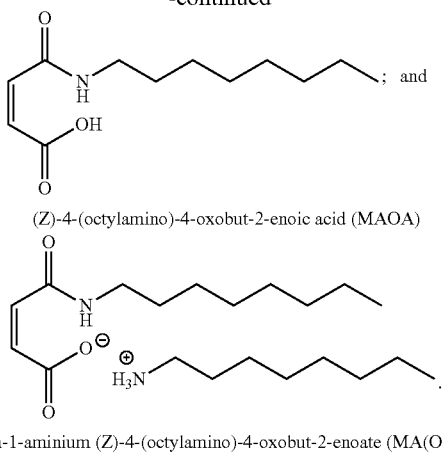

(Z)-4-(octylamino)-4-oxobut-2-enoic acid (MAOA)

octan-1-aminium (Z)-4-(octylamino)-4-oxobut-2-enoate (MA(OA)$_2$)

Any amount of one or more compounds of formulae (IA), (IB), (IC) and (ID) as latent base generators can be employed in the composition of this invention which will bring about the intended benefit. In some embodiments such amounts may range from 0.2 parts to 15 parts of latent base generator per 100 parts of the base soluble polymer employed. In some embodiments such amount include combined total of more than one latent base generator. In some other embodiments the amount of latent base generator employed ranges from 0.3 weight parts to 10 weight parts per 100 weight parts of the base soluble polymer. In yet some other embodiments the amount of latent base generator employed ranges from 0.4 weight parts to 6 weight parts per 100 weight parts of the base soluble polymer. Surprisingly, employing even such small amounts of the latent base generators impart excellent thermo-mechanical properties of the composition of this invention as demonstrated by specific composition examples that follows.

In fact, as further shown by specific examples, the latent base catalysts as employed herein provide hitherto unattainable properties. For example, employing other commonly available bases in place of the latent base catalysts it is not possible to obtain the same enhanced properties.

As further noted above the composition further incorporates one or more photoactive compounds (PAC). Therefore, the compositions of this invention are photosensitive, and can be employed in a variety of optoelectronic application for forming a variety of polymeric layers, which may be patternable so as to find applications as dielectric materials. Any of the PACs known to one skilled in the art which would bring about the desired results as further discussed herein can be employed in the composition of this invention. Broadly speaking, the PAC that can be employed in this invention is a photosensitive compound which when exposed to suitable radiation undergoes a chemical transformation such that the resulting product is generally more soluble in a developing solvent, such as for example, alkali solution thus facilitating the exposed regions to dissolve more readily than the unexposed regions, thus forming a positive image upon development. As noted, the composition of this invention further encompass an epoxy resin and a solvent. Further, such compositions are capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Generally, the PACs that are suitable in this invention contain a diazo-quinone group of formula (B):

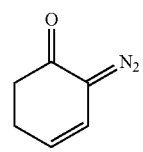

(B)

Non-limiting examples of such a photoactive compound (PAC) can include one or more of such groups, for example, 1,2-naphthoquinonediazide-5-sulfonyl moiety and/or a 1,2-naphthoquinonediazide-4-sulfonyl moiety as represented by structural formulae (VIIIA) and (VIIIB), respectively:

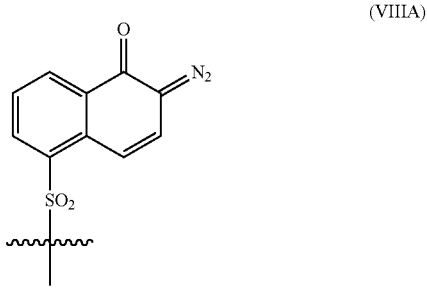

(VIIIA)

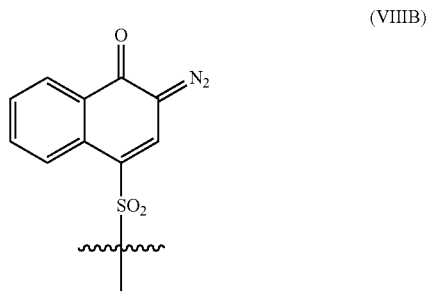

(VIIIB)

Other such photoactive moieties, among others, include sulfonyl benzoquinone diazide group represented by structural formula (VIIIC):

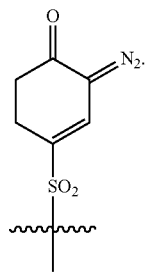
(VIIIC)

Generally, the functional groups of formulae (VIIIA), (VIIIB) and/or (VIIIC) are incorporated into the photosensitive composition as an esterification product of the respective sulfonyl chloride (or other reactive moiety) and a phenolic compound, such as one or more of the exemplary compounds represented below collectively as structural formulae (IXa) to (IXag). Thus, any one, or any mixture of two or more of such esterification products are combined with the resin in forming the photosensitive resin compositions of the present invention. In the formulae (IXa) to (IXag) below, Q may represent any of the structures (VIIIA), (VIIIB) or (VIIIC). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 parts by weight material to 100 parts by weight base soluble polymer and typically from about 10 to about 40 parts by weight, although other advantageous amounts of such materials are also appropriate and within the scope of the present invention. Where the specific ratio of the photoactive compound to base soluble polymer is a function of the dissolution rate of exposed portions as compared to unexposed portions and the amount of radiation required to achieve a desired dissolution rate differential.

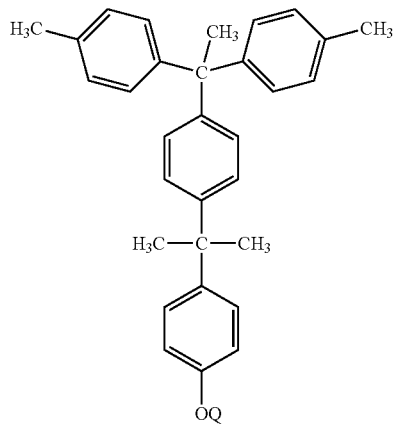
(IXa)

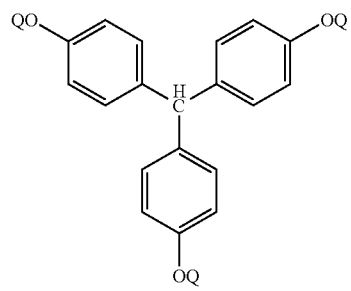
(IXb)

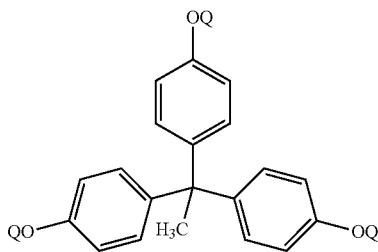
(IXc)

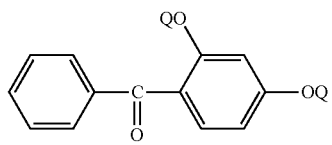
(IXd)

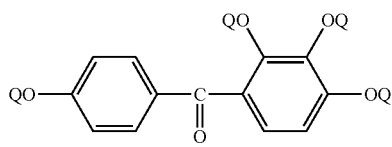
(IXe)

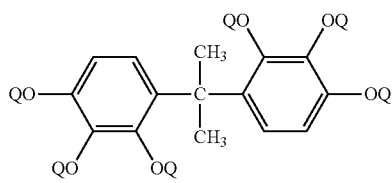
(IXf)

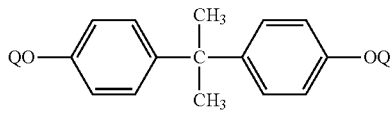
(IXg)

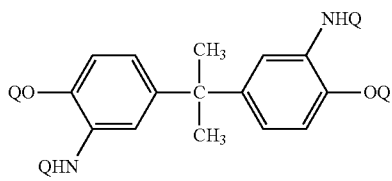
(IXh)

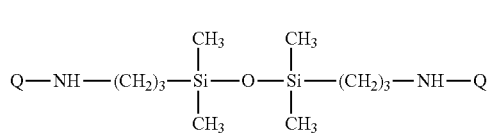
(IXi)

-continued
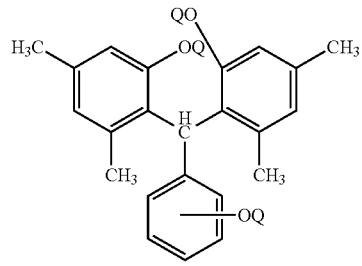
(IXj)
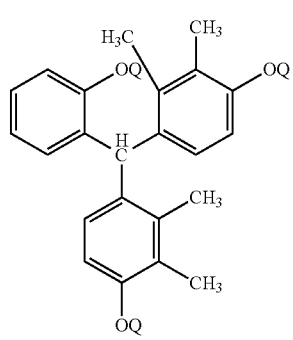
(IXk)
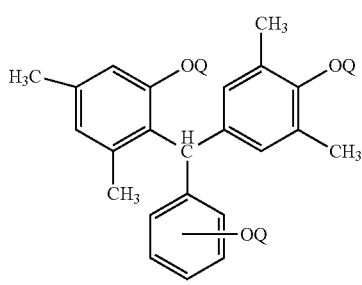
(IXl)
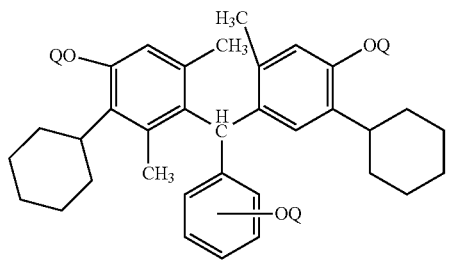
(IXm)
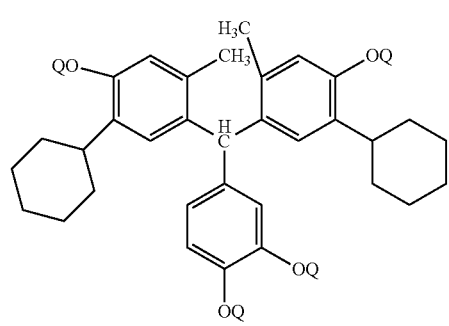
(IXn)
-continued
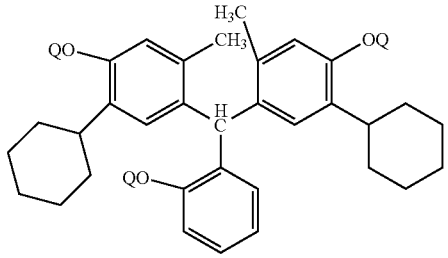
(IXo)
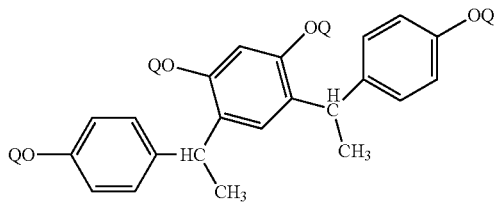
(IXp)
(IXq)
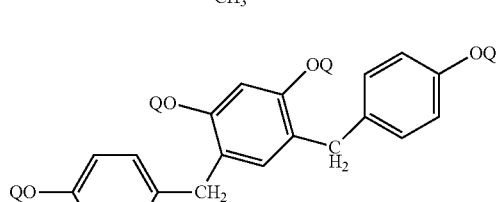
(IXr)
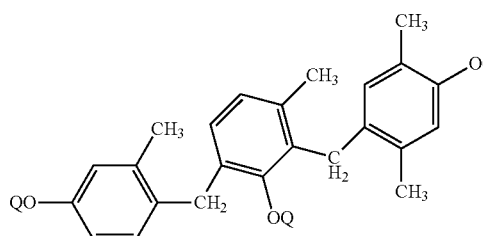
(IXs)
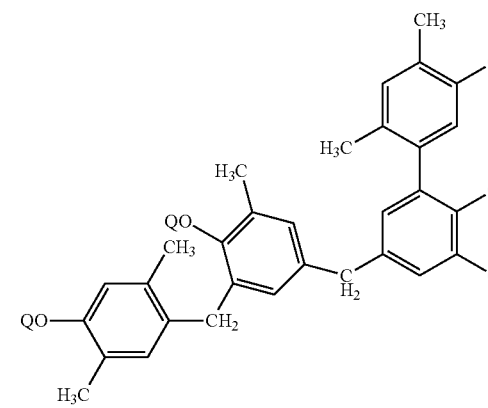
(IXt)

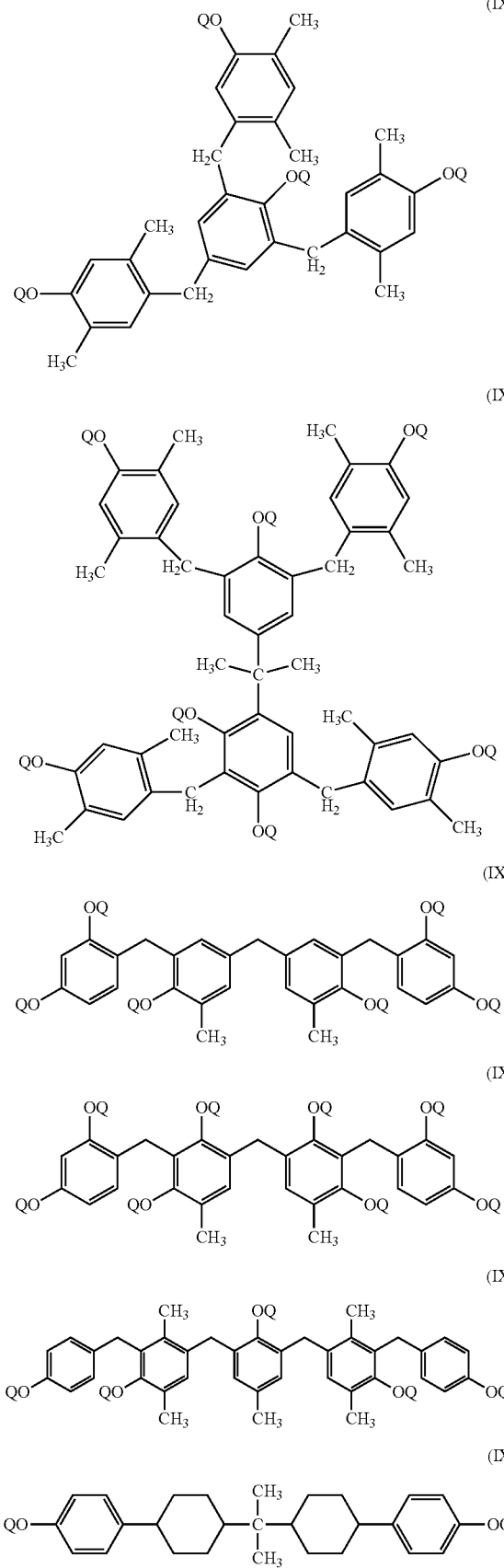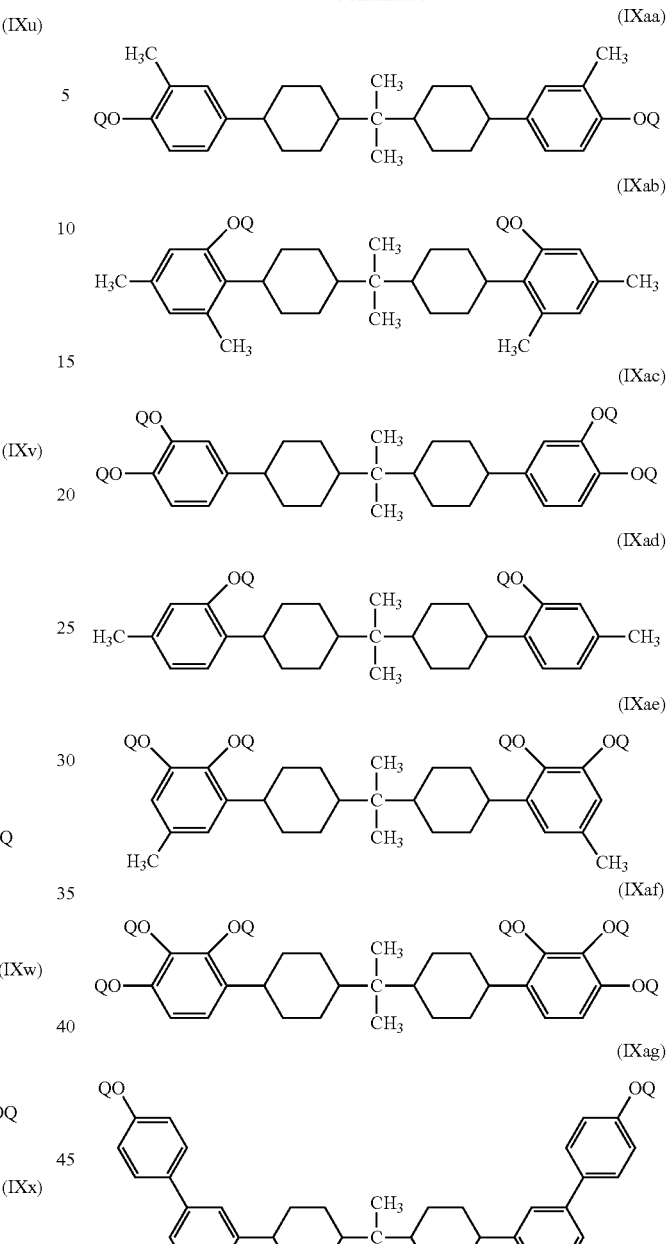

In the above listed PACs of formulae (IXa) to (IXag), Q refers to any one of photoactive moieties of formulae (VIIIA), (VIIIB) or (VIIIC) or hydrogen, but at least one of these Q in each of these structures is (VIIIA), (VIIIB) or (VIIIC). Several of the PACs listed above are commercially available. For example, PAC-5570 of formula (IXc) (St. Jean Photochemicals Inc., Quebec, Canada), SCL6 of formula (MX)(Secant Chemicals Inc., Winchendon, Mass., USA), TrisP3M6C-2-201 of formula (IXo), collectively TS-200, TS-250 and TS-300 of formula (IXa), and 4NT-300 of formula (IXe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to any one of group (VIIIA), (VIIIB) or (VIIIC).

In some embodiments, the composition of this invention contains a photoactive compound selected from the group consisting of:

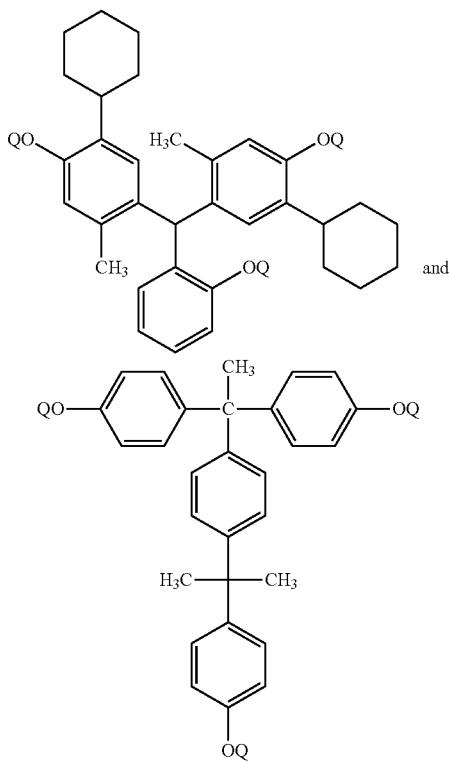

and wherein at least one of Q is a group of formula (VIIIa) or (VIIIb):

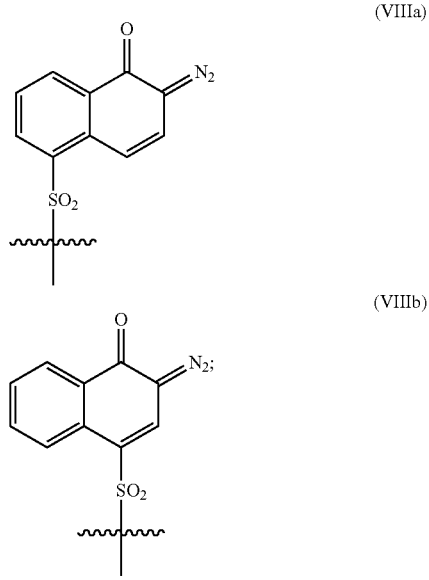

and the remaining Q is hydrogen.

It has been further observed that employing one or more photosensitizers in the composition of this invention provides additional beneficial effects. Most notably, the photosensitizers thus employed can activate the photoactive compound at a particular wavelength of the radiated light. For this purpose, any suitable sensitizer compound can be employed in the compositions of the present invention. Such suitable sensitizer compounds include, photosensitizers, such as, anthracenes, phenanthrenes, chrysenes, benzpyrenes, fluoranthenes, rubrenes, pyrenes, xanthones, indanthrenes, and mixtures thereof. In some exemplary embodiments, suitable sensitizer components include mixtures thereof. Generally, as mentioned above, the photosensitizers absorb energy from the radiated light source and transfers that energy to the photoactive compound employed in the composition of this invention so as to form carboxylic acid.

It should again be noted that any photosensitizers alone or as mixtures in any combination thereof can be used, and only if needed depending upon the intended use and to obtain the desirable benefit. Again, any amount of one or more of aforementioned sensitizers can be used in the composition of this invention so as to bring about the desired results. Generally it has now been found that such amounts can range from 0 to 5 parts by weight per hundred weight parts of the polymer resin (pphr). In some embodiments such amounts range from 1 to 3 pphr.

As noted, the compositions of the present invention also include one or more crosslinking agents that are advantageously capable of bonding with the base soluble polymer when exposed to a suitable radiation. Such materials include, but are not limited to, crosslinking compounds that incorporate one or more of an oxazoline group such as 2-oxazoline-2-yl group, a methylol group such as a N-hydroxy methylaminocarbonyl group or an alkoxymethyl group such as a N-methoxy methylaminocarbonyl group, acrylate group, thiol or thioalkyl group, maleimide, and the like. Generally, the aforementioned bonding with the substituted unsaturated cyclic imide end group of the polyimide is a cross-linking reaction that is initiated by photo radical generated during the photo-irradiation at an appropriate temperature. Further, such crosslinking can be completed further by curing at an appropriate temperature post irradiation, generally at or above 150° C. for an appropriate amount of time. Such thermal curing is further facilitated by thermal radical generator as well as the thermal crosslinking agents such as for example, epoxy groups such as a glycidyl group, an epoxycyclohexyl group, an oxetane group, and the like. It should be noted however that it is surprising that such curing of the composition of this invention can be carried out at much lower temperature than conventionally used especially for polyimides known in the art, which is generally carried out at higher than 250° C. or even higher than 300° C.

Accordingly, in some embodiments of this invention, the photosensitive composition of this invention, without any limitation, contains one or more crosslinking agents selected from the following:
an epoxy acrylate;
a polyester acrylate;
a polyether acrylate;
an aliphatic urethane acrylate;
an aromatic urethane acrylate;
a multifunctional epoxy; and
a multifunctional mercapto($C_2$-$C_8$)alkanoate.

Exemplary epoxies and other cross-linking additives, as mentioned above, include, but are not limited to, bisphenol A epoxy resin (LX-1—Daiso Chemical Co., Osaka, Japan), 2,2'-(((((1-(4-(2-(4-(oxiran-2-ylmethoxy)phenyl)propan-2- yl)phenyl)ethane-1,1-diyl)bis(4,1-phenylene))bis(oxy))bis(methylene))bis(oxirane) (Techmore VG3101L—Mitsui Chemical Inc.), trimethylolpropane triglycidylether (TMPTGE—CVC Specialty Chemicals, Inc.), and 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl)methane (EPON™ 862, Hexion Specialty Chemicals, Inc.), triglycidyl ether of poly(oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

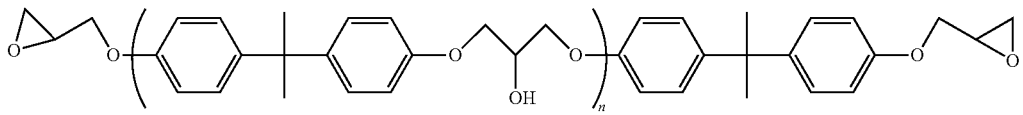

LX-01, where n is from 1 to 5

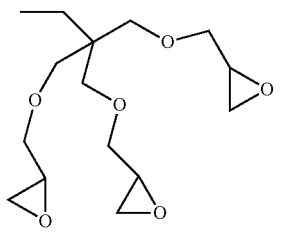

TMPTGE

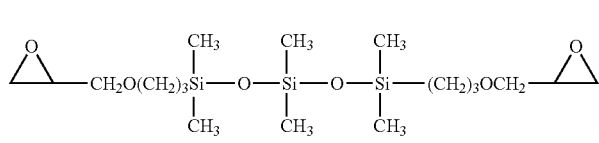

DMS-E09

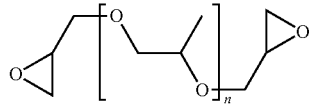

D.E.R.™ 732, where n = 8 to 10 and D.E.R.™ 736, where n = 4 to 6

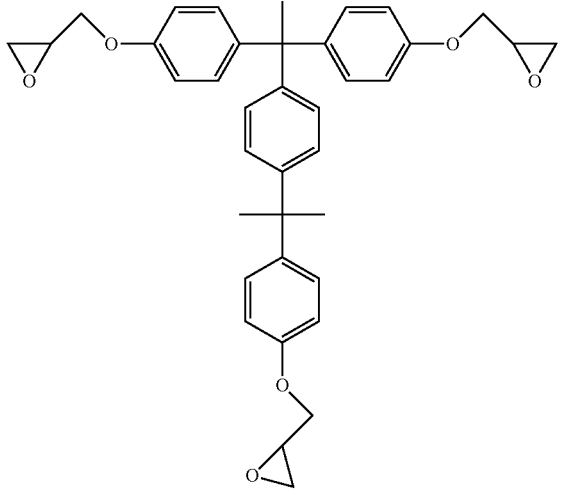

Techmore VG3101L

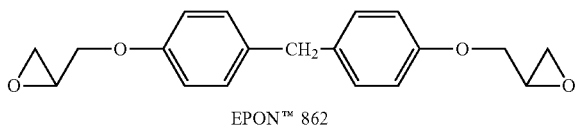

EPON™ 862

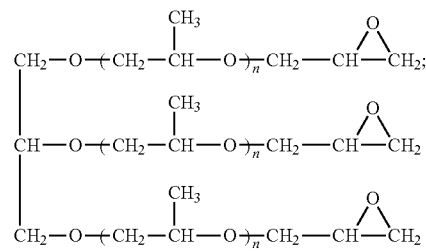

triglycidyl ether of poly(oxypropylene)epoxide ether of gycerol, where n is from 6 to 10, commercially available as Heloxy 84 or GE-36 from Momentive Specialty Chemicals Inc.

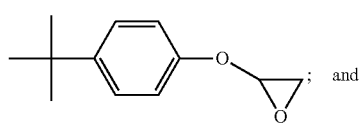
2-((4-(tert-butyl)phenoxy)methyl)oxirane, commercially available as Heloxy 65 from Momentive Specialty Chemicals Inc.
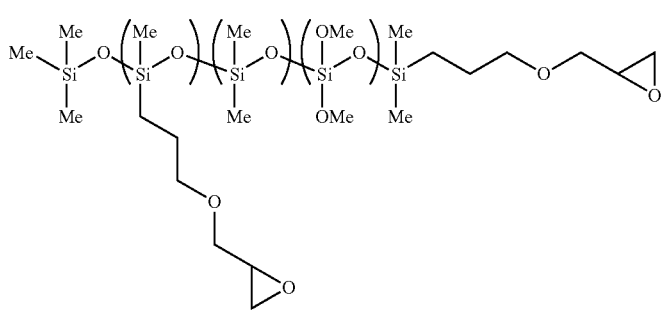
Silicone modified epoxy compound commercially available as BY16-115 from Toray-Dow Corning Silicone Co., Ltd.
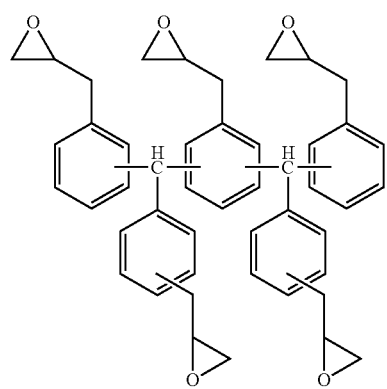
JER1032H60, available from Nippon Kayaku Co., Ltd.
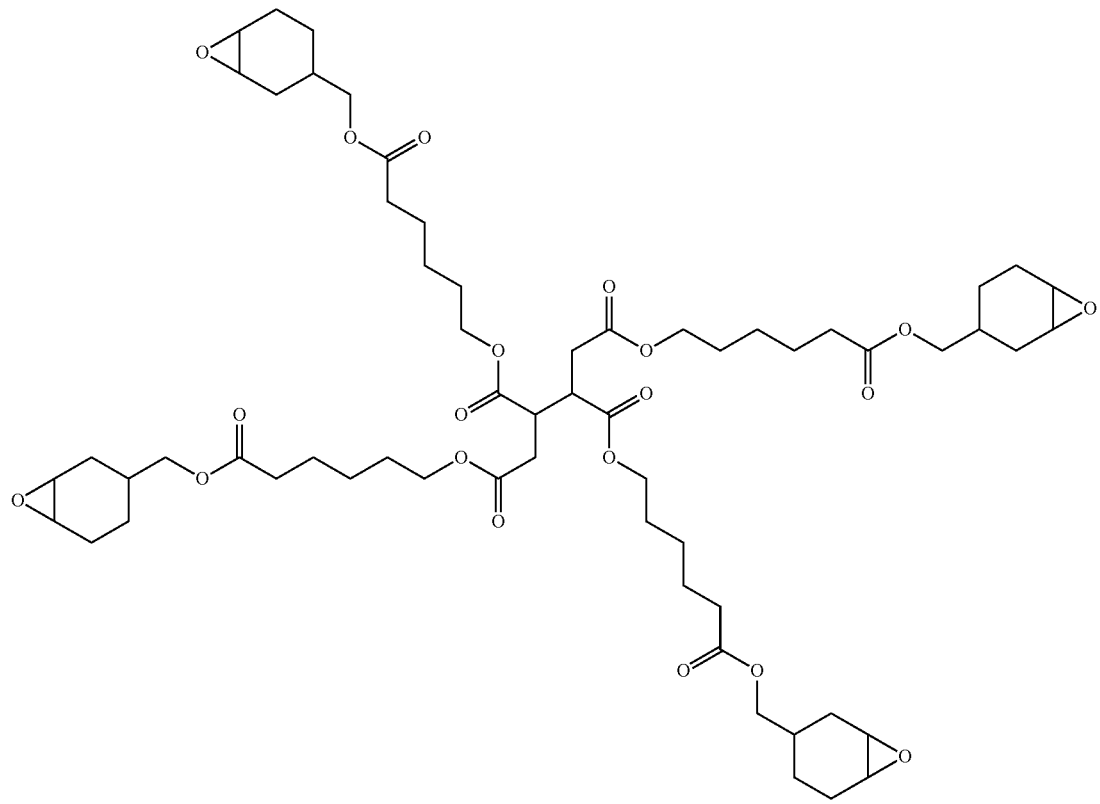
GT-401, available from Daicel Corp.

Other cross-linking agents that can be used in the compositions of this invention include the following:

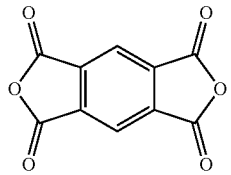

1H,3H-benzo[1,2-c:4,5-c']difuran-1,3,5,7-tetraone (PMDA), available from Aldrich

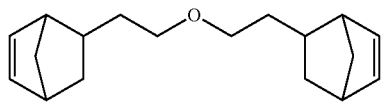

5,5'-(oxybis(ethane-2,1-diyl))bis(bicyclo[2.2.1]hept-2-ene)(NBEtOEtNB)

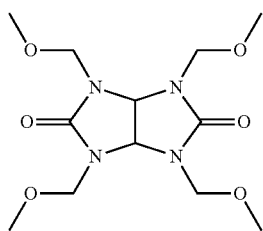

Powderlink 1174, availablr from Cytec, 1,3,4,6-tetrakis(methoxymethyl)tetrahydroizidazo[4,5-d]imidazole-2,5(1H3H)-dione

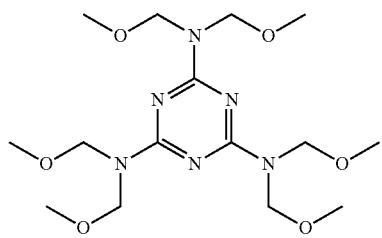

N2,N2,N4,N4,N6,N6-hexakis(methoxymethyl)-1,3,5-triazine-2,4,6-triamine, Cymel 1170, available from Cytec

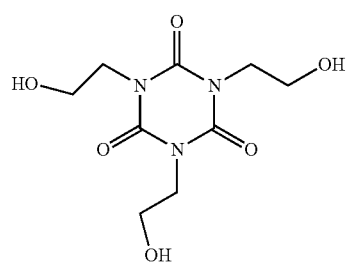

1,3,5-tris(2-hydroxyethyl)-1,3,5-trizainane-2,4,6-trione, THETATO, available from Aldrich

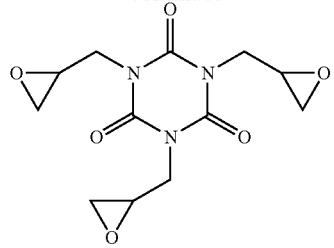

1,3,5-tris(oxiran-2-ylmethyl)-1,3,5-trizainane-2,4,6-trione, TOTATO, available from Aldrich

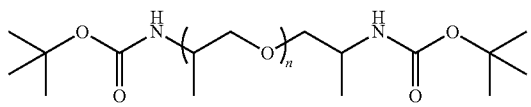

N-BOC JD-2000, where n = 30

Still other exemplary epoxy resins or cross-linking additives include, among others Araldite MT0163 and Araldite CY179 (manufactured by Ciba Geigy); and EHPE-3150, Epolite GT300 and (manufactured by Daicel Chemical).

The amount of epoxy compound may also vary as noted for PACs depending upon the base soluble polymer employed in the composition and the amount can also vary depending upon the intended result. The amount can vary generally from about 1 to 75 parts by weight per 100 parts of the polymer and typically from about 20 to about 60 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

The photosensitive composition of this invention further encompasses one or more compounds or additives having utility as, among other things, adhesion promoter, a surface leveling agent, antioxidants, a synergist, silane coupling agents, phenolic resins, flame retardants, plasticizers, curing accelerators, and the like. In fact, the base catalysts employed herein indeed act as curing accelerators. Examples of surface leveling agents include a variety of non-ionic, amphoteric and anionic surfactants available in the art, which provide, among other things, wetting, spreading and levelling properties. Exemplary surface leveling agents include without any limitation, non-ionic polymeric fluorochemical surfactant, such as for example, FC-4432 available from 3M Advanced Materials Division, a short chain perfluoro-based ethoxylated nonionic fluorosurfactant, such as for example, Chemguard S-550, CAPSTONE fluorosurfactants available as both nonionic and amphoteric forms from DuPont, PolyFox fluorosurfactants from OMNOVA Solutions, and the like. In addition, any of the known conventional surfactants may be used in combination with the above noted surfactants, such known non-ionic surfactants include for example, perfluoroalkyl polyoxyethylene ethanols, fluorinated alkyl esters, perfluoroalkylamine oxides and fluorinated organosiloxane compounds. Various other such commercially available surfactants include Florade FC-4430 from Sumitomo 3M Ltd., Surflon S-141 and S-145 from Asahi Glass Co., Ltd., Unidyne DS-401, DS-4031 and DS-451 from Daikin Industries Ltd., Megaface F-8151 from Dainippon Ink & Chemicals, Inc., and X-70-093 from Shin-Etsu Chemical Co., Ltd.

Non-limiting examples of such other compounds or additives are selected from the group consisting of the following, commercially available materials are indicated by such commercial names.

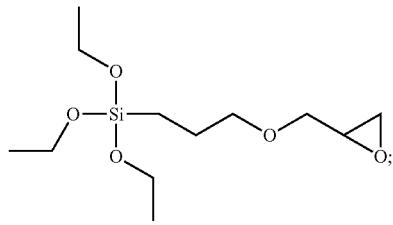

triethoxy(3-(oxiran-2-ylmethoxy)propyl)silane, also known as 3-glycidoxypropyl triethoxysilane (3-GTS or (KBE-403 from Shin-Etsu Chemical Co., Ltd.))

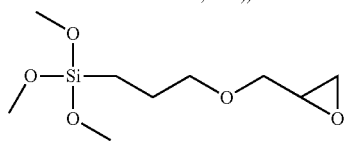

triethoxy(3-(oxiran-2-ylmethoxy)propyl)silane, also commonly known as 3-glycidoxypropyl trimethoxysilane (KBE-403E from Shin-Etsu Chemical Co., Ltd.));

$C_6H_5(CH_3O)_3Si$
phenyltrimethoxysilane
$C_6H_5(C_2H_5O)_3Si$
phenyltriethoxysilane (KBE-103 commercially available from Gelest or Shin-Etsu Chemical Co., Ltd.)

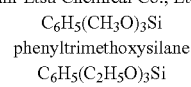

3,3,10,10-tetramethoxy-2,11-dioxa-3,10-disiladodecane (SIB-1832 from Gelest)

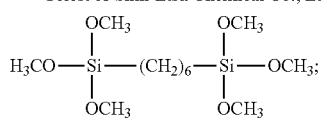

N,N'-bis[(3-triethoxysilylpropyl)aminocarbonyl]polyethylene oxide (SIB-1824.84 from Gelest)

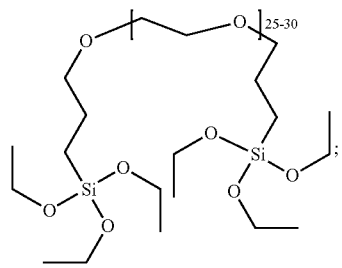

diethoxy(propoxy)(3-thiocyanatopropyl)silane (SIT 7908.0 from Gelest)

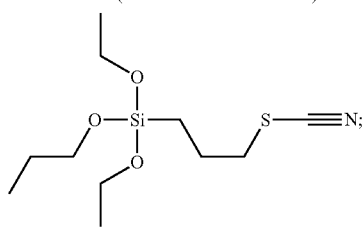

4,4,13,13-tetraethoxy-3,14-dioxa-8,9-dithia-4,13-disilahexadecane

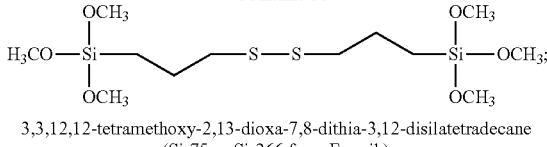

3,3,12,12-tetramethoxy-2,13-dioxa-7,8-dithia-3,12-disilatetradecane (Si-75 or Si-266 from Evonik)

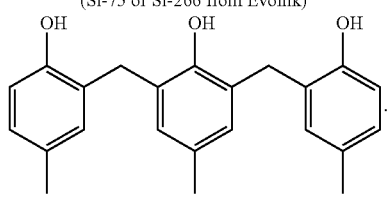

2,2'-((2-hydroxy-5-methyl-1,3-phenylene)bis(methylene))bis(4-methylphenol) (antioxidant AO-80 from TCI Japan)

Advantageously, it has now been found that polymer compositions of this invention provide several desirable properties especially when compared to several of the polymers reported in the literature for similar applications. For instance, the compositions of this invention exhibit increased photo speed while "image-wise" exposure to a suitable radiation. That is, the images are fixed on the substrates at a much faster speed than most conventional materials. This facilitates faster cycles for forming imaged structures on various substrates. In addition, it has been observed that several of the polymers as described herein exhibit very low dark field loss (DFL) making them more desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are more susceptible to the developer and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at higher develop time. Accordingly, in some embodiments of this invention the DFL of the compositions may be less than about 20 percent; in some other embodiments DFL can be less than 25 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH), among other known aqueous developers. This can further be tailored based on the molar content of the free carboxylic acid group present in the maleic repeat units of formula (IIA) in the polymer. Generally, it has now been found that by judicious selection of the molar ratio of ring opened maleic anhydride repeat units it is now possible to control the dissolution rate of the composition of this invention to the desirable range. Furthermore, the compositions of this invention retain much needed lithographic resolution, photospeed and high degree of chemical resistance, among various other desirable properties.

Advantageously, the compositions of this invention exhibit very high thermo-mechanical properties. Specifically, it has now been found that the films formed from the compositions of this invention exhibit excellent tensile properties as well as very high elongation to break (ETB). In addition, the compositions of this invention exhibit excellent photo imaging properties. The films can be readily formed from any of the known solvent casting methods as well as melt extrusion methods. For example, the composition of this invention can be coated onto a suitable substrate, such as for example, spin coating. The coated substrates are then baked to remove any residual solvents. Such post apply baking (PAB) temperatures can range from about 100° C. to 120° C. for a sufficient length of time from about 2 minutes to 10 minutes. In some embodiments such PAB temperature is at about 110° C. for about 3 minutes. The films so formed are then cured at a temperature in the range of from about 150° C. to 200° C. to form the cured films for a sufficient length of time ranging from about 2 hours to 6 hours under inert atmosphere, such as for example, nitrogen atmosphere. In some embodiments such curing is carried out at 170° C. for about 4 hours. In some embodiments such curing is carried out at 200° C. for about 2 hours. It is contemplated that during the curing step the latent base generator releases the base which facilitates the crosslinking of the polymer with epoxy crosslinking agents employed in the composition of this invention.

The cured films can readily be lifted out of the substrates for mechanical property testing. The tensile strength of the so formed films are generally in the range from about 70 MPa to about 150 MPa depending upon the type of polymer employed and the type of latent base generator employed in the composition of this invention. In some embodiments the tensile strength is from about 80 MPa to about 120 MPa and in some other embodiments the tensile strength is from about 90 MPa to about 100 MPa. The ETB of the films are generally high as well. The ETB can range from about 15 percent to 50 percent or higher. In some embodiments the ETB ranges from about 20 percent to 45 percent, 25 percent to 40 percent, and so on.

In general among other things, various compounds and additives as enumerated herein improve overall performance of the photosensitive composition of this invention thus providing well defined photo-patterned structures having a variety of utilities, including but not limited to chip-stack applications, redistribution layers (RDL) and for forming CMOS image sensor dam structures. Advantageously, it has also been found that certain of the additives as described herein may feature more than one function. For example, some of the additives as enumerated hereinabove may not only exhibit certain photosensitization activity during exposure to radiation but may also facilitate as a cross linking agent, for instance. Therefore, additives as used herein do not limit the activity of such compounds to only one of such property but may also facilitate other functions of the photosensitive compositions of this invention.

The photosensitive composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example, spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photo active compound (PAC) and/or photosensitizer incorporated into the polymer composition as described herein. However, generally such appropriate wavelength is from 200 to 700 nm. It will be understood that the phrase "imagewise exposure" means exposing through a masking element to provide for a resulting pattern of exposed and unexposed portion of the film, as further illustrated by specific examples hereinbelow.

After an imagewise exposure of the film formed from photosensitive composition in accordance with the present invention, a development process is employed. For the positive tone compositions as contemplated by the present invention, such development process removes only the exposed portions of the film thus leaving a positive image of the masking layer in the film. A post exposure bake (PEB) can be employed prior to the aforementioned development process, generally at a temperature from 90° C. to 130° C. for from 1 to 10 minutes, although other appropriate temperatures and times can be used.

Any aqueous base developers can be employed for the development step. For example, tetramethylammonium hydroxide (TMAH) is commonly employed as a, aqueous base developer. However, other organic solvents can be used as suitable developers which can include propylene glycol methyl ether acetate (PGMEA), 2-heptanone, cyclohexanone, NMP, GBL, cyclopentanone, butyl acetate, and mixtures in any combination thereof, among others.

Thus some composition embodiments of the present invention provide self-imageable films that after imagewise exposure, the resulting image is developed using an aqueous base developer. After the image is developed, the substrate is rinsed to remove excess developer solution, typical rinse agents are water or appropriate alcohols and mixtures thereof. The excess developer can also be removed by blowing a stream of nitrogen on to the substrate. Other methods of removing excess developer include spinning the developed wafer at high spin speeds of about 1000-3000 rpm for 10-30 se followed by applying a stream of nitrogen.

After the aforementioned rinsing, the substrate is dried and the imaged film finally cured. That is to say, the image is fixed. Where the remaining layer has not been exposed during the imagewise exposure, image fixing is generally accomplished by causing further reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure or a higher energy source and may be for a longer period of time although any other appropriate energy source can be employed. The heating is generally carried out at a desirable temperature, for example, from above 150° C. for a time of from 40 min to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the composition of the present invention to form layers which are characterized as having high heat resistance, an appropriate water absorption rate, high transparency, and low permittivity. In addition, such layers generally have an advantageous thermo-mechanical properties as described hereinabove and hereafter. Most notably, improved tensile strength, improved elongation to break (ETB) and exhibit higher glass transition temperatures ($T_g$) when compared with conventional materials. It should further be noted that the layers formed in this fashion from some of the compositions of this invention also exhibit unusually high thermal decomposition temperature. Accordingly, the 5 percent weight loss temperature ($T_{d5}$) of the cured polymeric layers is generally higher than 300° C. and can range from 300° C. to 420° C. or higher, thus offering hitherto unattainable properties.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a positive tone photosensitive polymer composition which exhibits enhanced characteristics with respect to one or more of mechanical properties (such as high tensile strength, elongation to break) and at least equivalent or better chemical resistance, as compared to alternate materials. In addition, such embodiments provide generally excellent electrical insulation, adhesion to the substrate, and the like. Thus semiconductor devices, device packages, and display devices are provided that incorporate embodiments in accordance with the present invention.

Advantageously, the photosensitive compositions of this invention can also be used to form adhesive layers for bonding the semiconductor chips to each other, such as in chip-stack applications. For example, a bonding layer used for such a purpose is composed of a cured product of the photosensitive adhesive composition of the present invention. It should be noted that although the adhesive layer is a single-layer structure, it can not only exhibit sufficient adhesiveness to the substrate but also it is expected to be free of significant stress resulting due to the curing step.

Further, in some embodiments of this invention as described above, the electronic and/or the semiconductor device according to this invention encompass a laminated semiconductor element where said lamination consists of a photosensitive composition according to the present invention.

In some embodiments of this invention, the semiconductor device encompassing a redistribution layer (RDL) structure further incorporates a photosensitive composition according to this invention.

Further, in some embodiments of this invention as described above, the semiconductor device encompassing a chip stack structure further includes a photosensitive composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In another aspect of this invention there is also provided a cured product comprising the composition of this invention.

This invention is further illustrated by the following examples which are provided for illustration purposes and in no way limit the scope of the present invention.

EXAMPLES (GENERAL)

The following abbreviations have been used hereinbefore and hereafter in describing some of the compounds, instruments and/or methods employed to illustrate certain of the embodiments of this invention:
PMDA—1H,3H-benzo[1,2-c:4,5-c']difuran-1,3,5,7-tetraone; ODPA—5,5'-oxybis(iso-benzofuran-1,3-dione); 6BF—4,4'-([1,1'-biphenyl]-4,4'-diylbis(oxy))bis(3-(trifluoromethyl)-aniline); BZXPh5—2-(4-aminophenyl)benzo[d]oxazol-5-amine; BZXPh6-2-(4-amino-phenyl)benzo[d]oxazol-6-amine; APB—4,4'-(1,3-phenylenebis(oxy))dianiline; BAFA—4,4'-(perfluoropropane-2,2-diyl)bis(2-aminophenol); JD230—a diamine of formula (VI) as disclosed herein; DPS—4,4'-sulfonyldianiline; $(NH_2PhOPh)_2SO_2$—4,4'-((sulfonylbis(4,1-phenylene))bis (oxy))dianiline; BZX—benzo[d]oxazole-2,5-diamine; ABZ—1H-benzo[d]-imidazol-2-amine; THA—tri-n-hexylamine; DBA—di-n-butylamine; BA—n-butylamine; OA—n-octylamine; NBD—bicyclo[2.2.1]hepta-2,5-diene; MI—maleimide; MA—maleic anhydride; N-CyHexMI—N-cyclohexyl maleimide; DBU—1,8-diazabicyclo[5.4.0]undec-7-ene; CXC-1761—a thermal base generator from King Industries, Inc.; WPBG-174-1-(9,10-dioxo-9,10-dihydroanthracen-2-yl)ethyl cyclohexylcarbamate; ROMA—ring opened maleic anhydride; TrisP3M6C-2-201—a 1,2-naphthoquinonediazide functional group containing photo-active compound as disclosed herein; VG3101L—2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane); GE36—triglycidyl ether of poly(oxypropylene)epoxide ether of glycerol; KBM-403E—trimethoxy(3-(oxiran-2-ylmethoxy)propyl)silane; FC-4432—a non-ionic polymeric fluorochemical surfactant;
NMP—N-methyl-2-pyrrolidone; GBL—γ-butyrolactone; DMAc—N,N-dimethylacetamide;
DMSO—dimethyl sulfoxide; THF—tetrahydrofuran; PGMEA—propylene glycol monomethyl ether acetate; GPC—gel permeation chromatography; $M_w$—weight average molecular weight;
$M_n$—number average molecular weight; PDI—polydispersity index; $^1$H-NMR—proton nuclear magnetic resonance spectroscopy; FT-IR—Fourier transform infrared spectroscopy; ppm—parts per million; pphr—parts per hundred parts of resin.

Polymer Synthesis

Various ROMA polymers as used herein to form the compositions of this invention are prepared according to the procedures disclosed in U.S. Pat. No. 9,834,627, pertinent portions of which are incorporated herein by reference. The polymers as prepared in accordance with the procedures as set forth therein were heat treated at 110° C. for 3 hours in 30 wt. % solution in PGMEA before using in the compositions of this invention. The polyamic acids are prepared in accordance with the literature procedures by reacting the corresponding dianhydrides with a diamine in a suitable organic solvent as further described below in Examples 1 to 5.

Example 1

ODPA/BAFA/APB (50/35/15 Molar Ratio)

A mixture of APB (0.88 g, 0.3 mmol) and BAFA (2.56 g, 0.7 mmol) were dissolved in NMP (15.9 g) and stirred at ambient temperature under a nitrogen atmosphere. To this solution was then added ODPA (3.1 g, 1 mmol) while stirring at ambient temperature. The reaction mixture was continued to stir at ambient temperature for 20 hours during which time the solution turned viscous. A small portion of this solution was diluted with DMAc for GPC analysis. GPC-DMAc—$M_w$=77,250, $M_n$=48,523, PDI=1.59. A small sample of this solution (5 g) was added to heptanes (75 g) to isolate the polymer and dried at 50° C. for 20 hours to obtain 0.85 g (85% yield). $^1$H-NMR (500 MHz) spectra measured in deuterated DMSO showed a broad peak centered at 12.6 ppm for COOH and 10.53, 10.18 and 9.85 for —NH— groups of the poly(amic acid). A broad set of peaks were found at 6.0-8.5 ppm for aromatic protons from ODPA, APB and BAFA.

Example 2

PMDA/6BF/BAFA (50/40/10 Molar Ratio)

6BF (8.071 g, 1.6 mmol) and BAFA (1.47 g, 0.4 mmol) were dissolved in NMP (55.6 g) and stirred at ambient temperature under a nitrogen atmosphere. To this solution was added PMDA (4.36 g, 2 mmol) while stirring at ambient temperature. The reaction mixture was stirred at ambient temperature for an additional period of 20 hours during which time the solution turned viscous. A small portion of this solution was then diluted with DMAc for GPC analysis. GPC-DMAc—$M_w$=116,398, $M_n$=59,564, PDI=1.95. A small sample of the polymer solution (about 5 g of 20% solution in NMP) was mixed with THF (about 3 g) and added to excess heptanes (100 g) to precipitate the polymer. The solid obtained was dried at 50° C. for 20 hours in a vacuum oven to obtain 0.9 g (90% isolated yield) of the solid polymer. $^1$H-NMR (500 MHz) spectra measured in deuterated DMSO showed a broad peak centered at about 13 ppm for COOH and 10.86 and 10.56 for —NH— groups of the poly(amic acid). A broad set of peaks were found at 6.5-8.5 ppm for aromatic protons from PMDA, 6BF and BAFA.

Example 3

ODPA/APB (50/50 Molar Ratio)

APB (21.93 g, 75 mmol) was dissolved in NMP (180.8 g) and stirred at ambient temperature under a nitrogen atmosphere. To this solution was added ODPA (23.27 g, 75 mmol) slowly while stirring at ambient temperature. The reaction mixture was stirred at ambient temperature for 20 hours during which time the solution turned viscous. A small portion of this solution was then diluted with DMAc for GPC analysis. GPC-DMAc—$M_w$=124,000, $M_n$=72,700, PDI=1.7.

Example 4

PMDA/APB/JD230 (50/30/20 Molar Ratio)

A mixture of APB (17.54 g, 60 mmol) and JD230 (9.52 g, 40 mmol) were dissolved in NMP (195.5 g) and stirred at ambient temperature under a nitrogen atmosphere. To this solution was added PMDA (21.81 g, 100 mmol) slowly while stirring at ambient temperature. The reaction mixture was stirred at ambient temperature for 20 hours during which time the solution turned viscous. A small portion of this solution was then diluted with DMAc for GPC analysis. GPC-DMAc—$M_w$=136,400, $M_n$=65,000, PDI=2.1. The reaction mixture was diluted with cyclopentanone (100 g) and added to 1.5 L of a mixture of water/acetone (80/20 weight ratio) to precipitate the polymer. The liquids were removed and the solid polymer was washed with 1 L of water/acetone (80/20 weight ratio). The solid polymer was dried in a vacuum oven at 80-90° C. for 24 hours to obtain the solid polymer (43 g, 88% isolated yield). The polymer (43 g) was dissolved in GBL (128.7 g) and cyclopentanone (45.1 g) to obtain a solution of 22 wt. %.

Example 5

ODPA/BAFA/APB (50/15/35 Molar Ratio)

A mixture of APB (10.23 g, 35 mmol) and BAFA (5.49 g, 15 mmol) were dissolved in NMP (103 g) and stirred at ambient temperature under a nitrogen atmosphere. To this solution was added ODPA (15.51 g, 50 mmol) slowly while stirring at ambient temperature. The reaction mixture was continued to stir at ambient temperature for 20 hours during which time the solution turned viscous. A small amount of this solution was diluted with DMAc for GPC analysis. GPC-DMAc—$M_w$=77,250, $M_n$=48,253, PDI=1.59.

Example 6 p(MA)

Maleic anhydride (49 g, 500 mmol) dissolved in cyclopentanone (107.6 g) in a 3-neck round-bottom flask equipped with a nitrogen inlet and an outlet and a thermometer was heated to 70° C. in a nitrogen atmosphere. A thermal radical initiator (Luperox LP, 4 g, 10 mmol) was added batch wise (4×1 g) while monitoring the temperature of the reaction mixture. The temperature of the reaction mixture remained at 65-70° C. during the addition that took about 15 minutes. Once the addition of the initiator was completed the heating and stirring under nitrogen atmosphere was continued for 8 hours. The reaction mixture was then added to heptanes (750 g) while stirred and the solvents decanted to isolate the polymer as a slime. This slime was washed with heptanes (2×200 g), solvents decanted and the slime was dried in a vacuum oven at 50° C. for 24 hours to obtain 23 g of polymeric maleic anhydride (pMA, 43% yield). HPLC (DMAc) $M_w$=8,350, $M_n$=6,620, PDI 1.26. The FT-IR characterization of pMA showed the presence of a broad peak at 2500-3500 $cm^{-1}$ indicating that some of the maleic anhydride repeat units are in a ring-opened form. Characteristic peaks for cyclic anhydride at 1850 $cm^{-1}$ and 1777 $cm^{-1}$ were present. $^1$H-NMR (500 MHz) spectrum measured in deuterated DMSO showed a broad peak centered at about 12.5 ppm for COOH confirming the FT-IR observation. Broad polymeric peak was detected in 1.0-4.5 ppm. $^{13}$C-NMR spectrum measured in deuterated DMSO showed broad peaks at 170-175 ppm, 35-50 ppm and 25-35 ppm.

Latent Thermal Base Generator Synthesis

The thermal base generators as used herein can be synthesized by any of the methods known in the art by reacting the respective cyclic anhydride with the amine in suitable solvents, such as, THF, NMP or PGMEA, generally in solution of about 18-22 wt. percent and heating under a nitrogen atmosphere at 50° C. for 5 hours. The resulting thermal base generator is then isolated by adding the solution to excess heptanes, which can be further characterized by FT-IR, NMR (500 MHz) and LC-MS. The thermal base generators prepared in NMP or PGMEA can also be used without further isolation or purification as further described hereinbelow. The following Examples 7-27 further illustrate the preparation of a few of the specific thermal base generators used in the compositions of this invention.

Example 7

MADBA

In a glass bottle maleic anhydride (15 g, 153 mmol) and di-n-butylamine (18.7 g, 145 mmol) were dissolved together in THF (60 g), purged with nitrogen and the bottle was sealed. About 40° C. exotherm was observed during the mixing. The reaction mixture was then kept at 50° C. for 5 hours. The MADBA solution was concentrated by rotovap at 40° C. to remove THF and 33 g crude product was obtained. This crude product was washed with 4×100 g heptanes and dried at 40° C. for 24 hours in a vacuum oven to obtain 30 g (89% yield) of MADBA. The molecular weight of MADBA as measured by LC-MS was as follows: 227 Da, LC-MS positive mode (+H$^+$) m/e=228 Da, LC-MS negative mode (−H$^+$) m/e=226 Da. FT-IR characterization of the compound showed peaks at 3449 $cm^{-1}$ for the presence of a carboxylic acid and at 1655 $cm^{-1}$ for the presence of carbonyl groups of an amic acid. The characteristic peaks for cyclic anhydrides at 1775 $cm^{-1}$ and 1860 cm were not present indicating that maleic anhydride has ring opened. $^1$H-NMR spectra measured in deuterated DMSO showed a broad peak centered at 13 ppm for COOH, peaks at 5.9 ppm, 6.75 ppm, 3.25 ppm, 1.5 ppm, 1.25 ppm and 0.9 ppm. $^{13}$C-NMR spectrum obtained in deuterated DMSO showed peaks at 166 ppm, 138 ppm, 125 ppm, 48 ppm, 44 ppm, 31 ppm, 29 ppm, 20 ppm and 14 ppm.

Example 8

MABA

Maleic anhydride (10 g, 102 mmol) and n-butylamine (6.57 g, 90 mmol) dissolved in PGMEA (81 g) taken in a glass bottle was purged with nitrogen and the bottle was sealed. The reaction mixture was gradually heated and kept at 50° C. for 5 hours, 100° C. for 5 hours and 110° C. for 5 hours. About 20 g of the MABA solution was added to 100 g heptanes to isolate the crude product and washed with 100 g heptanes followed by drying in a vacuum oven at 60° C. for 20 hours. Purified MABA was obtained as a yellow solid (4 g, 95% isolated yield). The molecular weight as determined by LC-MS was as follows: 171 Da, LC-MS positive mode (+H$^+$) m/e=172 Da, LC-MS negative mode (−H$^+$) m/e=170 Da. FT-IR characterization of the compound showed peaks at 3245 cm for the presence of a carboxylic acid and at 1702 $cm^{-1}$ and 1638 $cm^{-1}$ for the presence of carbonyl groups of an amic acid. $^1$H-NMR spectra measured in deuterated DMSO showed a broad peak centered at about 15 ppm for COOH, a peak at 9.2 ppm for the —NH— group of the amide and peaks at 6.2 ppm, 6.45 ppm, 3.15 ppm, 1.5 ppm, 1.25 ppm and 0.9 ppm.

Example 9

MADBU

Maleic anhydride (5 g, 51 mmol) and 1,8-Diazabicyclo[5.4.0]undec-7-ene (6.84 g, 45 mmol) were dissolved in THF (20 g) in a glass bottle, purged with nitrogen and the bottle was sealed. The reaction mixture was kept at 50° C. for 5 hours. Part of the MADBU solution was concentrated by rotovap at 40° C. to remove THF and the crude product was dried in a vacuum oven at 40° C. for 24 hours. The dark brown solid obtained was washed with heptanes (2×75 g) and dried again in a vacuum oven at 40° C. for 24 hours. The molecular weight of MADBU as measured by LC-MS was as follows: 250 Da, LC-MS positive mode (+H$^+$) m/e=251 Da. $^1$H-NMR spectra measured in deuterated methanol showed a peak at 6.27 ppm for the double bond of the ring opened maleic anhydride and peaks at 3.3-3.8 ppm, 2-2.1 ppm and 1.5-1.8 ppm from DBU. $^{13}$C-NMR spectrum obtained in deuterated methanol showed peaks at 169 ppm, 166 ppm, 125 ppm, 135 ppm, 67 ppm, 54 ppm, 38 ppm, 32 ppm, 39 ppm, 26 ppm, 25 ppm, 24 ppm and 19 ppm.

Example 10

MATHA

Maleic anhydride (5 g, 51 mmol) and tri-n-hexylamine (12.1 g, 45 mmol) were dissolved in THF (20 g) in a glass bottle, purged with nitrogen and the bottle was sealed. The reaction mixture was kept at 50° C. for 5 hours. Part of the MATHA solution was concentrated by rotovap at 40° C. to remove THF and the crude product was washed with heptanes (2×100 g) and dried in a vacuum oven at 70° C. for 20 hours to obtain 11 g (64% yield) of a dark brown liquid product. $^1$H-NMR spectra measured in deuterated methanol showed broad peaks and a small sharp peak at 6.27 ppm for ring opened maleic anhydride indicating a part of the MATHA product is polymeric. Broad peaks at 3.32-3.33 ppm, 1.69 ppm and 0.92-0.95 ppm for MATHA was observed. $^{13}$C-NMR spectrum obtained in deuterated methanol showed peaks at 169 ppm, 135 ppm, 52 ppm, 31 ppm, 26 ppm, 23 ppm, 22 ppm, and 13 ppm.

Example 11

MA(DBA)$_2$

Maleic anhydride (5 g, 51 mmol) and di-n-butylamine (13.1 g, 102 mmol) were dissolved in THF (20 g) in a glass bottle, purged with nitrogen and the bottle was sealed. The reaction mixture was kept at 50° C. for 5 hours. The MA(DBA)$_2$ solution was concentrated by rotovap at 40° C. to remove THF and the crude product was dried in a vacuum oven at 70° C. for 20 hours to obtain 13 g (72% yield) of a viscous liquid. A sample (2 g) of the crude product was dissolved in THF (8 g) and chromatographed in a silica gel column using heptane/ethyl acetate (1:4). Two products were isolated and the solvents removed by rotovap. The non-polar fraction (0.4 g, 20% yield) was identified as MADBA, LC-MS positive mode (+H$^+$) m/e=228 Da, LC-MS negative mode (-H$^+$) m/e=226 Da. The more polar product was identified as MA(DBA)$_2$ with MADBA as some impurity. The molecular weight of MA(DBA)$_2$ as measured by LC-MS was as follows: 356 Da, LC-MS positive mode (+H$^+$) m/e=357 Da, LC-MS negative mode (-H$^+$) m/e=355 Da. $^1$H-NMR spectra measured in deuterated DMSO showed peaks at 7 ppm, 6.55 ppm, 6.2 ppm, 5.85 ppm, 3.2 ppm, 2.85 ppm, 1.3-1.6 ppm, 1.1-1.3 ppm and 0.85 ppm.

Example 12

MAABZ

Maleic anhydride (5 g, 51 mmol) and 2-aminobenzimidazole (6.65 g, 50 mmol) were dissolved in NMP (40 g) in a glass bottle, purged with nitrogen and the bottle was sealed. The reaction mixture was kept at 50° C. for 5 hours. A small sample of this MAABZ solution was added to excess heptanes to isolate the product and washed with excess heptanes followed by drying in a vacuum oven at 60° C. for 20 hours. The molecular weight of MAABZ as measured by LC-MS was as follows: 231 Da, LC-MS positive mode (+H$^+$) m/e=232 Da, LC-MS negative mode (-H$^+$) m/e=230 Da. FT-IR characterization of the compound showed peaks at 3450 cm$^{-1}$ for the presence of a carboxylic acid and at 1671 cm$^{-1}$ for the presence of carbonyl groups of an amic acid. $^1$H-NMR spectra measured in deuterated DMSO showed a broad peak centered at about 12 ppm for COOH, a peak at 8.7 ppm for the —NH— group and peaks at 7-7.6 ppm.

Example 13

MAAPB

Maleic anhydride (5 g, 51 mmol) and 4,4'-(1,3-phenylenebis(oxy))dianiline (APB, 6.6 g, 25 mmol) were dissolved in PGMEA (40 g) in a glass bottle, purged with nitrogen and the bottle was sealed. The reaction mixture was kept at 50° C. for 5 hours. A yellow solid product formed that was soluble in NMP or DMAc. A small sample of this MAAPB solution was added to excess heptanes to isolate the product, washed with excess heptanes followed by drying in a vacuum oven at 60° C. for 20 hours. The molecular weight of MAAPB as measured by LC-MS was as follows: 488 Da, LC-MS positive mode (+H$^+$) m/e=489 Da, LC-MS negative mode (-H$^+$) m/e=487 Da. FT-IR characterization of the compound showed peaks at 3450 cm$^{-1}$ for the presence of a carboxylic acid and at 1500-1700 cm$^{-1}$ for the presence of carbonyl groups of an amic acid. $^1$H-NMR spectrum measured in deuterated DMSO showed a broad peak centered at about 13 ppm for COOH, a peak at 10.4 ppm for the —NH— group and peaks at 7.3-7.6 ppm and 6.2-6.9 ppm. $^{13}$C-NMR spectrum measured in deuterated DMSO showed peaks at 167.5 ppm, 164 ppm, 158.5 ppm, 157 ppm, 141 ppm, 132 ppm, 131 ppm, 115.5 ppm, 115 ppm, 114.5 ppm 110.5 ppm and 110 ppm.

Example 14

MADPS

Maleic anhydride (10 g, 102 mmol) and 4,4'-sulfonyldianiline (12.4 g, 50 mmol) were dissolved in NMP (80 g) in a glass bottle, purged with nitrogen and the bottle was sealed. The reaction mixture was kept at 50° C. for 5 hours. A small sample of this MADPS solution was added to excess heptanes to isolate the product, washed with excess heptanes followed by drying in a vacuum oven at 60° C. for 20 hours. The molecular weight of MADPS as measured by LC-MS was as follows: 444 Da, LC-MS negative mode (-H$^+$) m/e=443 Da. FT-IR characterization of the compound showed peaks at 3447 cm$^{-1}$ for the presence of a carboxylic acid and at 1680 cm$^{-1}$ for the presence of carbonyl groups of an amic acid. $^1$H-NMR spectrum measured in deuterated DMSO showed a broad peak centered at about 13 ppm for COOH, a peak at 10.75 ppm for the —NH— group and peaks at 7.5-8.2 ppm and 6.2-6.7 ppm. $^{13}$C-NMR spectrum measured in deuterated DMSO showed peaks at 167.5 ppm, 164 ppm, 158.5 ppm, 157 ppm, 141 ppm, 132 ppm, 131 ppm, 115.5 ppm, 115 ppm, 114.5 ppm 110.5 ppm and 110 ppm.

Example 15

MA(NH$_2$PhOPh)$_2$SO$_2$

Maleic anhydride (3.75 g, 38 mmol) and 4,4'-((sulfonylbis(4,1-phenylene))bis(oxy))dianiline (7.5 g, 17 mmol) were dissolved in PGMEA (40 g) in a glass bottle, purged with nitrogen and the bottle was sealed. The reaction mixture was kept at 50° C. for 5 hours. An off-white solid product formed. The solvent was filtered out and the solid was washed with heptanes (300 g) and dried in a vacuum oven at 40° C. for 6 hours. FT-IR characterization of the compound showed peaks at 3444 cm$^{-1}$ for the presence of a carboxylic acid and at 1500-1700 cm$^{-1}$ for the presence of carbonyl groups of an amic acid. $^1$H-NMR spectrum measured in deuterated DMSO showed a broad peak centered at about 13 ppm for COOH, a peak at 10.5 ppm for the —NH— group and peaks at 8.00 ppm, 7.45 ppm, 7.2 ppm, 6.9 ppm, 6.5 ppm and 6.3 ppm. $^{13}$C-NMR spectrum measured in deuterated DMSO showed peaks at 167.5 ppm, 164 ppm, 161.5 ppm, 155.5 ppm, 141 ppm, 136 ppm, 132 ppm, 131.5 ppm, 131 ppm, 119 ppm 116.5 ppm, 116 ppm and 11 ppm.

Example 16

MABZX

Maleic anhydride (2 g, 20 mmol) and benzo[d]oxazole-2,5-diamine (1.49 g, 10 mmol) were dissolved in NMP (15 g) in a glass bottle, purged with nitrogen and the bottle was sealed. The reaction mixture was kept at 50° C. for 5 hours. A small sample of this MABZX solution was added to excess heptanes to isolate the product and washed with excess heptanes followed by drying in a vacuum oven at 60° C. for 20 hours. The molecular weight of MABZX as measured by LC-MS was as follows:=345 Da, LC-MS positive mode (+H$^+$) m/e=346 Da, LC-MS negative mode (−H$^+$) m/e=344 Da. FT-IR characterization of the compound showed peaks at 3448 cm$^{-1}$ for the presence of a carboxylic acid and at 1665 cm for the presence of carbonyl groups of an amic acid. $^1$H-NMR spectrum measured in deuterated DMSO showed abroad peak centered at about 13 ppm for COOH, peaks at 11.1 ppm and 10.4 ppm for the —NH— groups and peaks at 6.6-7.9 ppm, 6.1-6.5 ppm.

Example 17

MABZXPh5

Maleic anhydride (2.15 g, 22 mmol) and 2-(4-aminophenyl)benzo[d]oxazol-5-amine (2.5 g, 11 mmol) were dissolved in NMP (20 g) in a glass bottle, purged with nitrogen and the bottle was sealed. The reaction mixture was kept at 50° C. for 5 hours. A yellow solid product formed and was washed with heptanes (3×100 g) followed by drying in a vacuum oven at 40° C. for 24 hours to obtain MABZXPh5 (4 g, 86% yield). The molecular weight of MABZXPh5 as measured by LC-MS was as follows: 421 Da, LC-MS positive mode (+H$^+$) m/e=422 Da, LC-MS negative mode (−H$^+$) m/e=420 Da. FT-IR characterization of the compound showed peaks at 3449 cm for the presence of a carboxylic acid and at 1677 cm$^{-1}$ for the presence of carbonyl groups of an amic acid. $^1$H-NMR spectrum measured in deuterated DMSO showed a broad peak centered at about 13 ppm for COOH, peaks at 10.55 ppm and 10.65 ppm for the —NH— groups and peaks at 8.15 ppm, 7.9 ppm, 7.75 ppm, 7.55 ppm, 6.55 ppm and 6.35 ppm.

Example 18

MABZXPh6

Maleic anhydride (5 g, 51 mmol) and 2-(4-aminophenyl)benzo[d]oxazol-6-amine (5.63 g, 25 mmol) were dissolved in NMP (40 g) in a glass bottle, purged with nitrogen and the bottle was sealed. The reaction mixture was kept at 50° C. for 5 hours. A solid product formed and washed with heptanes (2×100 g) followed by drying in a vacuum oven at 40° C. for 20 hours to obtain MABZXPh6 (9 g, 85% yield). The molecular weight of MABZXPh6 as measured by LC-MS was as follows: 421 Da, LC-MS positive mode (+H$^+$) m/e=422 Da, LC-MS negative mode (−H$^+$) m/e=420 Da. FT-IR characterization of the compound showed peaks at 3444 cm$^{-1}$ for the presence of a carboxylic acid and at 1678 cm$^{-1}$ for the presence of carbonyl groups of an amic acid. $^1$H-NMR spectrum measured in deuterated DMSO showed a broad peak centered at about 13 ppm for COOH, a peak at 10.7 ppm for the —NH— group and peaks at 8.25 ppm, 8.15 ppm, 7.85 ppm, 7.75 ppm, 7.5 ppm, 6.45 ppm and 6.35 ppm.

Example 19

MAJD230

Maleic anhydride (5 g, 51 mmol) and JD230 (5.75 g, about 25 mmol since JD230 is an oligomer with molecular weight of about 230 Da) were dissolved in PGMEA (40 g) in a glass bottle, purged with nitrogen and the bottle was sealed. The reaction mixture was kept at 50° C. for 5 hours. A small sample of this MAJD230 solution was added to excess heptanes to isolate the product and washed with excess heptanes followed by drying in a vacuum oven at 60° C. for 20 hours. Average molecular weight of MAJD230 as determined by LC-MS was as follows: 426 Da, LC-MS positive mode (+H$^+$) m/e=427 Da. FT-IR characterization of the compound showed peaks at 3445 cm$^{-1}$ for the presence of a carboxylic acid and at 1676 cm$^{-1}$ and 1634 cm$^{-1}$ for the presence of carbonyl groups of an amic acid. $^1$H-NMR spectrum measured in deuterated DMSO showed a broad peak centered at about 15 ppm for COOH, peaks at 9.01 ppm and 7.7 ppm for the —NH— groups and peaks at 6.4 ppm 6.26 ppm, 6.07 ppm, 4 ppm, 3.3-3.4 ppm, 1.9-2.2 ppm, and 1-1.1 ppm.

Example 20

ODPA-ABZ 5,5'-oxybis(isobenzofuran-1,3-dione) (5 g, 16 mmol) and 2-amino benzimidazole (4.26 g, 32 mmol) were dissolved in NMP (40 g) in a glass bottle, purged with nitrogen and the bottle was sealed. The reaction mixture was kept at 50° C. for 5 hour. A small sample of this ODPA-ABZ solution was added to excess heptanes to isolate the product and washed with excess heptanes followed by drying in a vacuum oven at 60° C. for 20 hours. The molecular weight of ODPA-ABZ as measured by LC-MS was as follows: 576 Da, LC-MS positive mode (+H$^+$) m/e=541 Da (2 moles of H$_2$O removed from the molecular ion), LC-MS negative mode (−H$^+$) n/e=575 Da. FT-IR characterization of the compound showed peaks at 3450 cm$^{-1}$ for the presence of a carboxylic acid and at 1685 cm$^{-1}$ for the presence of carbonyl groups of an amic acid. $^1$H-NMR spectrum measured in deuterated DMSO showed a broad peak centered at about 12 ppm for COOH, peaks at 8.42 ppm and 8.22 ppm for the —NH— groups and peaks at 7.72 ppm and 7.1-7.4 ppm.

Example 21

ODPA-DBA 5,5'-oxybis(isobenzofuran-1,3-dione) (5 g, 16 mmol) and di-n-butylamine (3.87 g, 30 mmol) were dissolved in NMP (36 g) in a glass bottle, purged with nitrogen and the bottle was sealed. The reaction mixture was kept at 50° C. for 5 hour. A small sample of this ODPA-DBA solution was added to excess heptanes to isolate the product and washed with excess heptanes followed by drying in a vacuum oven at 60° C. for 20 hours. The molecular weight of ODPA-DBA as measured by LC-MS was as follows: 568 Da, LC-MS positive mode (+H$^+$) m/e=569 Da, LC-MS negative mode (−H$^+$) m/e=567 Da. FT-IR characterization of the compound showed peaks at 3457 cm$^{-1}$ for the presence of a carboxylic acid and at 1665 cm$^{-1}$ for the presence of carbonyl groups of an amic acid. $^1$H-NMR spectrum measured in deuterated DMSO showed a broad peak centered at about 14 ppm for COOH, peaks at 6.7-8.3 ppm and 2.8-3.1 ppm, 1.8-1.9 ppm, 1.56 ppm, 0.95 ppm and 0.8 ppm.

Example 22

ODPA-DBU 5,5'-oxybis(isobenzofuran-1,3-dione) (5 g, 16 mmol) and 1,8-diazabicyclo[5.4.0]undec-7-ene (4.56 g, 30 mmol) were dissolved in NMP (38 g) in a glass bottle, purged with nitrogen and the bottle was sealed. The reaction mixture was kept at 50° C. for 5 hour. A small sample of this ODPA-DBU solution was added to excess heptanes to isolate the product and washed with excess heptanes followed by drying in a vacuum oven at 60° C. for 20 hours. FT-IR characterization of the compound showed peaks at 3451 cm$^{-1}$ for the presence of a carboxylic acid indicating the presence of the protonated carboxylate anion of ODPA-DBU at 1652 cm$^{-1}$ for the presence of carbonyl groups of ring opened ODPA. $^1$H-NMR spectrum measured in deuterated methanol showed peaks at 8.3-8.33 ppm and 7.83 ppm, 7.25-7.3 ppm, 3.34-3.39 ppm, 2.26-2.27 ppm and 2-2.1 ppm and 1.7-1.8 ppm.

Example 23

MAOA

Maleic anhydride (3 g, 30 mmol) and n-octylamine (3.95 g, 30 mmol) were dissolved in THF (10 g) in a glass bottle, purged with nitrogen and the bottle was sealed. The reaction mixture was stirred overnight to obtain a milky solution. THF was removed by rotovap and the solid was dried in a vacuum oven at 50° C. for 3 hours to obtain a solid product (6.2 g, 89% yield). FT-IR characterization of the compound showed peaks at 3235 cm$^{-1}$, 3070 cm$^{-1}$ and 1641 cm$^{-1}$. $^1$H-NMR spectrum measured in deuterated THF showed a broad peak at 8.5 ppm for a carboxylic acid and peaks at 6.2-6.4 ppm (double bonds from ring-opened maleic anhydride), 3.6 ppm, 1.8 ppm, 1.25-1.35 ppm and 0.95 ppm. $^{13}$C-NMR spectrum measured in deuterated THF showed peaks at 166.3 ppm, 164.7 ppm, 135.3 ppm, 131.6 ppm, 39.9 ppm, 31.8 ppm, 29.2 ppm, 28.8 ppm, 26.9 ppm, 22.6 ppm and 13.5 ppm.

Example 24

MA(OA)$_2$

Maleic anhydride (3 g, 30 mmol) and n-octylamine (8 g, 60 mmol) were dissolved in THF (15 g) in a glass bottle, purged with nitrogen and the bottle was sealed. The reaction mixture was stirred overnight to obtain a clear solution. THF was removed by rotovap and the solid was dried in a vacuum oven at 50° C. for 3 hours to obtain a solid product (10.9 g, 99% yield) that was readily soluble in water indicating an ionic compound had formed. FT-IR characterization of the compound showed peaks at 3280 cm$^{-1}$ for the presence of a carboxylic acid indicating the presence of the protonated carboxylate anion of MA(OA)$_2$, 1642 cm$^{-1}$, 1608 cm$^{-1}$, and 1555 cm$^{-1}$. $^1$H-NMR spectrum measured in deuterated THF showed broad peaks at 10.4 ppm and 6.5 ppm, peaks at 5.8 ppm and 6.1 ppm (double bonds from ring-opened maleic anhydride), 3.65 ppm, 1.8 ppm, 1.25-1.35 ppm and 0.95 ppm.

Example 25 pMADBA

Maleic anhydride homopolymer (1.25 g, 12.5 mmol of MA) and di-n-butylamine (1.45 g, 11.3 mmol) were dissolved in PGMEA (10 g) in a glass bottle, purged with nitrogen and the bottle was sealed. The reaction mixture was stirred at 50° C. for 5 hours and then at 110° C. for 5 hours. The reaction mixture was added to excess heptanes (100 g) to separate pMADBA as a slimy product and the liquid portion was decanted out. The slimy product was washed with heptanes (2×100 g) and dried at 70° C. for 20 hours in a vacuum oven to obtain pMADBA as a gum (2 g, 74% isolated yield). FT-IR characterization of the compound showed a broad peak at 2500-3500 cm$^{-1}$ for the presence of carboxylic acid and at 1715 cm$^{-1}$ for the carbonyl groups of the amic acid functionality.

Example 26 pMABA

Maleic anhydride homopolymer (1.59 g, 16 mmol of MA) and n-butylamine (1.07 g, 15 mmol) were dissolved in PGMEA (10 g) in a glass bottle, purged with nitrogen and the bottle was sealed. The reaction mixture was stirred at 50° C. for 5 hours and then at 110° C. for 5 hours. The reaction mixture was added to excess heptanes (100 g) to separate pMABA as a slimy product and the liquid portion was decanted out. The slimy product was washed with heptanes (2×100 g) and dried at 70° C. for 20 hours in a vacuum oven to obtain pMABA as a gum (2.1 g, 79% isolated yield). FT-IR characterization of the compound showed a broad peak at 2500-3500 cm$^{-1}$ for the presence of carboxylic acid and at 1691 cm$^{-1}$ and 1629 cm$^{-1}$ for the carbonyl groups of the amic acid functionality.

Example 27 pMADBU

Maleic anhydride homopolymer (8 g, 82 mmol of MA) and 1,8-diazabicyclo[5.4.0]undec-7-ene (10.6 g, 70 mmol) were dissolved in THF (10 g) in a glass bottle, purged with nitrogen and the bottle was sealed. The reaction mixture was stirred at 50° C. for 5 hours. THF was removed by rotovap to obtain the crude product as a dark brown solid. Product was dried at 50° C. for 6 hours and at ambient temperature for 18 hours in a vacuum oven to obtain pMADBU as a solid (18 g, 97% isolated yield). FT-IR characterization of the compound showed a broad peak at 2500-3500 cm$^{-1}$ indicating the presence of the protonated carboxylate anion carboxylic acid of pMADBU and at 1641 cm$^{-1}$ and 1594 cm$^{-1}$.

Differential Scanning Calorimetry (DSC) Studies

Figure 1B:
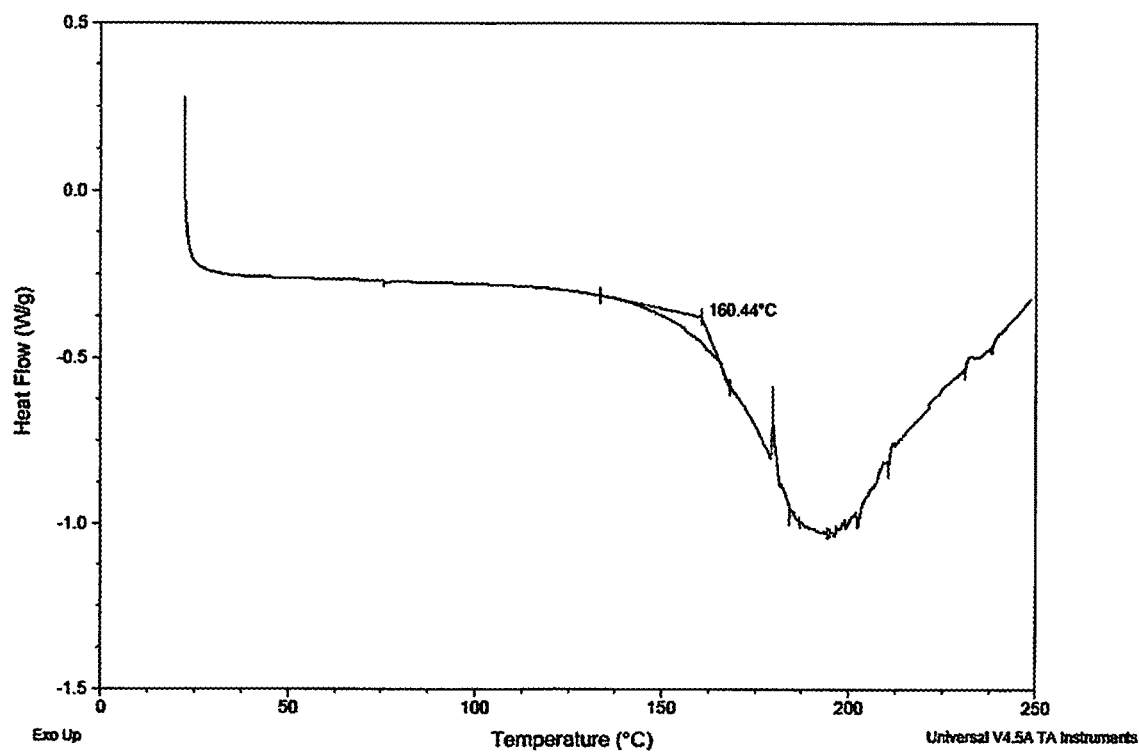

A few of the thermal base generators as described herein were further studied by DSC for their thermal behavior as well as to ascertain certain mechanistic aspects of these thermal base generators. The DSC of these latent thermal base generators were obtained at a temperature range of 25° C. to 250° C. to observe the evidence for ring-closure or decomposition of these latent thermal base generators to form amine bases (FIGS. 1A and 1B). FIG. 1A shows the DSC of MAOA (Example 23) where an endotherm representing a melting point at 81° C. was observed followed by a second endotherm beginning at about 150° C. suggesting that MAOA is ring-closing to form maleic anhydride and n-octyl amine. Once the second exotherm is complete at about 250° C. the sample was cooled to room temperature and the DSC measurement was repeated. There were no melting or ring-closure events during the second DSC run indicating MAOA was completely ring-closed and the volatile n-octylamine may have escaped the sample pan during the first DSC run.

FIG. 1B shows the DSC of MADBA (Example 7) where an endotherm beginning at about 150° C. suggests that MADBA is ring-closing to form maleic anhydride and di-n-butylamine. The DSC of MATHA (Example 10) did not show a clear endotherm and instead had signs of decomposition above 110° C. Table 1 summarizes the observed peak temperature of the endothermic ring-closure reaction of the three thermal base generators (TBG) studied by DSC. It is reasonably expected that n-hexylamine may have been generated during the decomposition of MATHA. These DSC experiments indicate a possible mechanism of base (amine) generation during cure step of films above 150° C. As shown in Scheme 1, it is contemplated that the latent thermal base generators are formed by the reaction between the cyclic anhydride (e.g., maleic anhydride) and an amine (primary, secondary or tertiary amine) at temperatures below 150° C. During the curing of the films formed from the compositions of this invention at temperatures higher than 150° C. the reverse ring-closing reaction occurs generating an amine catalyst. In the case of a thermal base generator derived from a tertiary amine such as tri-hexylamine in the case of MATHA other decomposition reactions may also occur at temperatures higher than 110° C.

TABLE 1

| TBG | Onset of endotherm, ° C. | Peak of endotherm, ° C. | Decomposition start, ° C. |
|---|---|---|---|
| MABA | 156 | 190 | — |
| MADBA | 150 | 190 | — |
| MATHA | — | — | 110 |

Scheme 1

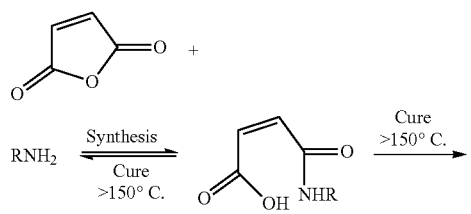

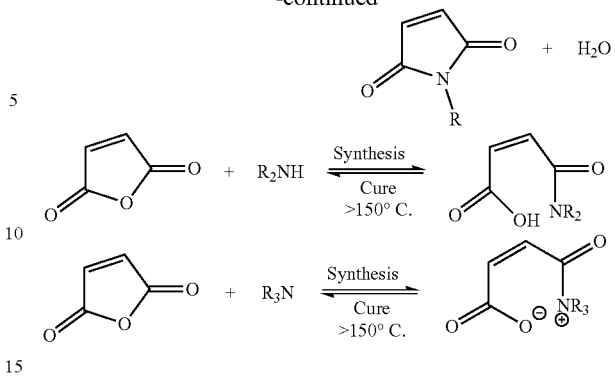

Composition Examples

The following examples illustrate the formation and use of the compositions of this invention in accordance of the practice of this invention.

Examples 28-31

A tetrapolymer, NBD/N-CyHexMI/NHMI/MA (50/17/3/30 molar monomer ratio, 100 parts), where maleic anhydride repeat units are fully ring opened with methanol, was dissolved in GBL (280 parts) and heat treated at 110° C. for 3 hours to partially ring close, and then added specific amounts of additives, expressed as parts per hundred resin (phr): TrisP3M6C-2-201 (35 phr) as a photo-active compound, VG3101L (30 phr) and GE36 (30 phr) as epoxide cross linkers, KBM-403E (5 phr) as an adhesion promoter and FC-4432 (0.3 phr) as a surface leveling agent and varying amounts of MADBA latent base generator prepared in accordance with the procedures as set forth in Example 7 (0.5 phr for Example 28, 1.5 phr for Example 29, 2.5 phr for Example 30, 5 phr for Example 31) were mixed in appropriately sized amber HDPE bottles. The mixtures were rolled for 18 hours to produce homogeneous solutions. Any particle contamination was removed by filtering the polymer solutions through a 0.2 μm pore polytetrafluoroethylene (PTFE) disc filters. The filtered polymer solutions were collected in low particle HDPE amber bottles and the solutions stored at 5° C.

Examples 32-43

A penta polymer, NBD/NBTON/N-CyHexMI/NHMI/MA, (35/15/17/3/30 molar monomer ratio, 100 parts), where maleic anhydride repeat units are fully ring opened with methanol, was dissolved in GBL (280 parts) and heat treated at 110° C. for 3 hours to partially ring close, and then added specific amounts of additives, expressed as parts per hundred resin (phr): TrisP3M6C-2-201 (35 phr) as a photoactive compound, VG3101L (30 phr) and GE36 (30 phr) as epoxide cross linkers, KBM-403E (5 phr) as an adhesion promoter and FC-4432 (0.3 phr) as a surface leveling agent and 1.5 phr of latent base generators prepared in accordance with the procedures as set forth in various examples hereinabove (MADPS for Example 32, MAAPB for Example 33, MA(NH$_2$PhOPh)$_2$SO$_2$ for Example 34, MABZX for Example 35, MAJD230 for Example 36, MATHA for Example 37, MABA for Example 38, MADBA for Example 39, pMADBA for Example 40, MAABZ for Example 41, ODPA-ABZ for Example 42 and MADBU for Example 43) were mixed in appropriately sized amber HDPE bottles. The mixtures were rolled for 18 hours to produce homogeneous solutions. Any particle contamination was removed by filtering the polymer solutions through a 0.2 μm pore polytetrafluoroethylene (PTFE) disc filters. The filtered polymer solutions were collected in low particle HDPE amber bottles and the solutions stored at 5° C.

Examples 44-47

The compositions were made by using the polymer solution of Example 1 as such in NMP, which was adjusted to 20 weight percent polymer solution. Portions of this polymer solution (5 g each) was combined with none, one or two of latent base generator(s) (LBG) prepared in accordance with the procedures as set forth hereinabove as summarized in Table 2.

TABLE 2

| Example No. | LBG-1 (g) | LBG-2 (g) |
| --- | --- | --- |
| 44 | — | — |
| 45 | MA(NH$_2$PhOPh)$_2$SO$_2$ (0.10 g) | — |
| 46 | MA(NH$_2$PhOPh)$_2$SO$_2$ (0.05 g) | ODPA-DBA (0.05 g) |

Examples 47-51

The compositions were made by using the polymer solution of Example 2 as such in NMP, which was adjusted to 13 weight percent polymer solution. Portions of this polymer solution (4 g each) was combined with a latent base generator (LBG) prepared in accordance with the procedures as set forth hereinabove and as summarized in Table 3 and TMPTGE epoxy cross linker (0.13 g, 25 phr).

TABLE 3

| Example No. | LBG (g, phr) |
| --- | --- |
| 47 | — |
| 48 | MA(NH$_2$PhOPh)$_2$SO$_2$ (0.03 g, 5 phr) |
| 49 | MABZXPH5 (0.03 g, 5 phr) |
| 50 | ODPA-DBA (0.03 g, 5 phr) |
| 51 | MAABZ (0.03 g, 5 phr) |

Examples 52-55

Various compositions were made from polyamic acid polymer solutions obtained as such from: Example 3 (ODPA/APB, 50/50.15 wt. % in NMP). The polymer solutions (based on 100 parts of polymer) in each of these Examples were mixed with TrisP3M6C-2-201 as a photo active compound (30 phr), TMPTGE as an epoxy cross linker (30 phr), KBM-403E as the adhesion promoter (5 phr), FC-4432 as the surface leveling agent (0.3 phr) and GBL (100 phr) as extra solvent. MADBA (4 phr) was added to Examples 53. ODPA-ABZ (4 phr) was added to Example 54. MADBU (4 pphr) was added to Example 55. Particle contamination was removed by filtering the formulations through a 0.45-1 μm pore polytetrafluoroethylene (PTFE) disc filters. The filtered formulations were collected in low particle HDPE amber bottles and the solutions stored at 5° C.

Comparative Example 1

A fully ring opened NBD/N-CyHexMI/NHMI/MA terpolymer with methanol (50/17/3/30 molar monomer ratio, 100 parts) was dissolved in GBL (280 parts) and heat treated at 110° C. for 3 hours to partially ring close and added specific amounts of additives, expressed as parts per hundred resin (phr): TrisP3M6C-2-201 (35 phr) as a photoactive compound, VG3101L (30 phr) and GE36 (30 phr) as epoxide cross linkers, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.2 μm pore polytetrafluoroethylene (PTFE) disc filter. The filtered polymer solution was collected in a low particle HDPE amber bottle and the solution was stored at 5° C.

Comparative Example 2

A fully ring opened NBD/N-CyHexMI/NHMI/MA terpolymer with methanol (50/17/3/30 molar monomer ratio, 100 parts) was dissolved in GBL (280 parts) and heat treated at 110° C. for 3 hours to partially ring close and added specific amounts of additives, expressed as parts per hundred resin (phr): TrisP3M6C-2-201 (35 phr) as a photoactive compound, VG3101L (30 phr) and GE36 (30 phr) as epoxide cross linkers, CXC-1761 (0.5 phr) as a latent base catalyst, KBM-403E (5 phr) as an adhesion promoter and FC-4432 (0.3 phr) as a surface leveling agent were mixed in an appropriately sized amber HDPE bottle. The mixture was rolled for 18 hours to produce a homogeneous solution. Particle contamination was removed by filtering the polymer solution through a 0.2 μm pore polytetrafluoroethylene (PTFE) disc filter. The filtered polymer solution was collected in a low particle HDPE amber bottle and the solution was stored at 5° C.

Comparative Examples 3-6

A fully ring opened NBD/N-CyHexMI/NHMI/MA terpolymer with methanol (50/17/3/30 molar monomer ratio, 100 parts) was dissolved in GBL (280 parts) and heat treated at 110° C. for 3 hours to partially ring close and added specific amounts of additives, expressed as parts per hundred resin (phr): TrisP3M6C-2-201 (35 phr) as a photoactive compound, VG3101L (30 phr) and GE36 (30 phr) as epoxide cross linkers, KBM-403E (5.0 phr) as an adhesion promoter and FC-4432 (0.3 phr) as a surface leveling agent and varying amounts of WPBG-174 (0.5 phr for Comparative Example 3, 1.5 phr for Comparative Example 4, 2.5 phr for Comparative Example 5, and 5 phr for Comparative Example 6) were mixed in appropriately sized amber HDPE bottles. The mixtures were rolled for 18 hours to produce homogeneous solutions. Particle contamination was removed by filtering the polymer solutions through a 0.2 μm pore polytetrafluoroethylene (PTFE) disc filters. The filtered polymer solutions were collected in low particle HDPE amber bottles and the solutions were stored at 5° C.

Example 56

Photo Imaging Studies

Each of the compositions from Examples 28-43 and Comparative Examples 1-5 were spin coated at spin speeds ranging from 600-1500 rpm for 30 seconds on 4-inch thermal oxide silicon wafers. The coated films were post apply baked (PAB) at 105° C. on a hot plate for 3 minutes to obtain films having thicknesses in the range of 7-13 µm. The films were then exposed using a combination of a patterned mask and a variable density mask to a broad band Hg-vapor light source (at 365 nm using a band pass filter) at an exposure doses of 1-800 mJ/cm². The films were developed for 15-50 seconds with 2.38 wt. % TMAH in a puddle, rinsed with distilled water and dried using a stream of nitrogen. The film thicknesses (FT) after development were measured. The unexposed film thickness losses or dark field losses (DFL) were calculated based on film thicknesses before and after development in the unexposed area. Positive tone images of trenches at 2-5 µm resolution and contact holes (CH) at 5-7 µm resolution where the films were completely dissolved in exposed areas and only partially dissolved in unexposed were obtained in all cases. The films were cured at 200° C. for 2 hours in an oven under nitrogen atmosphere.

Table 4 summarizes the photo imaging performance of these compositions. The exposure doses listed for each example were that required to obtain at least 5 micron resolution of trenches. Compared to Comparative Examples 1-5, the compositions containing MADBA (Examples 28-30) required a lower dose to obtain 5 µm resolution indicating that MADBA functions as a dissolution promoter in an aqueous base developer, such as TMAH. Additionally, MADBA containing compositions required lower development times, thus demonstrating an advantage provided by this invention when compared with other commercially available base generators.

Figure 2:
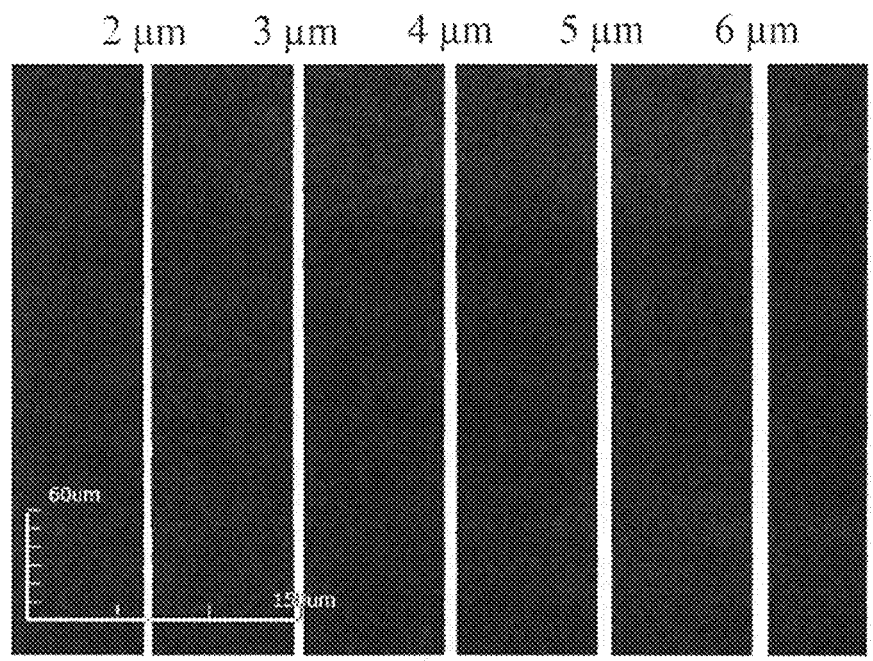
FIG. 2 and FIG. 3 show the laser microscope generated top-down photograph images of two different composition embodiments of this invention.

FIG. 2 shows the laser microscope generated top-down photograph of 2, 3, 4, 5 and 6 µm trenches obtained from the composition of Example 36 where 1.5 phr of MAJD230 was used as a latent thermal base catalyst at the exposure dose of 324 mJ/cm².

Figure 3:
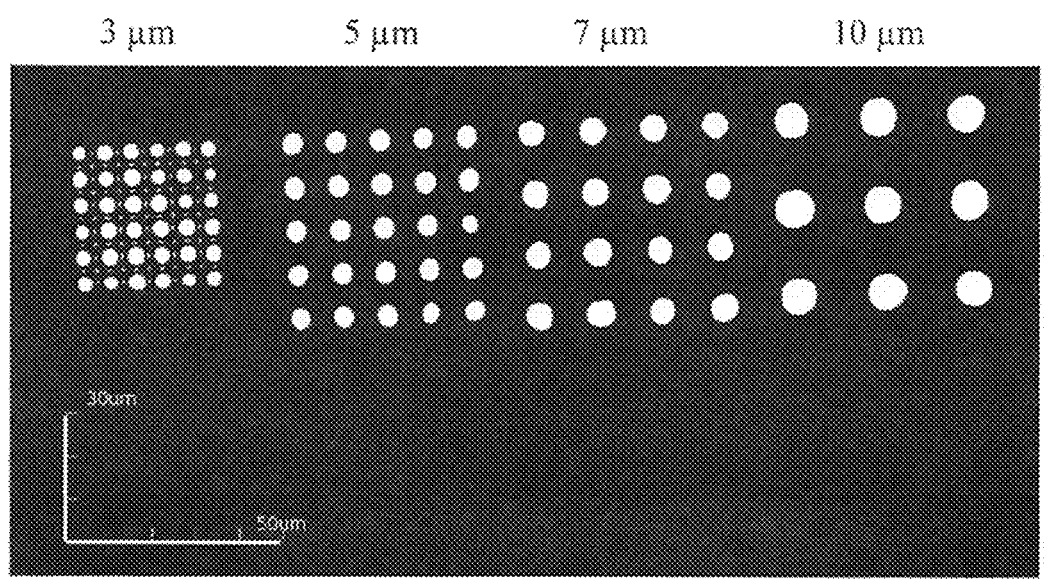

FIG. 3 shows the laser microscope generated top-down photograph of 3, 5, 7 and 10 µm contact obtained from the composition of Example 42 where 1.5 phr of ODPA-ABZ was used as a latent thermal base catalyst at the exposure dose of 324 mJ/cm².

TABLE 4

| Example No. | Latent base additive | FT (µm) | Dose (mJ/cm²) | Develop in TMAH (sec) | DFL (%) |
|---|---|---|---|---|---|
| Comp. Ex. 1 | — | 11.2 | 700 | 25 | 12 |
| Comp. Ex. 2 | 0.5 phr CXC-1761 | 10.9 | 451 | 35 | 14 |
| Comp. Ex. 3 | 0.5 phr WPBG-174 | 11 | 451 | 45 | 19 |
| Comp. Ex. 4 | 1.5 phr WPBG-174 | 11.1 | 451 | 45 | 16 |
| Comp. Ex. 5 | 2.5 phr WPBG-174 | 10.7 | 451 | 40 | 18 |
| Example 28 | 0.5 phr MADBA | 10.5 | 357 | 40 | 23 |
| Example 29 | 1.5 phr MADBA | 10.3 | 357 | 35 | 20 |
| Example 30 | 2.5 phr MADBA | 11.1 | 284 | 30 | 23 |
| Example 32 | 1.5 phr MADPS | 7.3 | 262 | 20 | 60 |
| Example 33 | 1.5 phr MAAPB | 9.80 | 408 | 20 | 22 |
| Example 34 | 1.5 phr MA(NH₂PhOPh)₂SO₂ | 11.8 | 408 | 20 | 26 |
| Example 35 | 1.5 phr MABZX | 12.4 | 262 | 20 | 36 |
| Example 36 | 1.5 phr MAJD230 | 9.30 | 324 | 20 | 23 |
| Example 37 | 1.5 phr MATHA | 10.0 | 408 | 30 | 15 |
| Example 38 | 1.5 phr MABA | 12.0 | 515 | 30 | 18 |
| Example 39 | 1.5 phr MADBA | 9.54 | 262 | 20 | 41 |
| Example 40 | 1.5 phr pMADBA | 10.4 | 408 | 26 | 23 |
| Example 41 | 1.5 phr MAABZ | 10.2 | 408 | 20 | 24 |
| Example 42 | 1.5 phr ODPA-ABZ | 9.40 | 324 | 20 | 23 |
| Example 43 | 1.5 phr MADBU | 10.1 | 408 | 30 | 17 |

FT - film thickness; TMAH - tetramethylammonium hydroxide; DFL - dark field loss

Example 57

Thermo-Mechanical Property Measurements

The compositions from Examples 28-31 and Comparative Examples 1-6 were spin coated at spin speeds ranging from 600-1500 rpm for 30 seconds on 5-inch silicon wafers. The coated films were post apply baked (PAB) at 105° C. on a hot plate for 3 minutes to obtain a film thicknesses in 9-13 µm range. The films were then exposed using a patterned mask suitable to generate rectangle strips of 4.5 mm and 6.5 mm wide and about 5 cm long to a broad band Hg-vapor light source at 365 nm using a band pass filter) at an exposure dose of 400-500 mJ/cm². The films were developed for 15-60 seconds with 2.38 wt. % TMAH in a puddle, rinsed with distilled water and dried using a stream of nitrogen. The films were cured at 200° C. for 2 hours in an oven under nitrogen atmosphere. Elongation to break (ETB) and tensile strength were determined using an Instron equipment and the glass transition temperatures were measured by thermal mechanical analysis (TMA). Table 5 summarizes these results.

TABLE 5

| Example No. | Latent base additive | ETB (%) | Tensile Strength (MPa) | Tg (° C.) |
|---|---|---|---|---|
| Comp. Ex. 1 | — | 16 | 87 | 225 |
| Comp. Ex. 2 | 0.5 phr CXC-1761 | 32 | 88 | 238 |
| Comp. Ex. 3 | 0.5 phr WPBG-174 | 27 | 87 | 223 |
| Comp. Ex. 4 | 1.5 phr WPBG-174 | 18 | 87 | 225 |
| Comp. Ex. 5 | 2.5 phr WPBG-174 | 11 | 88 | 226 |
| Comp. Ex. 6 | 5 phr WPBG-174 | 32 | 84 | 226 |
| Example 28 | 0.5 phr MADBA | 38 | 85 | 228 |
| Example 29 | 1.5 phr MADBA | 43 | 89 | 233 |
| Example 30 | 2.5 phr MADBA | 24 | 85 | 233 |
| Example 31 | 5 phr MADBA | 36 | 82 | 234 |

Example 58

Thermo-Mechanical Property Studies

The composition from Examples 32-43 were spin coated at spin speeds ranging from 600-1500 rpm for 30 seconds on 5-inch silicon wafers. The coated films were post apply baked (PAB) at 105° C. on a hot plate for 3 minutes to obtain a film thicknesses in 9-13 µm range. The films were then exposed using a patterned mask suitable to generate rectangle strips of 4.5 mm and 6.5 mm wide and about 5 cm long to a broad band Hg-vapor light source at 365 nm using a band pass filter at an exposure dose of 400-500 mJ/cm². The films were developed for 15-60 seconds with 2.38 wt. % TMAH in a puddle, rinsed with distilled water and dried using a stream of nitrogen. The films were cured at 200° C. for 2 hours in an oven under nitrogen atmosphere. Elongation to break (ETB) was determined using an Instron equipment and the glass transition temperatures were measured by thermal mechanical analysis (TMA). The calculated pKa values of the bases generated by the latent catalysts were obtained from Scifinder Database.

Table 6 summarizes the results of the thermo-mechanical measurements. It is evident from the data presented in Table 6 the latent base generators that form amines with pKa less than 5 generally are not capable of affecting high ETB values of more than 30%. The latent base generators that form amines with pKa more than 8 are generally suitable for affecting high ETB values of more than 30%. A similar effect on glass transition temperatures are also apparent where the latent base generators that form amines with pKa more than 10 are capable of affecting glass transition temperatures of more than 220° C. with increasing glass transition temperature as the pKa is increased.

Figure 4:
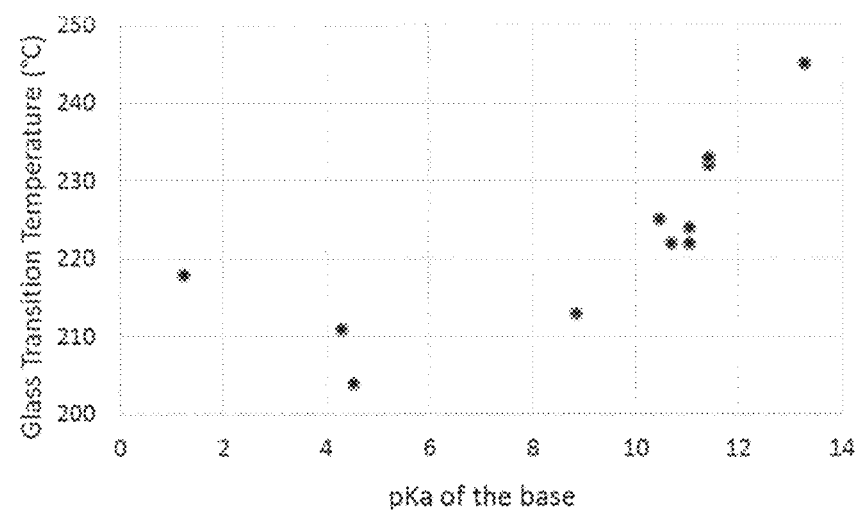
FIG. 4 shows the effect of pKa of the base generated from the latent base catalysts of this invention on the glass transition temperature of various composition embodiments of this invention.
Figure 5:
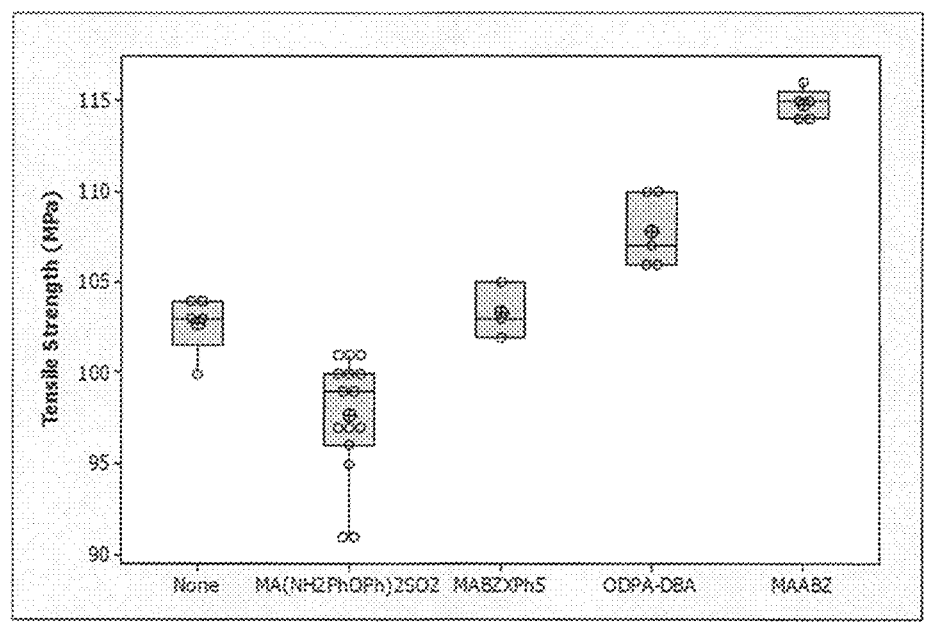
FIG. 5 shows the effect of pKa of the base generated from the latent base catalysts of this invention on the tensile strength of the films formed from various composition embodiments of this invention.

FIG. 4 shows a plot of glass transition temperature of the cured films vs the pKa of the base generated during the cure step. The glass transition temperature is not increased when the base generated is weak or the pKa of the base is less than 6. The glass transition temperature increases as the pKa of the base increases when the pKa is higher than 8 indicating the bases have facilitated the degree of the cure of the films.

TABLE 6

| Example No. | Latent base additive (1.5 phr) | pKa of base | ETB (%) | Tg (° C.) |
|---|---|---|---|---|
| 32 | MADPS | 1.24 | 16 | 218 |
| 33 | MAAPB | 4.29 | 20 | 211 |
| 34 | MA(NH$_2$PhOPh)$_2$SO$_2$ | 4.51 | 11 | 204 |
| 35 | MABZX | 8.55 | 30 | — |
| 36 | MAJD230 | 8.84 | 38 | 213 |
| 37 | MATHA | 10.46 | 19 | 225 |
| 38 | MABA | 10.69 | 22 | 222 |
| 39 | MADBA | 11.03 | 37 | 224 |
| 40 | pMADBA | 11.03 | 19 | 222 |
| 41 | MAABZ | 11.41 | 33 | 232 |
| 42 | ODPA-ABZ | 11.41 | 46 | 233 |
| 43 | MADBU | 13.28 | 25 | 245 |

Example 59

Thermo-Mechanical Property Measurements

The compositions from Examples 44-51 were spin coated at spin speeds ranging from 350-1000 rpm for 30 seconds on 4-inch silicon wafers. The coated films were post apply baked (PAB) at 105-110° C. on a hot plate for 3 minutes to obtain a film thicknesses in 10-17 μm range. The films were cured at 170° C. for 4 hours in an oven under nitrogen atmosphere. The cured films were diced to obtain rectangular film strips at 6.5 mm width for thermo-mechanical property measurements. Tensile strength was determined using an Instron equipment and the glass transition temperatures were measured by thermal mechanical analysis (TMA). The calculated pKa values of the bases generated by the latent catalysts were obtained from Scifinder Database.

Table 7 summarizes the results of these mechanical property measurements. Tensile strength was measured using 5 cured film strips and the maximum value obtained is reported for Examples 44-46 in Table 7 since these brittle films caused many early failures in tensile property measurements. As evident from the data presented in Table 7 the latent base generators that form amines are capable of increasing tensile strength and Young's Modulus of films cured at 170° C. for 4 hours. It should be further noted that the compositions from Examples 47-51 where poly(amic acid) and epoxy cross linker were used to make films and cured at 170° C. for 4 hours, the cured films were not as brittle as the ones formed from Examples 44-46. Therefore tensile measurements did not cause too many early failures. Generally, the thermal base generators that form amines with pKa greater than 11 are most effective in increasing tensile strength and glass transition temperature in these Examples.

TABLE 7

| Example No. | Latent base additive (5 phr) | pKa of base | Tensile Strength (MPa) | Young's Modulus (GPa) | Tg (° C.) |
|---|---|---|---|---|---|
| 44 | — | — | 74 | 3.31 | nm |
| 45 | MA(NH$_2$PhOPh)$_2$SO$_2$ | 4.51 | 90 | 4.03 | nm |
| 46 | ODPA-DBA<br>MA(NH$_2$PhOPh)$_2$SO$_2$ | 11.03<br>4.51 | 101 | 4.37 | nm |
| 47 | — | — | 103 | nm | 194 |
| 48 | MA(NH$_2$PhOPh)$_2$SO$_2$ | 4.51 | 98 | nm | 195 |
| 49 | MABZXPh5 | 7.49 | 103 | nm | 200 |
| 50 | ODPA-DBA | 11.03 | 108 | nm | 201 |
| 51 | MAABZ | 11.41 | 115 | nm | 204 | nm - not measured

Scheme 2 provides a possible path-way for a thermally generated base that can promote the reaction between carboxylic acid of ROMA or poly(amic acid) polymer and an epoxy cross-linker at curing temperatures so as to provide films exhibiting improved thermo-mechanical properties of the films, among other plausible mechanisms responsible for the formation of films having improved thermo-mechanical properties.

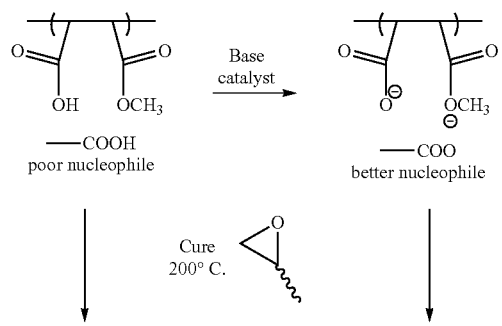

Scheme 2

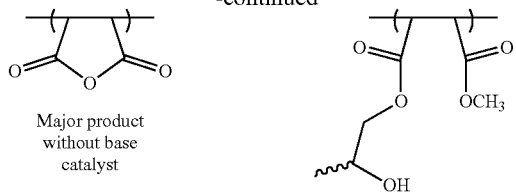

Major product without base catalyst

Major product with base catalysis

↓ Cure 200° C.

↓

Cured Product

Example 60

Photo Imaging Studies

The compositions from Examples 52-55 were spin coated at spin speeds ranging from 2000-2800 rpm for 30 seconds on 4-inch thermal oxide silicon wafers. The coated films were post apply baked (PAB) at 105° C. on a hot plate for 3 minutes to obtain film thicknesses of about 2 μm. The films were then exposed using a combination of a patterned mask and a variable density mask to a broad band Hg-vapor light source (at 365 nm using a band pass filter) at an exposure doses of 1-767 mJ/cm². The films were developed for 15-370 seconds until at least 25 μm features are developed with 2.38 wt. % TMAH in a puddle, rinsed with distilled water and dried using a stream of nitrogen. The film thicknesses (FT) after development were measured in the unexposed area. The unexposed film thickness losses or dark field losses (DFL) were calculated based on film thicknesses before and after development.

Table 9 summarizes the photo imaging performance of these compositions. The comparison of photo imaging of composition Examples 53, 54, and 55 where MADBA, ODPA-ABZ and MADBU as base generating additives were used with composition Example 52 where a base generating additive was not used shows that with the incorporation of the base generating additives in accordance with this invention, it is now possible to decrease the development time, increase the photo speed and increase the resolution of the photo sensitive compositions of this invention.

TABLE 9

| Example No. | FT (μm) | Dose (mJ/cm²) | Development time (sec) | FT (μm) | DFL (%) | Resolution (μm) (CH, T, P) |
|---|---|---|---|---|---|---|
| 52 | 1.98 | 391 | 370 | 1.92 | 3.0 | 25, 25, 10 |
| 53 | 1.95 | 391 | 90 | 1.98 | 1.5 (swell) | 15, 15, 7 |
| 54 | 2.03 | 311 | 30 | 1.98 | 2.5 | 15, 15, 7 |
| 55 | 1.95 | 251 | 60 | 1.82 | 6.7 | 15, 15, 7 |

FT—film thickness; DFL—dark field loss; CH—contact hole; T—trenches; P—pillars.

Figure 6:
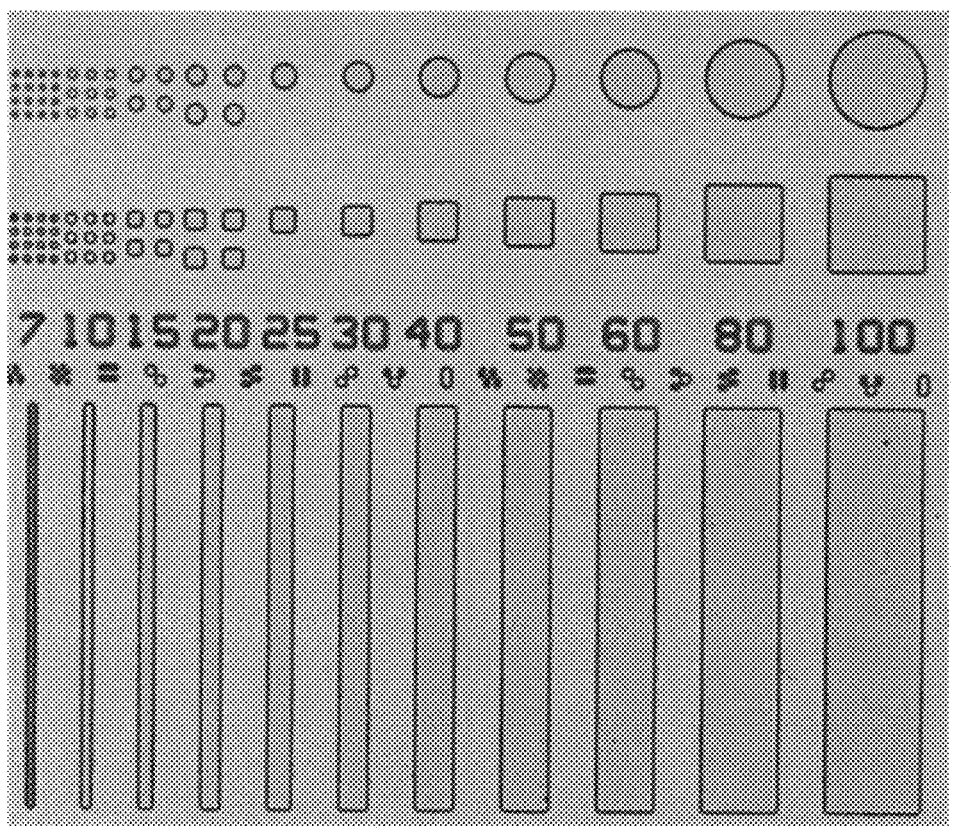
FIG. 6 shows top down optical microscope images of a composition embodiment of this invention for forming contact holes (CH) and trenches (T).
Figure 7:
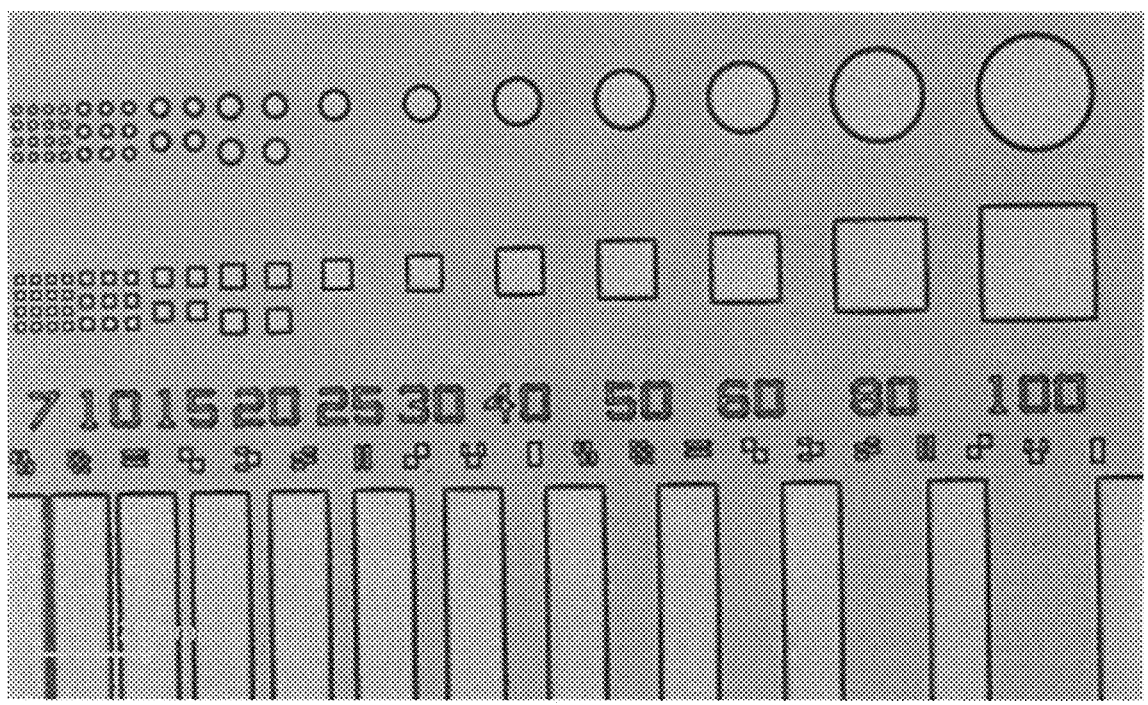
FIG. 7 shows top down optical microscope images of a composition embodiment of this invention for forming pillars (P) and trenches (T).

FIG. 6 and FIG. 7 show top down optical microscope images obtained for compositions from Examples 53 and 54 respectively. Specifically, FIG. 6 shows top down optical microscope images obtained for composition from Example 53 for contact holes (CH) and trenches (T), and FIG. 7 shows top down optical microscope images obtained for composition Example 54 for Pillars (P) and trenches (T).

Example 61

Shelf Life Measurements

The shelf life stability of composition Example 29 (1.5 phr of MADBA was used as thermal base generator) was compared with Comparative Example 2 (except that it contained 0.75 phr CXC-1761 as thermal base generator instead of 0.5 phr). The viscosity change at ambient temperature storage of these two compositions were measured. The results are summarized in Table 10. It is quite evident from the data presented in Table 10 that the viscosity increase of the composition of Example 29 was substantially lower when compared with the Comparative Example 2 indicating that the pot life of compositions containing MADBA is much longer than the compositions containing CXC-1761.

TABLE 10

| Example No. | Days at ambient temperature | Viscosity change |
|---|---|---|
| 29 | 0 | 0% |
|  | 4 | 3% |
|  | 7 | 6% |
|  | 17 | 21% |
| Comparative 2 | 0 | 0 |
|  | 3 | 8% |
|  | 6 | 18% |
|  | 7 | 21% |
|  | 15 | 53% |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:
1. A composition comprising:
   a) a base soluble polymer;
   b) a compound selected from the group consisting of
      a compound of formula (IA):

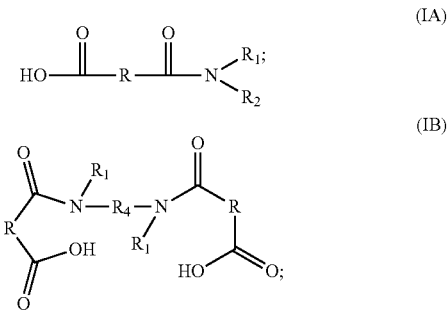

-continued

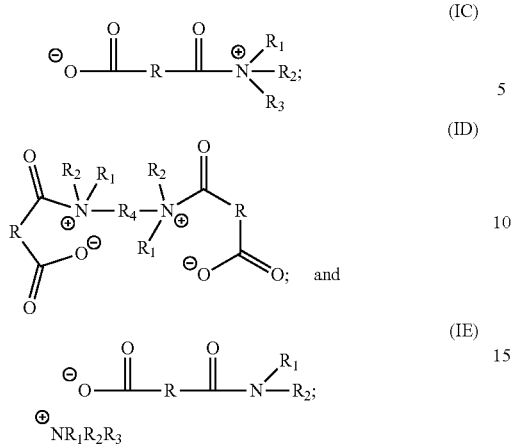

(IC)

(ID)

(IE)

wherein
R and R₄ are the same or different and each independently a divalent organic group selected from the group consisting of $(C_1-C_{12})$alkylene, $(C_1-C_{12})$alkenylene, polyalkyleneoxy, $(C_6-C_{10})$arylene, $(C_6-C_{10})$aryleneoxy$(C_6-C_{10})$arylene, $(C_6-C_{10})$aryleneoxy$(C_6-C_{10})$aryleneoxy$(C_6-C_{10})$arylene, $(C_6-C_{10})$aryleneoxy$(C_6-C_{10})$arylenesulfonyl$(C_6-C_{10})$aryleneoxy$(C_6-C_{10})$arylene, $(C_6-C_{10})$arylenesulfonyl$(C_6-C_{10})$arylene, heteroarylene and $(C_6-C_{10})$aryleneheteroarylene;
$R_1$, $R_2$ and $R_3$ are the same or different and each independently of one another selected from the group consisting of hydrogen, linear or branched $(C_1-C_{16})$alkyl, hydroxy$(C_1-C_{12})$alkyl, perfluoro$(C_1-C_{12})$alkyl, $(C_6-C_{10})$aryl, $(C_6-C_{10})$aryl$(C_1-C_3)$alkyl and heteroaryl; or
$R_1$, $R_2$ and $R_3$ taken together with the nitrogen atom to which they are attached to form a $(C_7-C_{15})$bicycloalkyl ring optionally containing one or more heteroatoms selected from the group consisting of nitrogen, oxygen, sulfur and phosphorus and optionally containing one or more double bonds;
c) a photoactive compound; and
d) an epoxy crosslinking agent.
2. The composition according to claim 1, wherein the base soluble polymer is selected from the group consisting of:
a) a polyamic acid of formula (II):

(II)

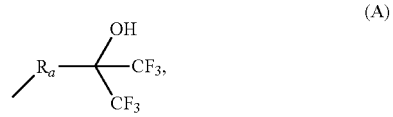

wherein:
m is an integer of at least 50;
X is one or more distinct tetravalent organic group; and
Y is one or more distinct divalent organic group;
b) a polymer A comprising one or more distinct first repeating unit represented by formula (IIIA), each of said first repeating unit is derived from a monomer of formula (III):

(IIIA)

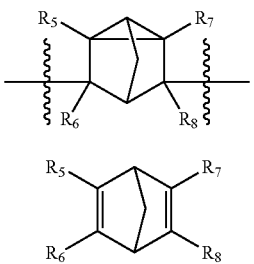

(III)

wherein:
⁓⁓⁓ represents a position at which the bonding takes place with another repeat unit;
each of $R_5$, $R_6$, $R_7$ and $R_8$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_6-C_{10})$aryl, $(C_6-C_{10})$aryl$(C_1-C_3)$alkyl, $-CO_2R_b$, where $R_b$ is $(C_1-C_6)$alkyl or tri$(C_1-C_6)$alkylsilyl, halogen and a group of formula (A):

(A)

where $R_a$ is selected from the group consisting of $-(CH_2)_p-$, $-(CH_2)_q-OCH_2-$ or $-(CH_2)_q-(OCH_2CH_2)_r-OCH_2-$, where p is an integer from 0 to 6, q is an integer from 0 to 4 and r is an integer from 0 to 3;
one or more distinct second repeating unit represented by formula (IVA), said second repeating unit is derived from a monomer of formula (IV):

(IVA)

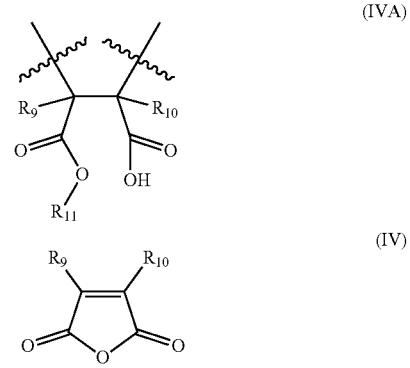

(IV)

wherein:
each of $R_9$ and $R_{10}$ is independently selected from the group consisting of hydrogen, linear or branched $(C_1-C_9)$alkyl and fluorinated or perfluorinated $(C_1-C_9)$alkyl;
$R_{11}$ is selected from the group consisting of hydrogen, linear or branched $(C_1-C_9)$alkyl, fluorinated or perfluorinated $(C_1-C_9)$alkyl, and $-(CH_2)_a-(O-(CH_2)_b)_c-O-(C_1-C_6)$alkyl, where a, b and c are integers from 1 to 4; and one or more distinct third repeating unit represented by formula (VA), said third repeating unit is derived from a monomer of formula (V):

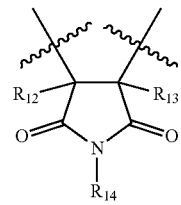
(VA)

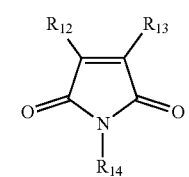
(V)

wherein:
each of $R_{12}$ and $R_{13}$ is independently selected from the group consisting of hydrogen, linear or branched $(C_1\text{-}C_9)$alkyl and fluorinated or perfluorinated $(C_1\text{-}C_9)$alkyl;

$R_{14}$ is selected from the group consisting of hydrogen, linear or branched $(C_1\text{-}C_{16})$alkyl, $(C_3\text{-}C_9)$cycloalkyl, $(C_3\text{-}C_9)$cycloalkyl$(C_1\text{-}C_{10})$alkyl, $(C_6\text{-}C_{10})$aryl, $(C_6\text{-}C_{10})$aryl$(C_1\text{-}C_4)$alkyl, $(C_1\text{-}C_{16})$alkyl$CO_2R_c$, $(C_1\text{-}C_6)$alkyl$CH_2OR_c$, $(C_6\text{-}C_{10})$aryl$CO_2R_c$, $(C_6\text{-}C_{10})$aryl$CH_2OR_c$, where each $R_c$ is independently selected from the group consisting of hydrogen, $(C_1\text{-}C_6)$alkyl and tri$(C_1\text{-}C_6)$alkylsilyl;

c) a polymer B comprising one or more distinct first repeating unit represented by formula (VIA), each of said first repeating unit is derived from a monomer of formula (VI):

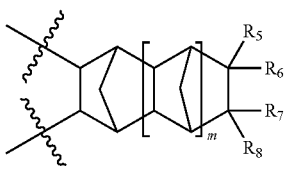
(VIA)

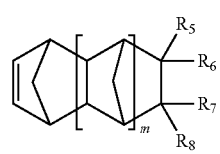
(VI)

wherein:
m is an integer from 0 to 2; and
⁓, $R_5$, $R_6$, $R_7$ and $R_8$ are as defined above; and
one or more distinct second repeating unit represented by formula (IVA) as defined above.

3. The composition according to claim 2, wherein the polyamic acid of formula (II) is derived from one or more dianhydrides selected from the group consisting of:

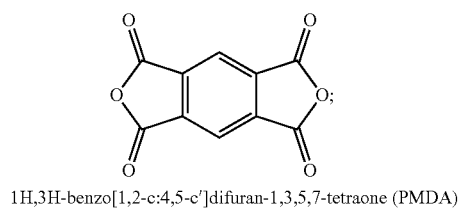
1H,3H-benzo[1,2-c:4,5-c′]difuran-1,3,5,7-tetraone (PMDA)

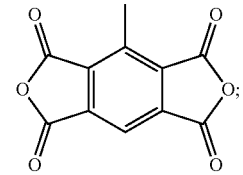
4-methyl-1H,3H-benzo[1,2-c:4,5-c′]difuran-1,3,5,7-tetraone

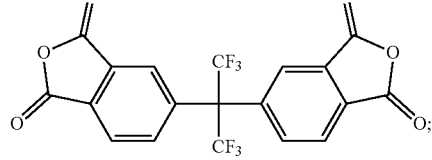
5,5′-(perfluoropropane-2,2-diyl)bis(isobenzofuran-1,3-dione) (6FDA)

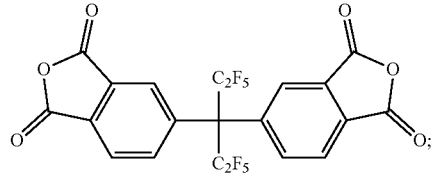
5,5′-(perfluoropentane-3,3-diyl)bis(isobenzofuran-1,3-dione)

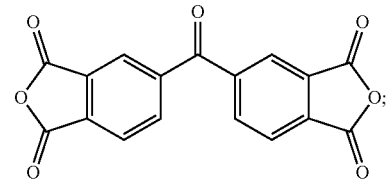
5,5′-carbonylbis(isobenzofuran-1,3-dione (BTDA)

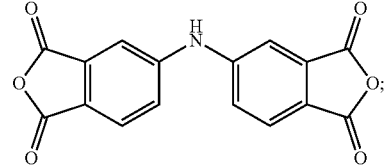
5,5′-azanediylbis(isobenzofuran-1,3-dione)

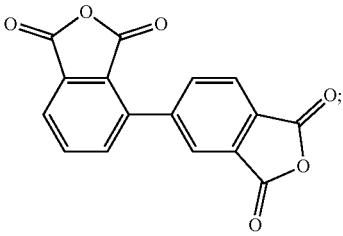
[4,5′-biisobenzofuran]-1,1′,3,3′-tetraone (α-BPDA)

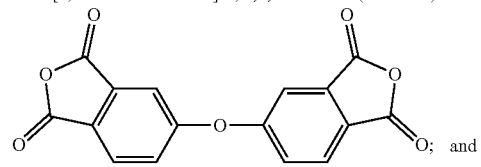
5-5′-oxybis(isobenzofuran-1,3-dione) (ODPA); and

-continued

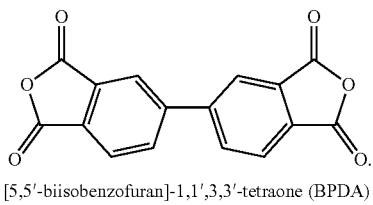

[5,5'-biisobenzofuran]-1,1',3,3'-tetraone (BPDA)

4. The composition according to claim 2, wherein the polyamic acid of formula (II) is derived from one or more diamines selected from the group consisting of:

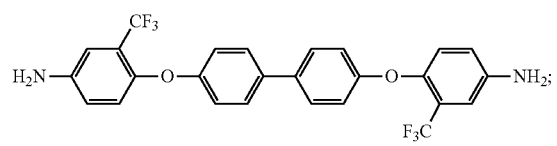

4,4'-([1,1'-biphenyl]-4,4'-diylbis(oxy))bis(3-(trifluoromethyl)aniline) (6BF)

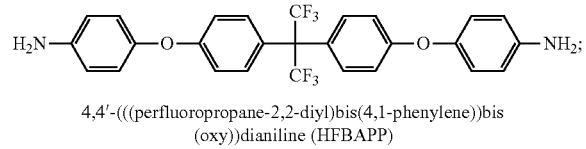

4,4'-(((perfluoropropane-2,2-diyl)bis(4,1-phenylene))bis(oxy))dianiline (HFBAPP)

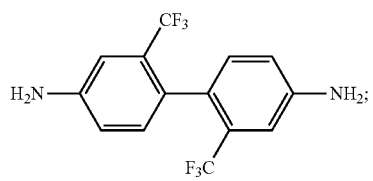

2,2'-bis(trifluoromethyl)-[1,1'-biphenyl]-4,4'-diamine (PFMB)

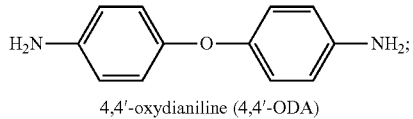

4,4'-oxydianiline (4,4'-ODA)

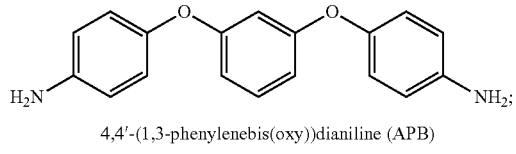

4,4'-(1,3-phenylenebis(oxy))dianiline (APB)

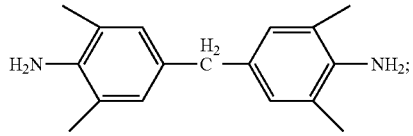

4,4'-methylenebis(2,6-dimethylaniline) (DO3)

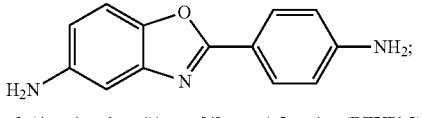

2-(4-aminophenyl)benzo[d]oxazol-5-amine (BZXPh5)

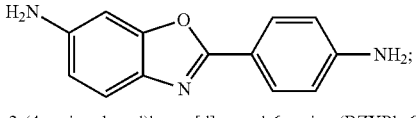

2-(4-aminophenyl)benzo[d]oxazol-6-amine (BZXPh-6)

-continued

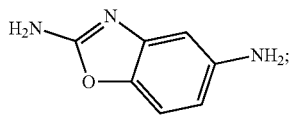

benzo[d]oxazole-2,5-diamine (BZX-5)

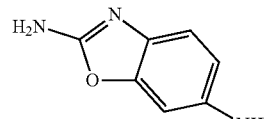

benzo[d]oxazole-2,6-diamine (BZX-6)

bicyclo[2.2.1]heptane-2,5-diyldimethanamine (NBDA); and a diamine of formula B

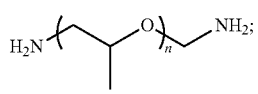

B where n is an integer from 2 to 6 (JD230)

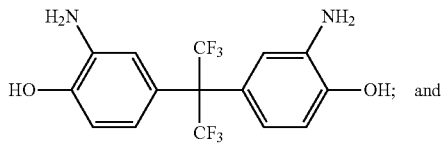

4,4'-(perfluoropropane-2,2-diyl)bis(2-aminophenol) (BAFA)

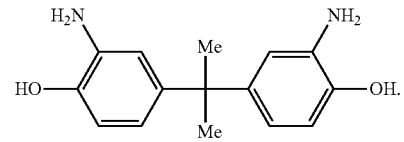

4,4'-(propane-2,2-diyl)bis(2-aminophenol) (DABPA)

5. The composition according to claim 2, wherein the polyamic acid is selected from the group consisting of:
a polyamic acid formed from 4,4'-(1,3-phenylenebis(oxy))dianiline (APB), 5,5'-oxybis(isobenzofuran-1,3-dione) (ODPA) and 4,4'-(perfluoropropane-2,2-diyl)bis(2-aminophenol) (BAFA); and
a polyamic acid formed from 4,4'-([1,1'-biphenyl]-4,4'-diylbis(oxy))bis(3-(trifluoromethyl)aniline) (6BF), 1H,3H-benzo[1,2-c:4,5-c']difuran-1,3,5,7-tetraone (PMDA) and 4,4'-(perfluoropropane-2,2-diyl)bis(2-aminophenol) (BAFA).

6. The composition according to claim 2, wherein the polymer A or polymer B further comprises one or more distinct fourth repeat unit of formula (VIIA) derived from a monomer of formula (VII):

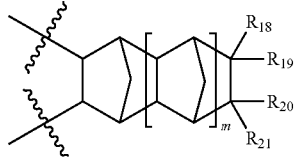

(VIIA)

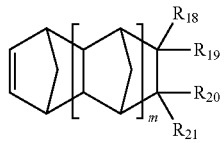

(VII)

wherein:
- ~~~~ represents a position at which the bonding takes place with another repeat unit;
- m is an integer from 0 to 2;
- each of $R_{18}$, $R_{19}$, $R_{20}$ and $R_{21}$ is independently selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro $(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $-(CH_2)_e-(O-(CH_2)_f)_g-O-(C_1-C_4)$alkyl, where e, f and g are integers from 1 to 4, inclusive, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen.

7. The composition according to claim 2, wherein the polymer A is having one or more distinct first repeating unit derived from a respective monomer selected from the group consisting of:
- bicyclo[2.2.1]hepta-2,5-diene (norbornadiene);
- 2-methylbicyclo[2.2.1]hepta-2,5-diene;
- 2-butylbicyclo[2.2.1]hepta-2,5-diene;
- 2-hexylbicyclo[2.2.1]hepta-2,5-diene;
- 2-octylbicyclo[2.2.1]hepta-2,5-diene;
- 2-phenethylbicyclo[2.2.1]hepta-2,5-diene;
- tert-butyl bicyclo[2.2.1]hepta-2,5-diene-2-carboxylate;
- trimethylsilyl bicyclo[2.2.1]hepta-2,5-diene-2-carboxylate; and
- bicyclo[2.2.1]hepta-2,5-dien-2-ylmethanol.

8. The composition according to claim 2, wherein the polymer A or polymer B is having one or more distinct second repeating unit derived from a respective monomer selected from the group consisting of:
- maleic anhydride;
- 2-methyl-maleic anhydride (3-methylfuran-2,5-dione);
- 2,3-dimethyl-maleic anhydride (3,4-dimethylfuran-2,5-dione);
- 2-ethyl-maleic anhydride (3-ethylfuran-2,5-dione);
- 2,3-diethyl-maleic anhydride (3,4-diethylfuran-2,5-dione);
- 2-trifluoromethyl-maleic anhydride (3-trifluoromethylfuran-2,5-dione);
- 2,3-bis(trifluoromethyl)-maleic anhydride (3,4-bis(trifluoromethyl)furan-2,5-dione); and
- 2-methyl-3-trifluoromethyl-maleic anhydride (3-methyl-4-(trifluoromethyl)furan-2,5-dione).

9. The composition according to claim 2, wherein the polymer A is having one or more distinct third repeating unit derived from a respective monomer selected from the group consisting of:
- maleimide;
- N-methylmaleimide;
- N-butylmaleimide;
- 3-methylmaleimide (3-methylpyrrolidine-2,5-dione);
- N-cyclohexylmaleimide;
- N-phenylmaleimide;
- N-benzylmaleimide; and
- N-phenethylmaleimide.

10. The composition according to claim 6, wherein the polymer A is having one or more distinct fourth repeating unit derived from a respective monomer selected from the group consisting of:
- norbornene;
- 5-hexylbicyclo[2.2.1]hept-2-ene;
- 5-octylbicyclo[2.2.1]hept-2-ene;
- 5-decylbicyclo[2.2.1]hept-2-ene;
- 5-((2-(2-methoxyethoxy)ethoxy)methyl)bicyclo[2.2.1]hept-2-ene (NBTON);
- 1-(bicyclo[2.2.1]hept-5-en-2-yl)-2,5,8,11-tetraoxadodecane;
- 5-benzylbicyclo[2.2.1]hept-2-ene; and
- 5-phenethylbicyclo[2.2.1]hept-2-ene.

11. The composition according to claim 6, wherein the polymer is selected from the group consisting of:
- a terpolymer of norbornadiene (NBD), maleic anhydride in which maleic anhydride repeating unit is ring opened with methanol and N-phenylmaleimide;
- a terpolymer of norbornadiene (NBD), maleic anhydride in which maleic anhydride repeating unit is ring opened with methanol and maleimide;
- a terpolymer of norbornadiene (NBD), maleic anhydride in which maleic anhydride repeating unit is ring opened with methanol and N-cyclohexyl-maleimide;
- a tetrapolymer of norbornadiene (NBD), 5-((2-(2-methoxyethoxy)ethoxy)methyl)-bicyclo[2.2.1]hept-2-ene (NBTON), maleic anhydride in which maleic anhydride repeating unit is ring opened with methanol and N-phenylmaleimide;
- a tetrapolymer of norbornadiene (NBD), maleic anhydride in which maleic anhydride repeating unit is ring opened with methanol, N-cyclohexylmaleimide and maleimide; and
- a tetrapolymer of norbornadiene (NBD), maleic anhydride in which maleic anhydride repeating unit is ring opened with methanol, N-phenylmaleimide and maleimide.

12. The composition according to claim 1, wherein the compound of formulae (IA), (IB), (IC), (ID) and (IE) are selected from the group consisting of:

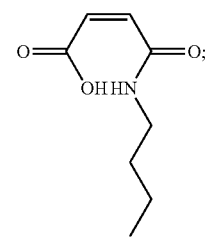

(Z)-4-(butylamino)-4-oxobut-2-enoic acid (MABA)

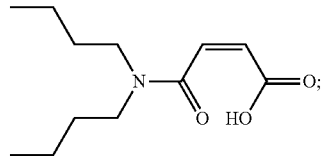

(Z)-4-(dibutylamino)-4-oxobut-2-enoic acid (MADBA)

-continued

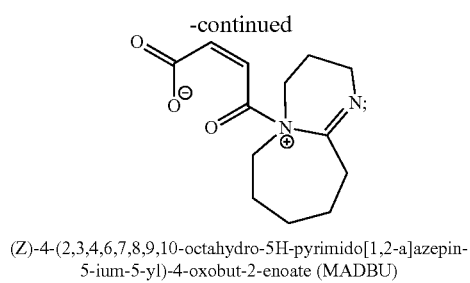

(Z)-4-(2,3,4,6,7,8,9,10-octahydro-5H-pyrimido[1,2-a]azepin-5-ium-5-yl)-4-oxobut-2-enoate (MADBU)

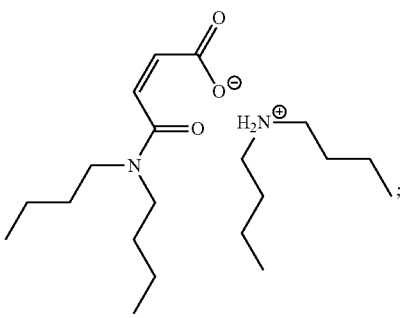

dibutylammonium (Z)-4-(dibutylamino)-4-oxobut-2-enoate (MA(DBA)$_2$)

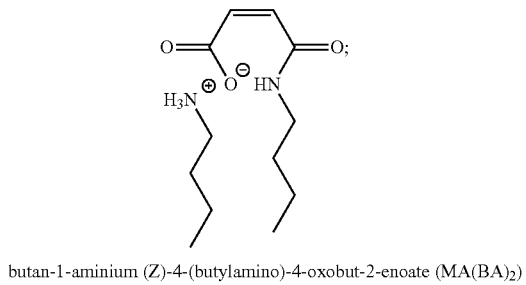

butan-1-aminium (Z)-4-(butylamino)-4-oxobut-2-enoate (MA(BA)$_2$)

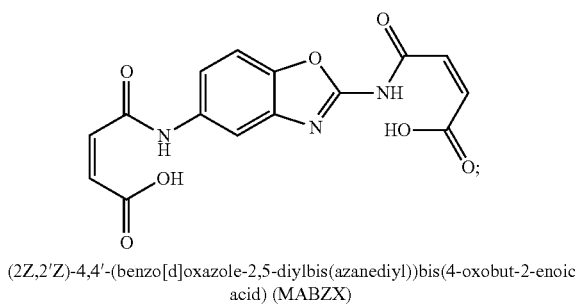

(2Z,2'Z)-4,4'-(benzo[d]oxazole-2,5-diylbis(azanediyl))bis(4-oxobut-2-enoic acid) (MABZX)

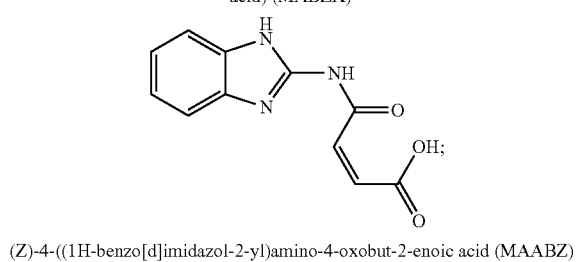

(Z)-4-((1H-benzo[d]imidazol-2-yl)amino-4-oxobut-2-enoic acid (MAABZ)

-continued

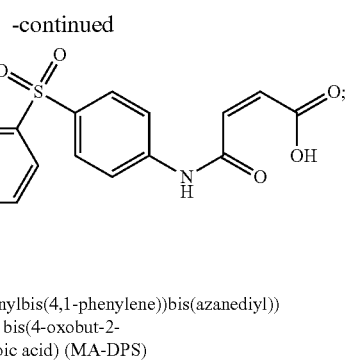

(2Z,2'Z)-4,4'-((sulfonylbis(4,1-phenylene))bis(azanediyl))bis(4-oxobut-2-enoic acid) (MA-DPS)

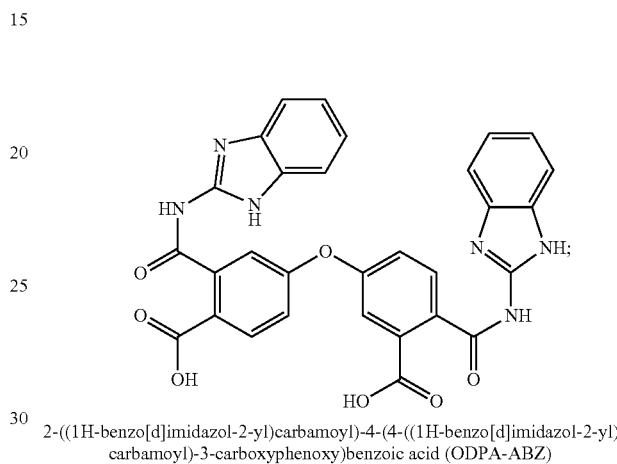

2-((1H-benzo[d]imidazol-2-yl)carbamoyl)-4-(4-((1H-benzo[d]imidazol-2-yl)carbamoyl)-3-carboxyphenoxy)benzoic acid (ODPA-ABZ)

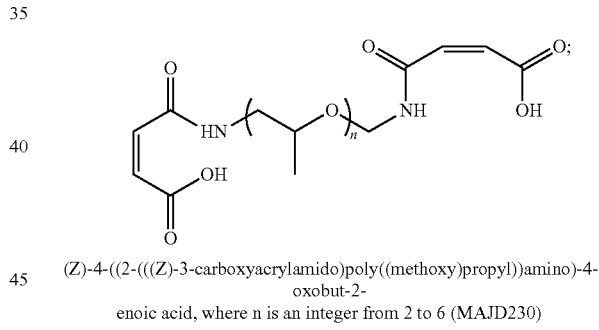

(Z)-4-((2-(((Z)-3-carboxyacrylamido)poly((methoxy)propyl))amino)-4-oxobut-2-enoic acid, where n is an integer from 2 to 6 (MAJD230)

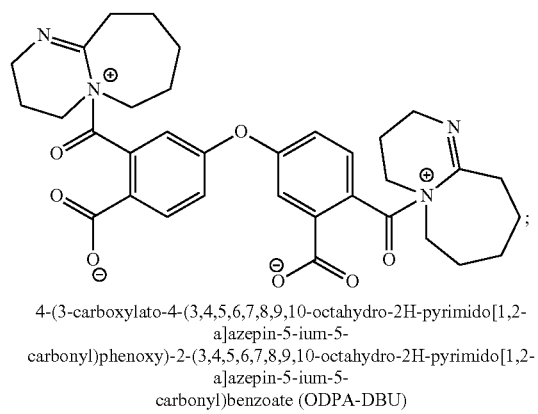

4-(3-carboxylato-4-(3,4,5,6,7,8,9,10-octahydro-2H-pyrimido[1,2-a]azepin-5-ium-5-carbonyl)phenoxy)-2-(3,4,5,6,7,8,9,10-octahydro-2H-pyrimido[1,2-a]azepin-5-ium-5-carbonyl)benzoate (ODPA-DBU)

-continued

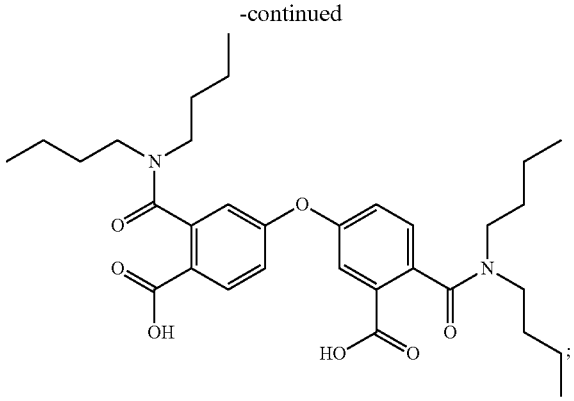

4-(3-carboxy-4-(dibutylcarbamoyl)phenoxy)-2-(dibutylcarbamoyl) benzoic acid (ODPA-DBA)

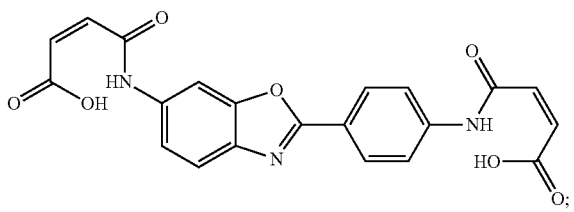

(Z)-4-((4-(6-((Z)-3-carboxyacrylamido)benzo[d]oxazol-2-yl)phenyl)amino)-4-oxobut-2-enoic acid (MABZXPh6)

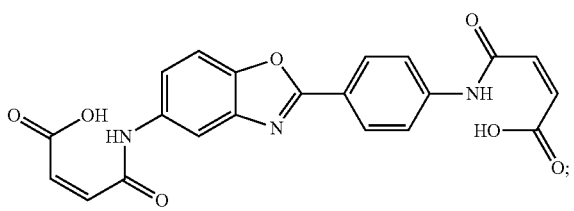

(Z)-4-((4-(5-((Z)-3-carboxyacrylamido)benzo[d]oxazol-2-yl)phenyl)amino)-4-oxobut-2-enoic acid (MABZXPh5)

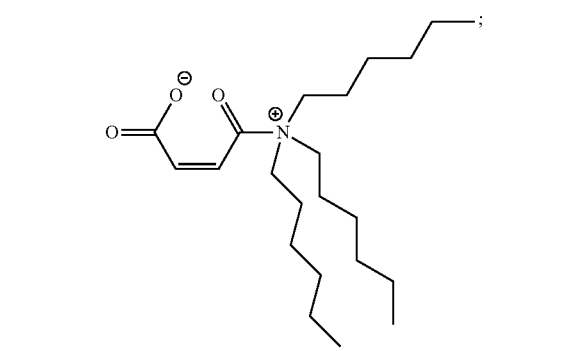

product of maleic anhydride and tri(n-hexyl)amine (MATHA)

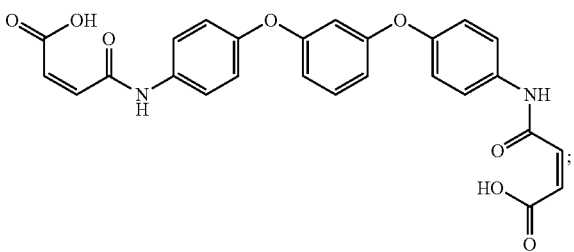

(2Z,2'Z)-4,4'-(((1,3-phenylenebis(oxy))bis(4,1-phenylene))bis(azanediyl))bis(4-oxobut-2-enoic acid) (MAAPB)

-continued

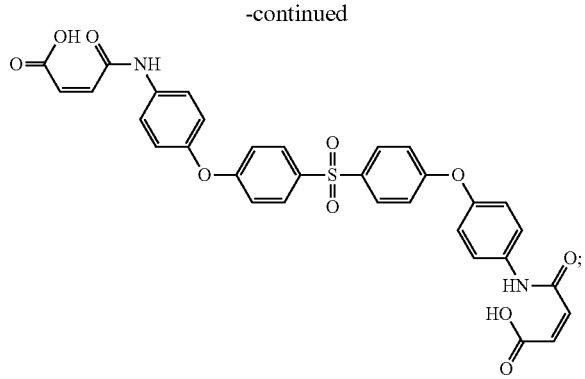

(2Z,2'Z)-4,4'(((((sulfonylbis(4,1-phenylene))bis(oxy))bis(4,1-phenylene))bis(azanediyl))bis(4-oxobut-2-enoic acid) (MA(NH$_2$PhOPh)$_2$SO$_2$)

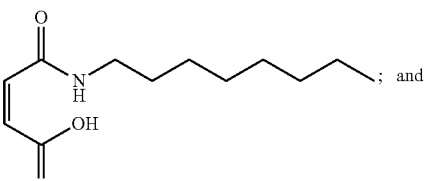

(Z)-4-(octylamino)-4-oxobut-2-enoic acid (MAOA)

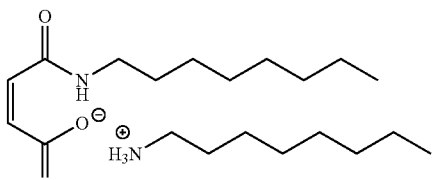

octan-1-aminium (Z)-4-(octylamino)-4-oxobut-2-enoate (MA(OA)$_2$)

13. The composition according to claim 1, wherein the photoactive compound comprises one or more of a 1,2-naphthoquinonediazide-5-sulfonyl moiety, 1,2-naphthoquinonediazide-4-sulfonyl moiety as represented by structural formulae (VIIIa) and (VIIIb), respectively:

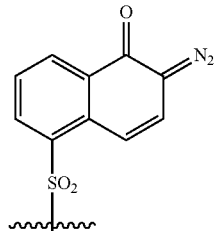
(VIIIa)

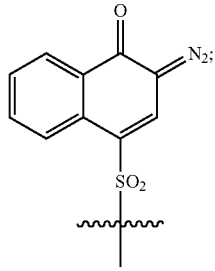
(VIIIb)

or a sulfonyl benzoquinone diazide group represented by structural formula (VIIc):

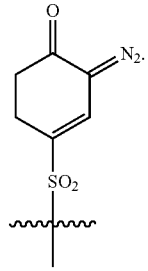
(VIIc)

14. The composition according to claim 13, wherein the photoactive compound is selected from the group consisting of:

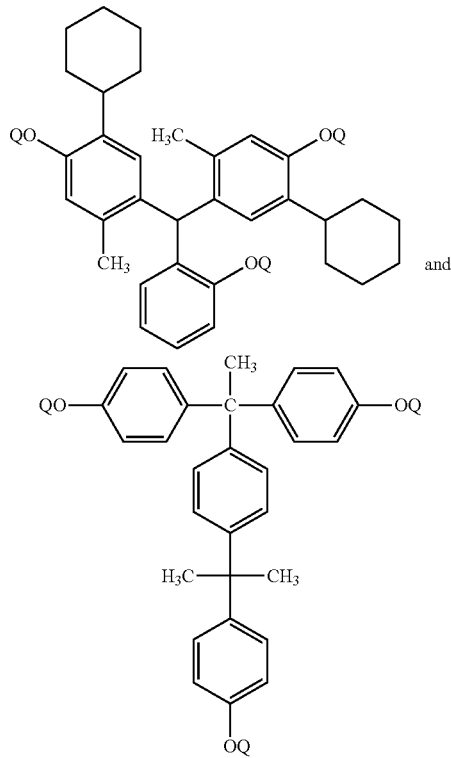
and wherein at least one of Q is a group of formula (VIIIa) or (VIIIb):

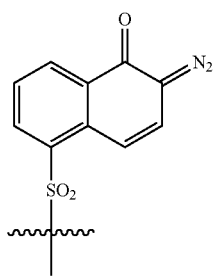
(VIIIa)

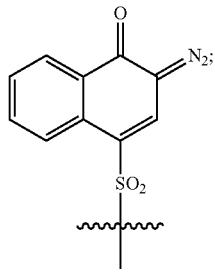
(VIIIb)

and the remaining Q is hydrogen.

15. The composition according to claim 1, wherein the epoxy crosslinking agent is selected from the group consisting of:

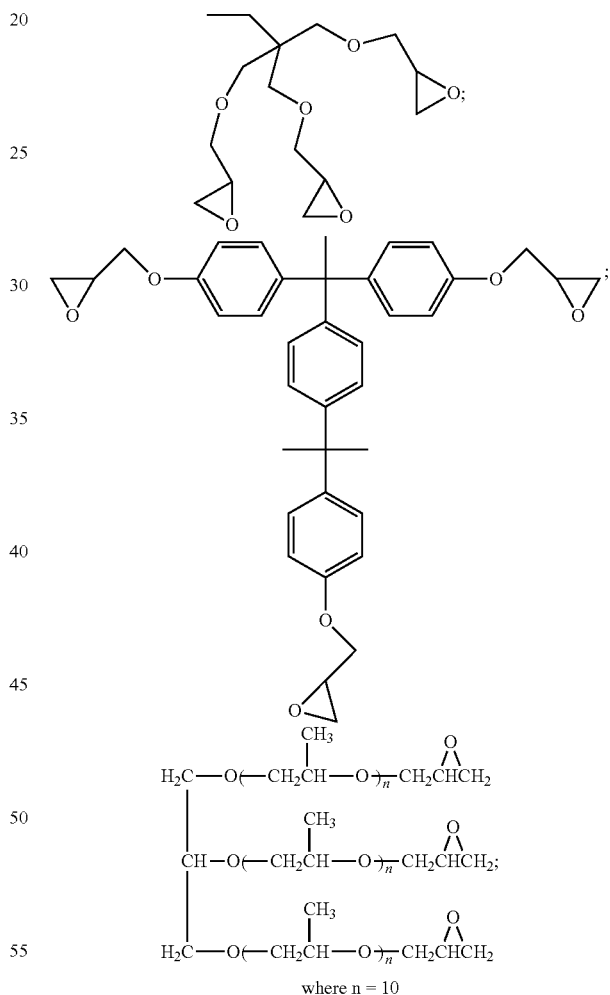
where n = 10 and a mixture in any combination thereof.

16. The composition according to claim 1 further comprising a solvent selected from the group consisting of propyleneglycol monomethylether acetate (PGMEA), N-methylpyrrolidone (NMP) and γ-butyrolactone (GBL) and a mixture in any combination thereof.

17. The composition according to claim 1 further comprising one or more additives selected from the group consisting of:

a surface leveling agent;
an antioxidant;
a synergist; and
an adhesion promoter.

18. A cured product comprising the composition of claim 1.

19. A microelectronic or optoelectronic device comprising one or more of a redistribution layer (RDL) structure, a chip-stack structure, a CMOS image sensor dam structure, where said structures comprising a composition according to claim 1.

20. A process for forming a cured product, comprising: (i) applying the composition of claim 1 on a substrate to form a film, (ii) exposing the film to light through a desired pattern mask, (iii) dissolving and removing the exposed portions by developing with an alkaline developer to obtain the desired pattern, and (iv) heating the obtained desired pattern.

* * * * *